(12) United States Patent
Lee et al.

(10) Patent No.: US 10,497,827 B2
(45) Date of Patent: Dec. 3, 2019

(54) LIGHT EMITTING DEVICE PACKAGE

(71) Applicant: LG INNOTEK CO., LTD., Seoul (KR)

(72) Inventors: Tae Sung Lee, Seoul (KR); June O Song, Seoul (KR); Ki Seok Kim, Seoul (KR); Young Shin Kim, Seoul (KR); Chang Man Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/041,081

(22) Filed: Jul. 20, 2018

(65) Prior Publication Data

US 2019/0027641 A1 Jan. 24, 2019

(30) Foreign Application Priority Data

Jul. 21, 2017 (KR) .................. 10-2017-0093031
Jul. 21, 2017 (KR) .................. 10-2017-0093032

(51) Int. Cl.
*H01L 33/00* (2010.01)
*H01L 33/62* (2010.01)
*H01L 33/48* (2010.01)

(52) U.S. Cl.
CPC ........ *H01L 33/0075* (2013.01); *H01L 33/486* (2013.01); *H01L 33/62* (2013.01); *H01L 2933/0066* (2013.01)

(58) Field of Classification Search
CPC ........................................... H01L 2924/12041
See application file for complete search history.

(56) References Cited

U.S. PATENT DOCUMENTS

| 5,369,289 | A  | * | 11/1994 | Tamaki  | H01L 33/32 257/103 |
| 6,936,855 | B1 | * | 8/2005  | Harrah  | F21K 9/00 257/59 |
| 2004/0160778 | A1 | * | 8/2004 | Yu | H01L 33/62 362/389 |
| 2008/0315230 | A1 | * | 12/2008 | Murayama | H01L 23/045 257/98 |
| 2012/0211789 | A1 | * | 8/2012 | Lee | H01L 24/49 257/98 |
| 2014/0335635 | A1 | * | 11/2014 | Venk | H05K 1/141 438/27 |
| 2015/0155441 | A1 | * | 6/2015 | Alexeev | H01L 33/387 257/99 |

* cited by examiner

*Primary Examiner* — Thao P Le
(74) *Attorney, Agent, or Firm* — Birch, Stewart, Kolasch & Birch, LLP

(57) ABSTRACT

A light emitting device package includes a first frame and a second frame disposed to be spaced apart from each other; a body disposed between the first and second frames and comprising a recess; a first adhesive on the recess; a light emitting device on the first adhesive; a second adhesive disposed between the first and second frames and the light emitting device; and a resin portion disposed to surround the second adhesive and a partial region of the light emitting device.

20 Claims, 30 Drawing Sheets

LIGHT EMITTING DEVICE PACKAGE

CROSS-REFERENCE TO RELATED APPLICATIONS

This application claims priority under 35 U.S.C. § 119 to Korean Patent Application No. 10-2017-0093031 filed in Korea on Jul. 21, 2017 and Korean Patent Application No. 10-2017-0093032 filed in Korea on Jul. 21, 2017, which are hereby incorporated in their entirety by reference as if fully set forth herein.

TECHNICAL FIELD

The embodiment relates to a semiconductor device package, a method of manufacturing the semiconductor device package, and a light source apparatus.

BACKGROUND

A semiconductor device including compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using group III-V or group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using group III-V or group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using the group III-V or group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescent lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

Meanwhile, as a semiconductor device capable of providing a high output has been requested, studied on a semiconductor device capable of increasing an output power by applying a high power source has been proceeding.

In addition, as for a semiconductor device package, studies on a method of improving the light extraction efficiency of a semiconductor device and improving the light intensity in a package stage has been proceeding. In addition, as for the semiconductor device package, studies on a method of improving bonding strength between a package electrode and a semiconductor device has been proceeding.

In addition, as for the semiconductor device package, studies on a method of reducing the manufacturing cost and improving the manufacturing yield by improving the process efficiency and changing the structure has been proceeding.

SUMMARY

The embodiments may provide a semiconductor device package capable of improving the light extraction efficiency and electrical characteristics, a method of manufacturing the semiconductor device package, and a light source apparatus.

The embodiments may provide a semiconductor device package capable of reducing the manufacturing cost and improving the manufacturing yield, a method of manufacturing the semiconductor device package, and a light source apparatus.

Embodiments provide a semiconductor device package and a method of manufacturing a semiconductor device package that may prevent a re-melting phenomenon from occurring in a bonding region of the semiconductor device package during a process of re-bonding the semiconductor device package to a substrate or the like.

A method of fabricating a light emitting device package according to an embodiment comprises: forming a first frame comprising a first opening passing through an upper surface and a lower surface thereof, a second frame comprising a second opening passing through an upper surface and a lower surface thereof, and a body disposed between the first frame and the second frame and comprising a recess provided to concave from an upper surface toward a lower surface thereof; providing an adhesive to the recess; providing a light emitting device comprising a first bonding part and a second bonding part on the body, wherein the first bonding part is disposed on the first opening and the second bonding part is disposed on the second opening, and a lower surface of the light emitting device is attached in contact with the adhesive; curing the adhesive; providing a resin portion around the first and second bonding parts on the first and second frames; and providing first and second conductive layers at the first and second openings, respectively.

According to the embodiment, the resin portion may be provided at a first upper recess and a second upper recess, the first upper recess may be disposed to be spaced apart from the first opening and provided to concave from the upper surface of the first frame toward a lower surface of the first frame, and the second upper recess may be disposed to be spaced apart from the second opening and provided to concave from the upper surface of the second frame toward the lower surface of the second frame.

The method of fabricating a light emitting device package according to the embodiment may further comprise providing a molding part on the light emitting device after the providing of the resin portion.

The method of fabricating a light emitting device package according to the embodiment may further comprise providing a molding part on the light emitting device after the providing of the first and second conductive layers at the first and second openings, respectively.

According to the embodiment, the first conductive layer and the second conductive layer may be provided in the first opening and the second opening in the form of a conductive paste.

According to the embodiment, the providing of the first and second conductive layers at the first and second openings may comprise: providing a first conductive paste in the first and second openings; and further providing a second conductive paste in the first and second openings, wherein the first conductive paste and the second conductive paste may comprise different materials.

According to the embodiment, the first conductive layer may be provided in the first opening and may be in direct contact with a lower surface of the first bonding part, and the second conductive layer may be provided in the second opening and may be in direct contact with a lower surface of the second bonding part According to the embodiment, the providing of the first conductive layer at the first opening may comprise providing a first upper conductive layer and a first lower conductive layer in the first opening, and the first upper conductive layer and the first lower conductive layer may comprise different materials.

According to the embodiment, the first upper conductive layer may be provided in direct contact with the first bonding part, and the first lower conductive layer may be provided in direct contact with the first upper conductive layer.

According to the embodiment, the resin portion may comprise a white silicone.

According to the embodiment, the first conductive layer and the second conductive layer may be disposed to be spaced apart from each other on the lower surface of the body.

According to the embodiment, the first and second bonding parts may be provided with at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, Ni/IrOx/Au, and Ni/IrOx/Au/ITO, or an alloy thereof.

According to the embodiment, the first and second conductive layers may be provided with at least one material selected from the group consisting of Ag, Au, Pt, Sn, and Cu, SAC (Sn—Ag—Cu) or an alloy thereof.

According to the embodiment, the adhesive may be provided in direct contact with the upper surface of the body and the lower surface of the light emitting device.

A method of fabricating a light emitting device package according to an embodiment comprises: forming a first frame comprising a first opening, a second frame comprising a second opening, and a body disposed between the first frame and the second frame and comprising a recess provided to concave from an upper surface toward a lower surface thereof providing an adhesive to the recess; providing a light emitting device comprising a first bonding part and a second bonding part on the body, wherein the first bonding part is disposed on the first opening and the second bonding part is disposed on the second opening, and a lower surface of the light emitting device is attached in contact with the adhesive; curing the adhesive; providing a resin portion around the first and second bonding parts; and forming first and second conductive layers at the first and second openings, respectively by providing a conductive paste.

According to the embodiment, the first conductive layer may be provided in the first opening and formed in direct contact with a lower surface of the first bonding part, and the second conductive layer may be provided in the second opening and formed in direct contact with a lower surface of the second bonding part.

According to the embodiment, the forming of the first conductive layer at the first opening may comprise forming a first upper conductive layer and a first lower conductive layer in the first opening, and the first upper conductive layer and the first lower conductive layer may comprise different materials.

According to the embodiment, the first upper conductive layer may be formed in direct contact with the first bonding part, and the first lower conductive layer may be formed in direct contact with the first upper conductive layer.

According to the embodiment, the resin portion may comprise a white silicone.

According to the embodiment, the first and second conductive layers may be provided with at least one material selected from the group consisting of Ag, Au, Pt, Sn, Cu, and SAC (Sn—Ag—Cu), or an alloy thereof.

A method of fabricating a light emitting device package according to an embodiment comprises: providing a first frame comprising a first opening passing through an upper surface and a lower surface thereof, a second frame comprising a second opening passing through an upper surface and a lower surface thereof, and a package body comprising a body disposed between the first frame and the second frame and comprising a recess provided to concave from an upper surface toward a lower surface thereof providing an adhesive to the recess of the body; providing a light emitting device comprising a first bonding part and a second bonding part on a lower surface thereof on the package body, wherein the first bonding part is disposed on the first opening and the second bonding part is disposed on the second opening, and the lower surface of the light emitting device is attached in contact with the adhesive; providing a resin portion between the upper surface of the first frame and a side surface of the first bonding part, and between the upper surface of the second frame and a side surface of the second bonding part;

and providing a first conductive layer at the first opening and a second conductive layer at the second opening.

According to the embodiment, the resin portion may be formed at a first upper recess disposed to be spaced apart from the first opening and provided to concave from the upper surface of the first frame toward the lower surface of the first frame, and may be formed at a second upper recess disposed to be spaced apart from the second opening and provided to concave from the upper surface of the second frame toward the lower surface of the second frame.

The method of fabricating a light emitting device package according to the embodiment may further comprise providing a molding part on the light emitting device after the providing of the resin portion.

The method of fabricating a light emitting device package according to the embodiment may further comprise providing a molding part on the light emitting device after the providing of the first conductive layer at the first opening and the providing of the second conductive layer at the second opening.

According to the embodiment, the first conductive layer and the second conductive layer may be provided at the first opening and the second opening in the form of a conductive paste.

According to the embodiment, the providing of the first conductive layer at the first opening and the providing of the second conductive layer at the second opening may comprise: providing a first conductive paste in the first and second openings; and further providing a second conductive paste in the first and second openings, wherein the first conductive paste and the second conductive paste may comprise different materials.

A light emitting device package according to an embodiment comprises: a first frame and a second frame disposed to be spaced apart from each other and comprising first and second openings, respectively; a body disposed between the first frame and the second frame and comprising a recess; an adhesive on the recess; a light emitting device on the adhesive and comprising first and second bonding parts; and first and second conductors on the first and second bonding parts respectively, wherein the first and second bonding parts are disposed on the first and second openings, respectively, the first and second conductors are disposed into the first and second openings, respectively, the first and second openings further comprise a first region on an upper surface of each of the first and second frames and a second region on a lower surface of each of the first and second frames, and a width of an upper surface of the first region is smaller than a width of a lower surface of the second region.

A light emitting device package according to an embodiment comprises: a first frame and a second frame disposed to be spaced apart from each other; a body disposed between the first and second frames; a light emitting device comprising a first bonding part and a second bonding part; and an adhesive disposed between the body and the light emitting device, wherein the first frame comprises a first opening passing through an upper surface and a lower surface of the first frame and a first upper recess disposed to be spaced apart from the first opening and provided to concave from the upper surface of the first frame toward the lower surface of the first frame, the second frame comprises a second opening passing through an upper surface and a lower surface of the second frame and a second upper recess disposed to be spaced apart from the second opening and provided to concave from the upper surface of the second frame toward the lower surface of the second frame, the body comprises a recess provided to concave from an upper surface toward a lower surface thereof, the adhesive is disposed on the recess, the first bonding part is disposed on the first opening and the second bonding part is disposed on the second opening, and a resin portion is disposed between the first upper recess and a side surface of the first bonding part and between the second upper recess and a side surface of the second bonding part.

The light emitting device package according to the embodiment may further comprise: a first conductive layer provided in the first opening and disposed in direct contact with a lower surface of the first bonding part; and a second conductive layer provided in the second opening and disposed in direct contact with a lower surface of the second bonding part.

According to the embodiment, the first conductive layer may comprise a first upper conductive layer provided at an upper region of the first opening and a first lower conductive layer provided at a lower region of the first opening, and the first upper conductive layer and the first lower conductive layer may comprise different materials.

According to the embodiment, the resin portion may comprise a white silicone.

The light emitting device package according to the embodiment may further comprise: a first conductor disposed under the first bonding part and electrically connected to the first bonding part; a second conductor disposed under the second bonding part and electrically connected to the second bonding part; a first conductive layer provided at the first opening and disposed in direct contact with a lower surface and a side surface of the first conductor; and a second conductive layer provided at the second opening and disposed in direct contact with a lower surface and a side surface of the second conductor According to the embodiment, the first conductive layer may be disposed in direct contact with a lower surface of the first bonding part, and the second conductive layer may be disposed in direct contact with a lower surface of the second bonding part.

According to the embodiment, the first conductor may be disposed in the first opening, and the second conductor may be disposed in the second opening.

According to the embodiment, the first opening may be provided such that a width of an upper region is smaller than a width of a lower region, and may comprise an inclined surface in which a width gradually decreases from the lower region to the upper region.

A light emitting device package according to an embodiment comprises: a first frame and a second frame disposed to be spaced apart from each other; a body disposed between the first and second frames and comprising a recess; a first adhesive on the recess; a light emitting device on the first adhesive; a second adhesive disposed between the first and second frames and the light emitting device; and a resin portion disposed to surround the second adhesive and a partial region of the light emitting device; wherein the light emitting device comprises: a light emitting structure comprising a first conductive type semiconductor layer, a second conductive type semiconductor layer, and an active layer disposed between the first conductive type semiconductor layer and the second conductive type semiconductor layer; a first bonding part on the light emitting structure and electrically connected to the first conductive type semiconductor layer; and a second bonding part disposed to be spaced apart from the first bonding part on the light emitting structure and electrically connected to the second conductive type semiconductor layer, wherein the first frame comprises a first region in which the second adhesive and the first bonding part are disposed, and a first upper recess disposed to surround a part of the first region, and the second frame comprises a second region in which the second adhesive and the second bonding part are disposed, and a second upper recess disposed to surround a part of the second region, wherein the resin portion is disposed on the first and second upper recesses, wherein the first upper recess comprises a first inner side surface overlapping with the light emitting structure in a first direction perpendicular to a lower surface of the light emitting structure and parallel to a side surface of the light emitting structure, when a first distance in a second direction between the side surface of the light emitting structure and a side surface of the first bonding part is equal to or greater than 40 micrometers, a distance between the side surface of the light emitting structure and the first inner side surface in the second direction is smaller than the first distance, when the first distance in the second direction between the side surface of the light emitting structure and the side surface of the first bonding part is smaller than 40 micrometers, the distance between the side surface of the light emitting structure and the first inner side surface in the second direction is greater than the first distance, and the second direction is provided perpendicular to the first direction.

A light emitting device package according to an embodiment comprises: a first frame and a second frame disposed to be spaced apart from each other; a body disposed between the first and second frames and comprising a recess; a first adhesive on the recess; a light emitting device on the first adhesive and comprising first and second bonding parts; and a second adhesive disposed between the first and second frames and the light emitting device, wherein the first and second bonding parts are electrically connected to the first and second frames, respectively, and each of the first and second frames comprises first and second upper recesses provided in a peripheral region of the light emitting device, and the second adhesive is disposed on the first and second upper recesses, wherein the second adhesive is disposed on the first and second upper recesses, and a first distance from a side surface of the light emitting device to a side surface of the first upper recess disposed under a lower surface of the light emitting device is greater than a second distance from the side surface of the light emitting device to a side surface of the first bonding part.

A light emitting device package according to an embodiment comprises: a first frame and a second frame disposed to be spaced apart from each other; a body disposed between the first and second frames; a light emitting device comprising a first bonding part electrically connected to the first frame and a second bonding part electrically connected to the second frame; a first adhesive disposed between the body and the light emitting device; and a second adhesive disposed between the first and second frames and the light emitting device, wherein each of the first and second frames comprises first and second upper recesses provided to concave in a first direction from an upper surface toward a lower surface thereof, the second adhesive is disposed in the first and second upper recesses, the first adhesive is disposed in a recess formed in a upper surface of the body, and when viewed from the upper direction of the light emitting device, a first distance from a side surface of the light emitting device to a side surface of the first upper recess disposed under a lower surface of the light emitting device is greater than a second distance from the side surface of the light emitting device to a side surface of the first bonding part.

According to the embodiment, the second distance from the side surface of the light emitting device to the side surface of the first bonding part may be provided at tens of micrometers.

According to the embodiment, the second distance from the side surface of the light emitting device to the side surface of the first bonding part may be provided at 40 to 50 micrometers.

According to the embodiment, a partial region of the first upper recess may be disposed to be overlapped with a lower surface of the first bonding part in the first direction.

According to the embodiment, the first adhesive may be an insulating adhesive, and the second adhesive may be provided as a conductive adhesive.

According to the embodiment, the first adhesive may be in direct contact with an upper surface of the body and in direct contact with a lower surface of the light emitting device, and the second adhesive may be in direct contact with an upper surface of the first frame and in direct contact with a lower surface of the first bonding part.

The light emitting device package according to the embodiment may comprise a first resin portion disposed in the first and second upper recesses, and contacted with the second adhesive.

According to the embodiment, the first resin portion may be in direct contact with a lower surface of the light emitting device and in direct contact with a side surface of the second adhesive.

According to the embodiment, the first adhesive may be disposed to be overlapped with the light emitting device based on the first direction, and the second adhesive may be disposed to be overlapped with the first bonding part based on the first direction.

According to the embodiment, the first adhesive may be disposed between the first bonding part and the second bonding part.

A light emitting device package according to an embodiment comprises: a first frame and a second frame disposed to be spaced apart from each other; a body disposed between the first and second frames and comprising a recess; a first adhesive on the recess; a light emitting device on the first adhesive and comprising first and second bonding parts; and a second adhesive disposed between the first and second frames and the light emitting device, wherein the first and second bonding parts are electrically connected to the first and second frames, respectively, and each of the first and second frames comprises first and second upper recesses provided in a peripheral region of the light emitting device, and the second adhesive is disposed on the first and second upper recesses, wherein the second adhesive is disposed on the first and second upper recesses, and a first distance from a side surface of the light emitting device to a side surface of the first upper recess disposed under a lower surface of the light emitting device is provided to be smaller than a second distance from the side surface of the light emitting device to a side surface of the first bonding part, and the second distance from the side surface of the light emitting device to the side surface of the first bonding part may be provided greater than 40 micrometers.

A light emitting device package according to an embodiment comprises: a first frame and a second frame disposed to be spaced apart from each other; a body disposed between the first and second frames; a light emitting device comprising a first bonding part electrically connected to the first frame and a second bonding part electrically connected to the second frame; a first adhesive disposed between the body and the light emitting device; and a second adhesive disposed between the first and second frames and the light emitting device, wherein each of the first and second frames comprises first and second upper recesses provided to concave in a first direction from an upper surface toward a lower surface thereof, the second adhesive is disposed in the first and second upper recesses, the first adhesive is disposed in a recess formed in a upper surface of the body, and when viewed from the upper direction of the light emitting device, a first distance from a side surface of the light emitting device to a side surface of the first upper recess disposed under a lower surface of the light emitting device is provided to be smaller than a second distance from the side surface of the light emitting device to a side surface of the first bonding part, and the second distance from the side surface of the light emitting device to the side surface of the first bonding part may be provided greater than 40 micrometers.

According to the embodiment, the second distance from the side surface of the light emitting device to the side surface of the first bonding part may be provided at 50 to 90 micrometers.

According to the embodiment, a partial region of the first upper recess may be disposed to be overlapped with a lower surface of the first bonding part in the first direction.

According to the embodiment, the first adhesive may be an insulating adhesive, and the second adhesive may be provided as a conductive adhesive.

The semiconductor device package and the method of manufacturing the semiconductor device package according to the embodiment can improve light extraction efficiency, electrical characteristics and reliability.

The semiconductor device package and the method of manufacturing the semiconductor device package according to the embodiment can improve the process efficiency and propose a new package structure, thereby reducing manufacturing cost and improving manufacturing yield.

According to embodiments, the semiconductor device package is provided with a body having high reflectance, so that a reflector can be prevented from being discolored, thereby improving reliability of the semiconductor device package.

According to embodiments, the semiconductor device package and the method of manufacturing a semiconductor device can prevent a re-melting phenomenon from occurring in a bonding region of the semiconductor device package during a process of re-bonding the semiconductor device package to a substrate or the like or heat-treating the semiconductor device package.

DETAILED DESCRIPTION OF THE EMBODIMENTS

Hereinafter, embodiments will be described with reference to the accompanying drawings. In the description of embodiments, it will be understood that when a layer (or film), region, pattern or structure is referred to as being "on" or "under" another layer (or film), region, pattern or structure, the terminology of "on" and "under" comprises both the meanings of "directly" or "by interposing another layer (indirectly)". Further, the reference about "on" and "under" each layer will be made on the basis of drawings, but embodiments are not limited thereto.

Hereinafter, a semiconductor device package according to embodiments of the present invention and a method of manufacturing a semiconductor device package will be described in detail with reference to the accompanying drawings. Hereinafter, it will be described based on the case in which a light emitting device is applied as an example of a semiconductor device.

First, a light emitting device package according to an embodiment of the present invention will be described with reference to FIGS. 1 to 4.

Figure 1:
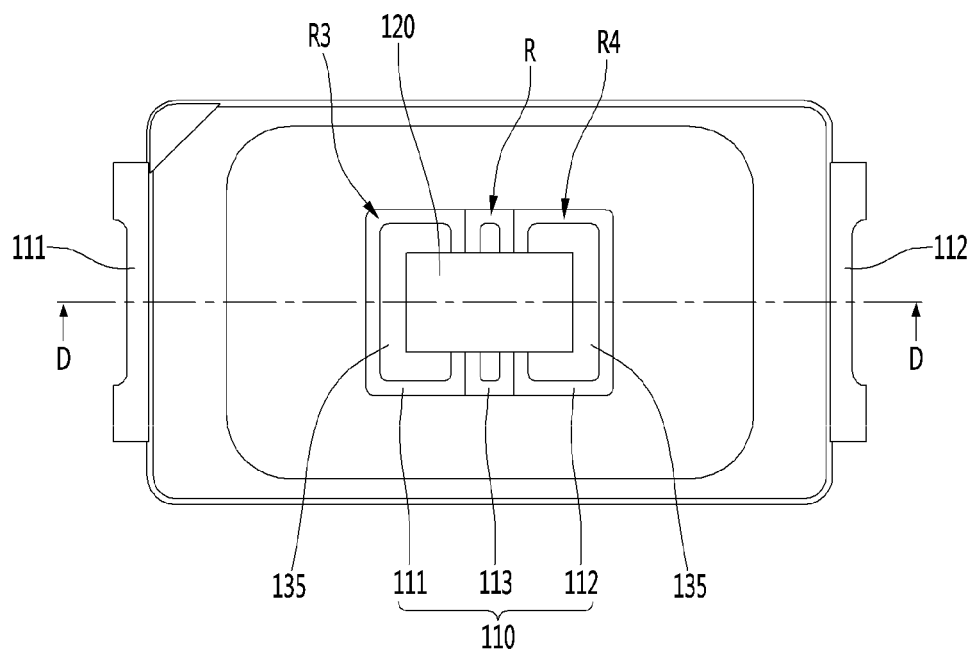
FIG. 1 is a plan view of a light emitting device package according to an embodiment of the present invention.
Figure 2:
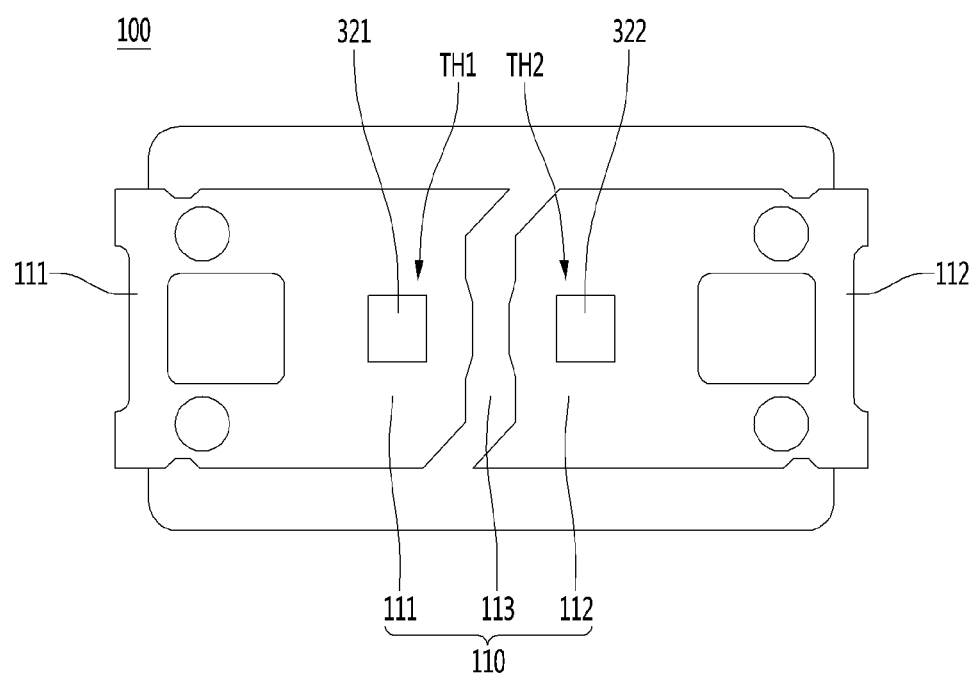
FIG. 2 is a bottom view of the light emitting device package shown in FIG. 1.
Figure 3:
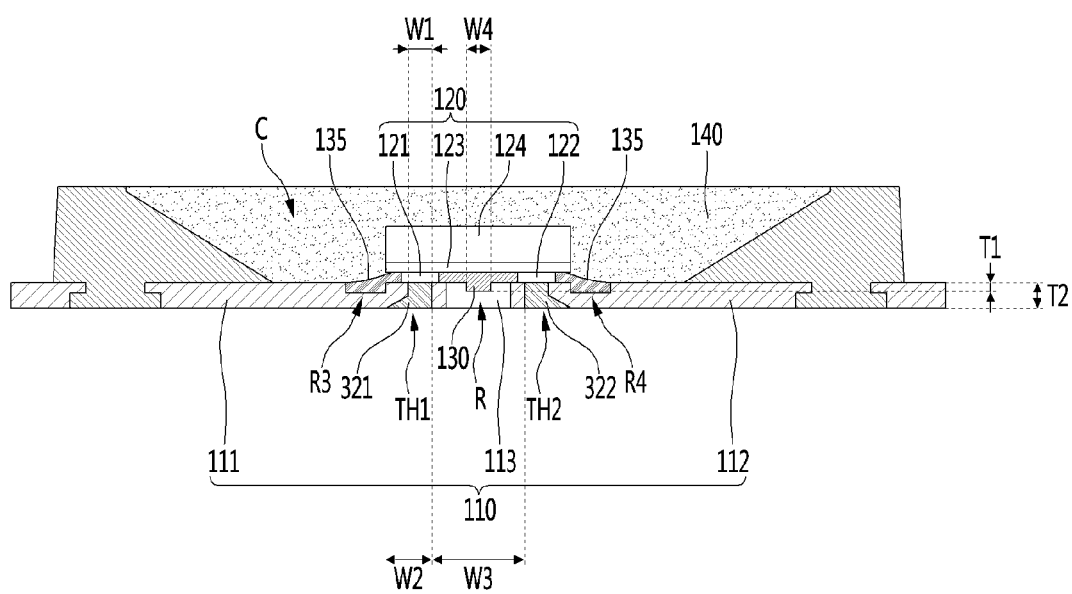
FIG. 3 is a cross-sectional view taken along line D-D of the light emitting device package shown in FIG. 1.
Figure 4:
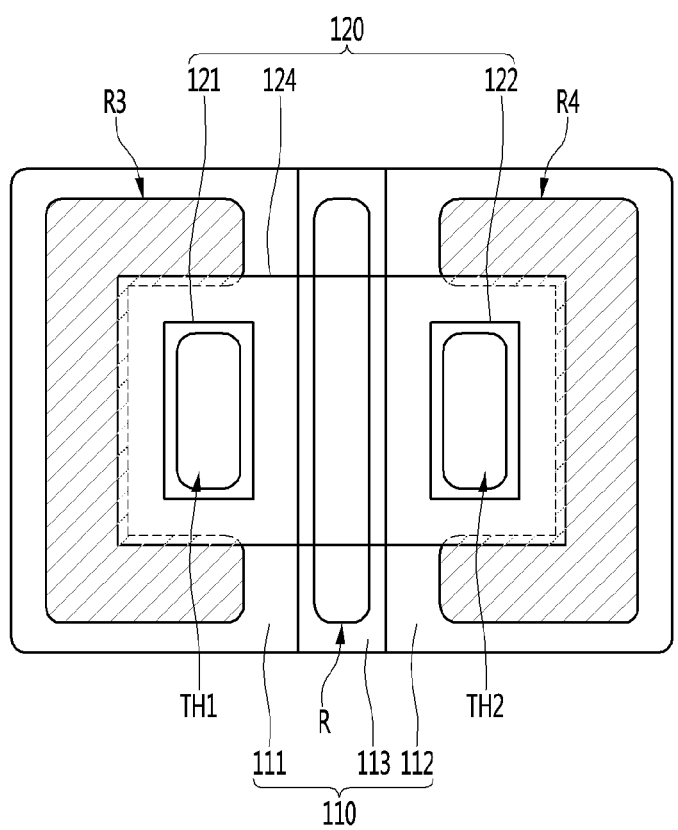
FIG. 4 is a view explaining an arrangement relationship of a first frame, a second frame, and a body applied to the light emitting device package according to an embodiment of the present invention.

FIG. 1 is a plan view of a light emitting device package according to an embodiment of the present invention, FIG. 2 is a bottom view of the light emitting device package according to an embodiment of the present invention, FIG. 3 is a cross-sectional view taken along line D-D of the light emitting device package, FIG. 4 is a view explaining an arrangement relationship of a first frame, a second frame, and a body applied to the light emitting device package according to an embodiment of the present invention.

The light emitting device package 100 according to the embodiment may comprise a package body 110 and a light emitting device 120, as shown in FIGS. 1 to 4.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

The body 113 may be disposed on the first frame 111. In addition, the body 113 may be disposed on the second frame 112.

The body 113 may provide an inclined surface on the first frame 111 and the second frame 112. A cavity C may be provided on the first frame 111 and the second frame 112 by the inclined surface of the body 113.

According to the embodiment, the package body 110 may be provided as a structure with the cavity C, or may be provided as a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ or $SiO_2$.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide a structural strength of the package body 110 and may be electrically connected to the light emitting device 120.

A difference between a case of forming the first frame 111 and the second frame 112 as the insulating frame and a case of forming the first frame 111 and the second frame 112 as the conductive frame will be described later.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 3. The first bonding part 121 and the second bonding part 122 may be disposed between the light emitting structure 123 and the package body 110.

The light emitting structure 123 may comprise a first conductive type semiconductor layer, a second conductive type semiconductor layer, and an active layer disposed between the first conductive type semiconductor layer and the second conductive type semiconductor layer. The first bonding part 121 may be electrically connected to the first conductive type semiconductor layer. In addition, the second bonding part 122 may be electrically connected to the second conductive type semiconductor layer.

The light emitting device 120 may be disposed on the package body 110. The light emitting device 120 may be disposed on the first frame 111 and the second frame 112. The light emitting device 120 may be disposed in the cavity C provided by the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

The first bonding part 121 and the second bonding part 122 may be formed in a single layer of multiple layers by using at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, and Ni/IrOx/Au, Ni/IrOx/Au/ITO, or an alloy thereof.

Meanwhile, the light emitting device package 100 according to the embodiment may comprise a first opening TH1 and a second opening TH2, as shown in FIGS. 1 to 4. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first bonding part 121 of the light emitting device 120. The first opening TH1 may be provided to be overlapped with the first bonding part 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second bonding part 122 of the light emitting device 120.

The second opening TH2 may be provided to be overlapped with the second bonding part 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be provided to be smaller than or equal to that of the first bonding part 121. In addition, a width of an upper region of the second opening TH2 may be provided to be smaller than or equal to that of the second bonding part 122.

Therefore, the first bonding part 121 of the light emitting device 120 and the first frame 111 may be more firmly attached. In addition, the second bonding part 122 of the light emitting device 120 and the second frame 112 may be more firmly attached.

In addition, the width W1 of the upper region of the first opening TH1 may be provided to be smaller than or equal to a width W2 of a lower region of the first opening TH1. Further, the width of the upper region of the second opening TH2 may be provided to be smaller than or equal to a width of a lower region of the second opening TH2.

For example, the width W1 of the upper region of the first opening TH1 may be provided at several tens of micrometers to several hundreds of micrometers. Further, the width W2 of the lower region of the first opening TH1 may be provided to be several tens of micrometers to several hundreds of micrometers larger than the width W1 of the upper region of the first opening TH1.

In addition, the width of the upper region of the second opening TH2 may be provided at several tens of micrometers to several hundreds of micrometers. Further, the width of the lower region of the second opening TH2 may be provided to be several tens of micrometers to several hundreds of micrometers larger than the width of the upper region of the second opening TH2.

In addition, the width W2 of the lower region of the first opening TH1 may be provided wider than the width W1 of the upper region of the first opening TH1. The first opening TH1 may be provided with a predetermined width in the upper region at a predetermined depth and may be provided in an inclined shape toward the lower region.

In addition, the width of the lower region of the second opening TH2 may be provided wider than the width of the upper region of the second opening TH2. The second opening TH2 may be provided with a predetermined width in the upper region at a predetermined depth and may be provided in an inclined shape toward the lower region.

For example, the first opening TH1 may be provided in an inclined shape in which a width gradually decreases from the lower region toward the upper region. Further, the second opening TH2 may be provided in an inclined shape in which a width gradually decreases from the lower region toward the upper region.

According to the embodiment, as shown in FIG. 33, both of the lower regions of the first and second openings TH1 and TH2 may comprise inclined surfaces.

However, the present invention is not limited thereto, and the inclined surfaces between the upper and lower regions of the first and second openings TH1 and TH2 may have a plurality of inclined surfaces having different slopes, and the inclined surfaces may be disposed with a curvature.

The effect of the variation of the width W1 of the upper region and the width W2 of the lower region of the first and second openings TH1 and TH2 will be described later.

A width W3 between the first opening TH1 and the second opening TH2 in lower surface regions of the first frame 111 and the second frame 112 may be provided at several hundreds of micrometers. The width W3 between the first opening TH1 and the second opening TH2 in the lower surface regions of the first frame 111 and the second frame 112 may be provided at 100 to 150 micrometers, as an example.

The width W3 between the first opening TH1 and the second opening TH2 in the lower surface regions of the first frame 111 and the second frame 112 may be selected to be provided over a predetermined distance in order to prevent a short-circuit between the pads from occurring when the light emitting device package 100 according to the embodiment is mounted on a circuit board, a submount, or the like later.

The light emitting device package 100 according to the embodiment may comprise an adhesive 130.

The adhesive 130 may be disposed between the package body 110 and the light emitting device 120. The adhesive 130 may be disposed between an upper surface of the package body 110 and a lower surface of the light emitting device 120. The adhesive 130 may be disposed between an upper surface of the body 113 and the lower surface of the light emitting device 120.

In addition, the light emitting device package 100 according to the embodiment may comprise a recess R, as shown in FIGS. 1 to 4.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

According to the embodiment, the adhesive 130 may be disposed in the recess R. The adhesive 130 may be disposed between the light emitting device 120 and the body 113. The adhesive 130 may be disposed between the first bonding part 121 and the second bonding part 122. As an example, the adhesive 130 may be disposed to be in contact with a side surface of the first bonding part 121 and a side surface of the second bonding part 122.

In addition, the adhesive 130 may be disposed between the light emitting device 120 and the package body 110. The adhesive 130 may be disposed between the light emitting device 120 and the first frame 111. The adhesive 130 may be disposed between the light emitting device 120 and the second frame 112.

The adhesive 130 may provide a stable fixing force between the light emitting device 120 and the package body 110. The adhesive 130 may provide a stable fixing force between the light emitting device 120 and the body 113. The adhesive 130 may be disposed, to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. Further, as an example, when the adhesive 130 comprises a reflective function, the adhesive 130 may comprise a white silicone.

The adhesive 130 may provide a stable fixing force between the body 113 and the light emitting device 120, when light is emitted to the lower surface of the light emitting device 120, and may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

In addition, the adhesive 130 may reflect the light emitted from the light emitting device 120. When the adhesive 130 comprises the reflection function, the adhesive 130 may be formed of a material comprising $TiO_2$, Silicone, and the like, and the adhesive 130 may be formed of a white silicone.

According to the embodiment, a depth T1 of the recess R may be provided to be smaller than a depth T2 of the first opening TH1 or a depth T2 of the second opening TH2.

The depth T1 of the recess R may be determined in consideration of adhesion force of the adhesive 130. In addition, the depth T1 of the recess R may be determined by considering stable strength of the body 113 and/or not to occur a crack in the light emitting device package 100 due to heat emitted from the light emitting device 120.

The recess R may provide a proper space in which a kind of under-filling process may be performed at a lower portion of the light emitting device 120. Here, the under-filling process may be a process of mounting the light emitting device 120 on the package body 110 and then disposing the adhesive 130 at the lower portion of the light emitting device 120, and may be a process of disposing the adhesive 130 in the recess R and then disposing the light emitting device 120 in order to mount by the adhesive 130 in the process of mounting the light emitting device 120 on to the package body 110. The recess R may be provided on a first depth or more so that the adhesive 130 may be sufficiently provided between the lower surface of the light emitting device 120 and the upper surface of the body 113. In addition, the recess R may be provided at a second depth or less to provide a stable strength of the body 113.

The depth T1 and a width W4 of the recess R may affect a forming position and fixing force of the adhesive 130. The depth T1 and the width W4 of the recess R may be determined so that a fixing force may be sufficiently provided by the adhesive 130 disposed between the body 113 and the light emitting device 120.

As an example, the depth T1 of the recess R may be provided at several tens of micrometers. The depth T1 of the recess R may be provided at 40 to 60 micrometers.

In addition, the width W4 of the recess R may be provided at several tens of micrometers to several hundreds of micrometers. Here, the width W4 of the recess R may be provided in the major axis direction of the light emitting device 120 in order to secure a fixing force between the light emitting device 120 and the package body 110.

The width W4 of the recess R may be narrower than a gap between the first bonding part 121 and the second bonding part 122. The width W4 of the recess R may be provided at 5% or more to 80% or less with respect to the major axis length of the light emitting device 120. When the width W4 of the recess R is provide at 5% or more of the major axis length of the light emitting device 120, the stable fixing force may be secured between the light emitting device 120 and the package body 110, and when the width W4 of the recess R is provide at 80% or less, the adhesive 130 may be disposed on each of the first and second frames 111 and 112 between the recess R and the first and second openings TH1 and TH2. Therefore, the fixing force may be secured between the light emitting device 120 and the first and second frames 111 and 112 which are between the recess R and the first and second openings TH1 and TH2.

The depth T2 of the first opening TH1 may be provided to correspond to a thickness of the first frame 111. The depth T2 of the first opening TH1 may be provided at a thickness capable of maintaining a stable strength of the first frame 111.

The depth T2 of the second opening TH2 may be provided to correspond to a thickness of the second frame 112. The depth T2 of the second opening TH2 may be provided at a thickness capable of maintaining a stable strength of the second frame 112.

The depth T2 of the first opening TH1 and the depth T2 of the second opening TH2 may be provided to correspond to a thickness of the body 113. The depth T2 of the first opening TH1 and the depth T2 of the second opening TH2 may be provided at a thickness capable of maintaining a stable strength of the body 113.

As an example, the depth T2 of the first opening TH1 may be provided at several hundreds of micrometers. The depth T2 of the first opening TH1 may be provided at 180 to 500 micrometers. As an example, the depth T2 of the first opening TH1 may be provided at 500 micrometers.

As an example, a thickness of T2-T1 may be selected to be at least 100 micrometers or more. This is in consideration of a thickness of an injection process capable of providing crack free of the body 113.

According to the embodiment, a ratio (T2/T1) of the thickness T2 to the thickness T1 may be provided at two to ten. As an example, when the thickness of T2 is provided at 200 micrometers, the thickness of T1 may be provided at 20 to 100 micrometers. When the ratio (T2/T1) of the thickness of T1 and the thickness of T2 is two or more, a mechanical strength may be secured so that cracks not occur or not broken in the body 113. In addition, when the ratio (T2/T1) of the thickness of T1 and the thickness of T2 is ten or less, an amount of the adhesive 130 disposed in the recess R may be sufficiently arranged, therefore the fixing force between the light emitting device 120 and the package body 110 may be improved.

In addition, the light emitting device package 100 according to the embodiment may comprise a molding part 140, as shown in FIG. 3.

As a reference, in the illustration of FIG. 1, the molding part 140 is not shown such that an arrangement relationship of the first frame 111, the second frame 112, and the body 113 may be well shown.

The molding part 140 may be provided on the light emitting device 120. The molding part 140 may be disposed on the first frame 111 and the second frame 112. The molding part 140 may be disposed on the cavity C provided by the package body 110.

The molding part 140 may comprise an insulating material. In addition, the molding part 140 may comprise a wavelength converting part configured to be incident light emitted from the light emitting device 120 and providing wavelength converted light. As an example, the molding part 140 may comprise at least one selected from the group consisting of a phosphor, a quantum dot, and the like.

In addition, as shown in FIGS. 1 to 4, the light emitting device package 100 according to the embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first bonding part 121. The first conductive layer 321 may have a width of a second direction perpendicular to the first direction. The width of the first conductive layer 321 may be provided to be smaller than that of the first bonding part 121. A width of an upper region of the first conductive layer 321 may be provided to be smaller than that of the first bonding part 121.

The first bonding part 121 may have a width of a second direction perpendicular to the first direction in which the first opening TH1 is formed. The width of the first bonding part 121 may be provided to be greater than that of the second direction of an upper region of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the first frame 111.

The second conductive layer 322 may be provided at the second opening TH2. The second conductive layer 322 may be disposed under the second bonding part 122. A width of the second conductive layer 322 may be provided to be smaller than that of the second bonding part 122. A width of an upper region of the second conductive layer 322 may be provided to be smaller than that of the second bonding part 122.

The second bonding part 122 may have a width of a second direction perpendicular to the first direction in which the second opening TH2 is formed. The width of the second bonding part 122 may be provided to be greater than that of the second direction of an upper region of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the second frame 112.

The first conductive layer 321 and the second conductive layer 322 may comprise one material selected from the group consisting of Ag, Au, and Pt, or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof.

According to the embodiment, as shown in FIG. 3, the first and second conductive layers 321 and 322 may be provided at the first and second openings TH1 and TH2, respectively.

As described above, the first and second openings TH1 and TH2 may have a first region and a second region, and a width W1 of an upper surface of the first region may be provided to be smaller than a width W2 of a lower surface of the second region. Accordingly, volumes of the first and second conductive layers 321 and 322 provided at the first and second openings TH1 and TH2 may be provided such that volumes of the first region are smaller than volumes of the second region of the first and second openings TH1 and TH2.

As an example, the first region of the first and second openings TH1 and TH2 may be corresponded to the upper region of the first and second openings TH1 and TH2. In addition, the second region of the first and second openings TH1 and TH2 may be corresponded to the lower region of the first and second openings TH1 and TH2.

As described above, as the width of the upper region of the first and second openings TH1 and TH2 is provided to be narrow, a contact area between the first and second bonding parts 121 and 122 and the first and second conductive layers 321 and 322 may be reduced. Therefore, it is possible to prevent the first and second conductive layers 321 and 322 from diffusing in the side surface direction of the light emitting device 120 from the lower surfaces of the first and second bonding parts 121 and 122.

When the first and second conductive layers 321 and 322 are diffused in the side surface direction from the lower surface of the first and second bonding parts 121 and 122, the diffused the first and second conductive layers 321 and 322 may be in contact with an active layer of the light emitting device 120, thereby causing a failure due to a short-circuit.

However, according to the embodiment, by reducing the contact area between the first and second bonding parts 121 and 122 and the first and second conductive layers 321 and 322, it is possible to prevent the first and second conductive layers 321 and 322 from diffusing in the side surface direction of the light emitting device 120 from the lower surfaces of the first and second bonding parts 121 and 122, and it is possible to prevent a short-circuit due to the light emitting device 120, thereby improving reliability of the light emitting device package.

In addition, according to the embodiment, as the width of the lower surface of the second region of the first and second openings TH1 and TH2 is provided to be wider than that of the upper surface of the first region thereof, a process of disposing the first and second conductive layers 321 and 322 in the first and second openings TH1 and TH2 through the lower surface of the second region may be easily performed.

Further, according to the embodiment, as the width of the upper region of the first and second openings TH1 and TH2 is provided to be narrow, the volumes of the first and second conductive layers 321 and 322 provided at the upper region of the first and second openings TH1 and TH2 may be reduced.

Therefore, since an amount of use of the first and second conductive layers 321 and 322 may be reduced, an electrical connection may be stably performed and a manufacturing cost may be reduced.

In addition, the light emitting device package according to the embodiment may comprise a first upper recess R3 and a second upper recess R4, as shown in FIGS. 1, 3 and 4.

The first upper recess R3 may be provided on an upper surface of the first frame 111. The first upper recess R3 may be provided to concave in the lower surface direction from the upper surface of the first frame 111. The first upper recess R3 may be disposed to be spaced apart from the first opening TH1 in an outer direction of the package body 110.

In addition, according to the embodiment, a side surface of the first upper recess R3 may have an inclined surfaces and a curvature. Further, the first upper recess R3 may be formed in a spherical shape, and a side surface thereof may be formed in a circular shape. Effects according to the above will be described later.

As shown in FIG. 4, when viewed from the upper direction thereof, the first upper recess R3 may comprise an outer side surface of the package body 110, an inner side surface of the package body, and an extension side surface connecting an outer side surface and an inner side surface thereof and disposed in parallel with the direction in which the recess R is extended. The inner side surface may be provided adjacent to three sides of the first bonding part 121. In addition, the outer surface of the first upper recess R3 may be provided in two short sides facing each other in the minor axis direction of the package body 110 and an outer peripheral region in the major axis direction. For example, the first upper recess R3 may have three outer side surfaces, three inner side surfaces, two extension side surfaces, and may be provided in the periphery of the first bonding part 121 in a "[" shape. When the first frame 111 has the first opening TH1, an mechanical strength of the first frame 111 for supporting the light emitting device 120 and the like may be secured when the first upper recess R3 is configured to have a separated distance from the first opening TH1. Therefore, the configuration of the first upper recess R3 may comprise the above-described configuration in order to be disposed to surround a partial region of the first bonding part 121. Here, the effect obtained when the first upper recess R3 is disposed to surround a partial region of the first bonding part 121 will be described later.

The second upper recess R4 may be provided on the upper surface of the second frame 112. The second upper recess R4 may be provided to concave in the lower surface direction from the upper surface of the second frame 112. The second upper recess R4 may be disposed to be spaced apart from the second opening TH2 in the outer direction of the package body 110.

In addition, according to the embodiment, a side surface of the second upper recess R4 may have an inclined surfaces and a curvature. Further, the second upper recess R4 may be formed in a spherical shape, and a side surface thereof may be formed in a circular shape. Effects according to the above will be described later.

As shown in FIG. 4, when viewed from the upper direction thereof, the second upper recess R4 may comprise an outer side surface of the package body 110, an inner side surface of the package body, and an extension side surface connecting an outer side surface and an inner side surface thereof and disposed in parallel with the direction in which the recess R is extended. The inner side surface may be provided adjacent to three sides of the second bonding part 122. In addition, the outer surface of the second upper recess R4 may be provided in two short sides facing each other in the minor axis direction of the package body 110 and an outer peripheral region in the major axis direction. For example, the second upper recess R4 may have three outer side surfaces, three inner side surfaces, two extension side surfaces, and may be provided in the periphery of the second bonding part 122 in a "]" shape. When the second frame 112 has the second opening TH2, the mechanical strength of the second frame 112 for supporting the light emitting device 120 and the like may be secured when the second upper recess R4 is configured to have a separation distance from the second opening TH2. Therefore, the configuration of the second upper recess R4 may comprise the above-described configuration in order to be disposed to surround a partial region of the second bonding part 122. Here, the effect obtained when the second upper recess R4 is disposed to surround a partial region of the second bonding part 122 will be described later.

For example, the first upper recess R3 and the second upper recess R4 may be provided with a width of several tens of micrometers to several hundreds of micrometers, and may be variously provided according to a size of the light emitting device 120 and/or the light emitting device package 100.

In addition, the light emitting device package 100 according to the embodiment may comprise a resin portion 135, as shown in FIGS. 1, 3 and 4.

The resin portion 135 may be disposed between the first frame 111 and the light emitting device 120. The resin portion 135 may be disposed between the second frame 112 and the light emitting device 120. The resin portion 135 may be provided at the bottom surface of the cavity C provided in the package body 110.

The resin portion 135 may be provided at the first upper recess R3 and the second upper recess R4.

The resin portion 135 may be disposed on the side surface of the first bonding part 121. The resin portion 135 may be provided at the first upper recess R3, and may be provided to be extended to a region in which the first bonding part 121 is disposed. The resin portion 135 may be disposed under the light emitting structure 123 between the outer side of the first bonding part 121 and the outer side surface of the light emitting device 120.

In addition, the resin portion 135 may be disposed on the side surface of the second bonding part 122. The resin portion 135 may be provided at the second upper recesses R4, and may be provided to be extended to a region in which the second bonding part 122 is disposed. The resin portion 135 may be disposed under the light emitting structure 123 between the outer side of the first bonding part 121 and the outer side surface of the light emitting device 120.

In addition, in the light emitting device package according to the embodiment, as shown in FIG. 4, when viewed from the upper direction thereof, a partial region of the first upper recess R3 may be overlapped with a partial region of the light emitting device 120 in the first direction. As an example, an inner side surface of the first upper recess R3 adjacent to the first bonding part 121 may be provided at an inner side of the light emitting structure 123.

In addition, in the light emitting device package according to an embodiment, as shown in FIG. 4, when viewed from the upper direction thereof, a partial region of the second upper recess R4 may be overlapped with a partial region of the light emitting structure 123 in the vertical direction. As an example, a side surface region of the second upper recess R4 adjacent to the second bonding part 122 may be provided to be extended under the light emitting structure 123.

In addition, the first upper recess R3 and the second upper recess R4 may provide a sufficient space in which the resin portion 135 may be provided under the light emitting device 120. The first upper recess R3 and the second upper recess R4 may provide a proper space in which a kind of under-filling process may be performed at the lower portion of the light emitting device 120.

Accordingly, the resin portion 135 filled at the first upper recess R3 and the second upper recess R4 may effectively seal a periphery of the first bonding part 121 and the second bonding part 122.

In addition, after the light emitting device 120 and the package body 110 are fixed via the adhesive 130 disposed in the recess of the body 113, it is possible to seal the periphery of the first and second bonding parts 121 and 122 by disposing the resin portion 135 at the first and second upper recesses R3 and R4. As described above, when the first and second upper recesses R3 and R4 are disposed to surround a partial region of the first and second bonding parts 121 and 122 and a process is performed according to the manufacturing sequence, it is possible to more effectively improve a short-circuit problem that may occur in contact with the active layer when the first and second conductive layers 321 and 322 are extended to the side surface of the light emitting device 120 in a subsequent process.

As an example, the resin portion 135 may comprise at least one of an epoxy-based material, a silicone-based material, and a hybrid material comprising an epoxy-based material and a silicone-based material. In addition, the resin portion 135 may be a reflective part that reflects light emitted from the light emitting device 120, as an example, a resin containing a reflective material such as $TiO_2$, or may comprise a white silicone.

The resin portion 135 may be disposed under the light emitting device 120 and may perform a sealing function. In addition, the resin portion 135 may improve adhesion force between the light emitting device 120 and the first frame 111. The resin portion 135 may improve adhesion force between the light emitting device 120 and the second frame 112.

In addition, as described above, when the first frame 111 has a spherical shape and its side end face has a circular shape, an area of the resin portion directly and/or indirectly contacting the first frame increases, therefore, the adhesive strength between the light emitting device 120 and the first frame 111 may be further improved. Here, a direct contacting may refer that the first frame 111 and the resin portion 135 are in direct contact with each other, an indirect contacting may refer to an embodiment in which first frame 111 is coated with a material different from that of constituting the first frame 111, and may refer to an embodiment in which another material is disposed between the resin portion 135 and the first frame 111.

When the adhesive strength between the first frame 111 and the resin portion 135 is insufficient, another material may be disposed between the first frame 111 and the resin portion 135, and the first frame 111 may be coated with a material having a good adhesion to the resin portion 135 and the first frame 111.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, by a manufacturing process disposing the first and second conductive layers 321 and 322 after the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as $TiO_2$ or white silicone so as to reflect light emitted from the light emitting device 120, the resin portion 135 may reflect light emitted from the light emitting device 120 toward an upper direction of the package body 110, thereby improving the light extraction efficiency of the light emitting device package 100. In addition, when the resin portion 135 is disposed to fill the first and second upper recesses R3 and R4, the first and second upper recesses R3 and R4, as described above, since the first and second upper recesses R3 and R4 are disposed to surround a partial region of the light emitting device 120, the reflectance in the region where the first and second upper recesses R3 and R4 are disposed may be increased. Therefore, the light extraction efficiency of the light emitting device package 100 may be improved.

In addition, according to the embodiment, the molding part 140 may be disposed on the resin portion 135.

Meanwhile, according to another example of the light emitting device package according to the embodiment of the present invention, the resin portion 135 may not be provided separately, and the molding part 140 may be disposed to be in direct contact with the first frame 111 and the second frame 112.

In addition, according to the embodiment, the light emitting structure 123 may be provided as a compound semiconductor. The light emitting structure 123 may be provided as, as an example, a Group II-VI or Group III-V compound semiconductor. For example, the light emitting structure 123 may be provided with at least two or more elements selected from aluminum (Al), gallium (Ga), indium (In), phosphorus (P), arsenic (As), and nitrogen (N).

The light emitting structure 123 may comprise a first conductive type semiconductor layer, an active layer, and a second conductive type semiconductor layer.

The first and second conductive type semiconductor layers may be implemented as at least one of the Group II-VI or Group III-V compound semiconductors. The first and second conductive type semiconductor layers may be formed of a semiconductor material having an empirical formula of $In_xAl_yGa_{1-x-y}N$ ($0 \leq x \leq 1$, $0 \leq y \leq 1$, $0 \leq x+y \leq 1$). For example, the first and second conductive type semiconductor layers may comprise at least one selected from the group consisting of GaN, AlN, AlGaN, InGaN, InN, InAlGaN, AlInN, AlGaAs, GaP, GaAs, GaAsP, AlGaInP, and the like. The first conductive type semiconductor layer may be an n-type semiconductor layer doped with an n-type dopant such as Si, Ge, Sn, Se, or Te. The second conductive type semiconductor layer may be a p-type semiconductor layer doped with a p-type dopant such as Mg, Zn, Ca, Sr, or Ba.

The active layer may be implemented as a compound semiconductor. The active layer may be implemented as at least one of the Group III-V or Group II-VI compound semiconductors. When the active layer is implemented as a multi-well structure, the active layer may comprise a plurality of well layers and a plurality of barrier layers that are alternately disposed, and the active layer may be disposed as the semiconductor material having an empirical formula of $In_xAl_yGa_{1-x-y}N$ ($0 \leq x \leq 1$, $0 \leq y \leq 1$, $0 \leq x+y \leq 1$). For example, the active layer may comprise at least one selected from the group consisting of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

In the light emitting device package 100 according to the embodiment, power may be connected to the first bonding part 121 through the first opening TH1, and power may be connected to the second bonding part 122 through the second opening TH2.

Accordingly, the light emitting device 120 may be driven by the driving power supplied through the first bonding part 121 and the second bonding part 122. In addition, light emitted from the light emitting device 120 may be provided in the upper direction of the package body 110.

Meanwhile, the light emitting device package 100 according to the embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided at the light emitting device package, so that stability of electrical connection and physical coupling may be weakened.

However, according to the light emitting device package and a method of fabricating the light emitting device package according to the embodiment, the first electrode and the second electrode of the light emitting device according to the embodiment may be provided with driving power by the conductive layers disposed at the openings. In addition, the melting point of the conductive layers disposed in the openings may be selected to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the method of fabricating the light emitting device package according to the embodiment, the package body 110 does not need to be exposed to a high temperature in the manufacturing process of the light emitting device package. Therefore, according to the embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Then, referring to the accompanying drawings, a method of fabricating a light emitting device package according to the embodiment of the present invention will be described.

In describing the method of fabricating the light emitting device package according to the embodiment of the present invention with reference to the accompanying drawings, the description of the contents overlapping with the contents described with reference to FIGS. 1 to 4 may be omitted.

Figure 5A:
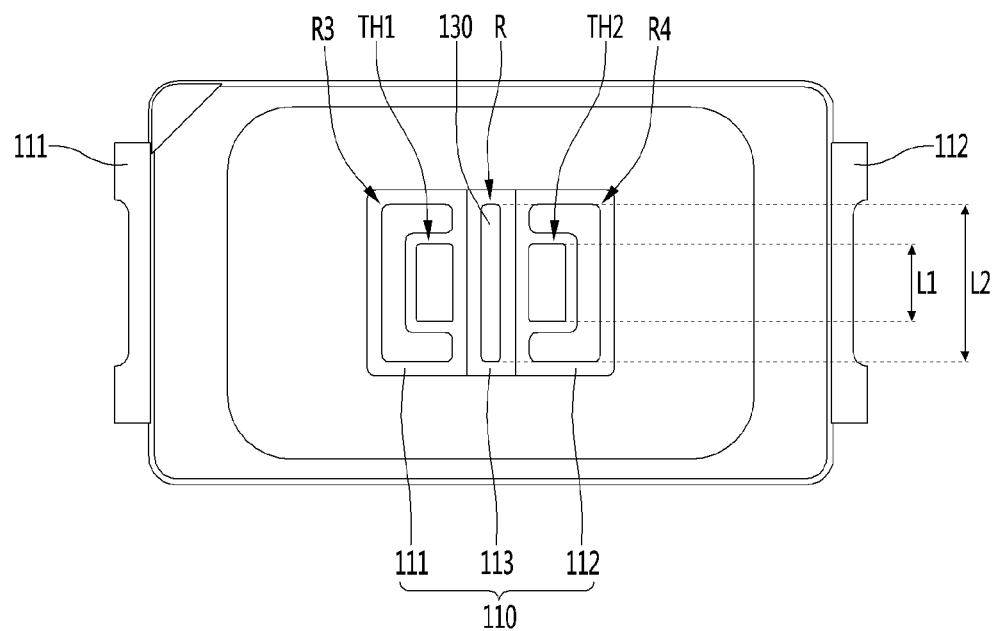
FIGS. 5a to 5b are views explaining a state in which a package body is provided by a method of fabricating a light emitting device package according to an embodiment of the present invention.
Figure 5B:
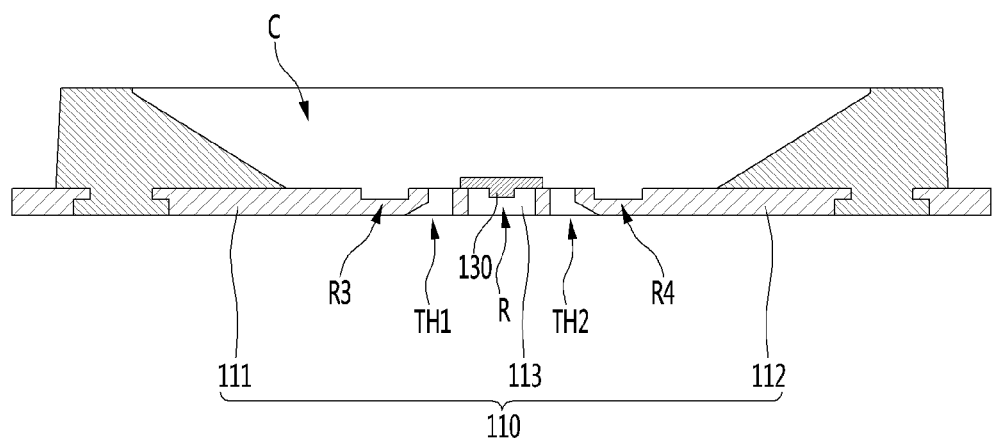

First, according to the method of fabricating the light emitting device package according to the embodiment of the present invention, as shown in FIGS. 5a and 5b, a package body 110 may be provided.

FIGS. 5a and 5b are a plan view and a cross-sectional view illustrating a state in which a package body is provided by the method of fabricating a light emitting device package according to the embodiment of the present invention.

As shown in FIGS. 5a and 5b, the package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112.

The body 113 may be disposed on the first frame 111. In addition, the body 113 may be disposed on the second frame 112.

The body 113 may provide an inclined surface on the first frame 111 and the second frame 112. A cavity C may be provided on the first frame 111 and the second frame 112 by the inclined surface of the body 113.

In addition, the first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The second opening TH2 may be provided at the second frame 112. The second opening TH2 may be provided by passing through the second frame 112. The second opening TH2 may be provided by passing through an upper surface and a lower surface of the second frame 112 in a first direction.

The package body 110 may comprise a recess R provided in the body 113.

The recess R may be provided at the body 113. The recess R may be provided between the first opening TH1 and the second opening TH2. The recess R may be provided to concave from the upper surface of the body 113 toward the lower surface thereof.

According to the embodiment, a length L2 of the recess R may be provided to be greater than a length L1 of the first opening TH1 or a length L1 of the second opening TH2.

Next, in the method of fabricating the light emitting device package according to the embodiment, an adhesive 130 may be provided at the recess R as shown in FIGS. 5a and 5b.

The adhesive 130 may be provided at a recess region through a dotting method or the like. For example, the adhesive 130 may be provided at a predetermined amount to a region in which the recess R is formed, and may be provided to overflow the recess R.

In addition, according to the embodiment, as shown in FIG. 5a, the length L2 of the recess R may be greater than the length L1 of the second opening TH2. The length L1 of the second opening TH2 may be smaller than a length of the light emitting device 120 in a short axis direction. In addition, the length L2 of the recess R may be greater than the length of the light emitting device 120 in the short axis direction.

In the manufacturing process of the light emitting device package according to the embodiment, when an amount of the adhesive 130 provided under the light emitting device 120 is large, an overflowing portion of the adhesive 130 provided at the recess R while being adhered to the lower portion of the light emitting device 120 may be moved in a length L2 direction of the recess R. Accordingly, even when an amount of the adhesive 130 is applied to be greater than that of the design, the light emitting device 120 may be stably fixed without being lifted from the body 113.

In addition, the light emitting device package according to the embodiment may comprise a first upper recess R3 and a second upper recess R4, as shown in FIGS. 5a and 5b.

The first upper recess R3 may be provided on an upper surface of the first frame 111. The first upper recess R3 may be provided to concave in the lower surface direction from the upper surface of the first frame 111. The first upper recess R3 may be disposed to be spaced apart from the first opening TH1 in an outer direction of the package body 110.

In addition, according to the embodiment, a side surface of the first upper recess R3 may have an inclined surfaces and a curvature. Further, the first upper recess R3 may be formed in a spherical shape, and a side surface thereof may be formed in a circular shape.

When viewed from the upper direction thereof, the first upper recess R3 may comprise an outer side surface of the package body 110, an inner side surface of the package body, and an extension side surface connecting an outer side surface and an inner side surface thereof and disposed in parallel with the direction in which the recess R is extended. The inner side surface may be provided adjacent to three sides of the first opening TH1. In addition, the outer surface of the first upper recess R3 may be provided in two short sides facing each other in the minor axis direction of the package body 110 and an outer peripheral region in the major axis direction. For example, the first upper recess R3 may be provided in the periphery of the first opening TH1 in a "[" shape. When the first frame 111 has the first opening TH1, an mechanical strength of the first frame 111 for supporting the light emitting device 120 and the like may be secured when the first upper recess R3 is configured to have a separated distance from the first opening TH1. Therefore, the configuration of the first upper recess R3 may comprise the above-described configuration in order to be disposed to surround a partial region of the first opening TH1.

The second upper recess R4 may be provided on the upper surface of the second frame 112. The second upper recess R4 may be provided to concave in the lower surface direction from the upper surface of the second frame 112. The second upper recess R4 may be disposed to be spaced apart from the second opening TH2 in the outer direction of the package body 110.

In addition, according to the embodiment, a side surface of the second upper recess R4 may have an inclined surfaces and a curvature. Further, the second upper recess R4 may be formed in a spherical shape, and a side surface thereof may be formed in a circular shape. Effects according to the above will be described later.

When viewed from the upper direction thereof, the second upper recess R4 may comprise an outer side surface of the package body 110, an inner side surface of the package body, and an extension side surface connecting an outer side surface and an inner side surface thereof and disposed in parallel with the direction in which the recess R is extended. The inner side surface may be provided adjacent to three sides of the second opening TH2. In addition, the outer surface of the second upper recess R4 may be provided in two short sides facing each other in the minor axis direction of the package body 110 and an outer peripheral region in the major axis direction. For example, the second upper recess R4 may have three outer side surfaces, three inner side surfaces, two extension side surfaces, and may be provided in the periphery of the second opening TH2 in a "]" shape. When the second frame 112 has the second opening TH2, the mechanical strength of the second frame 112 for supporting the light emitting device 120 and the like may be secured when the second upper recess R4 is configured to have a separation distance from the second opening TH2. Therefore, the configuration of the second upper recess R4 may comprise the above-described configuration in order to be disposed to surround a partial region of the second opening TH2. Here, the effect obtained when the second upper recess R4 is disposed to surround a partial region of the second bonding part 122 will be described later.

Figure 6A:
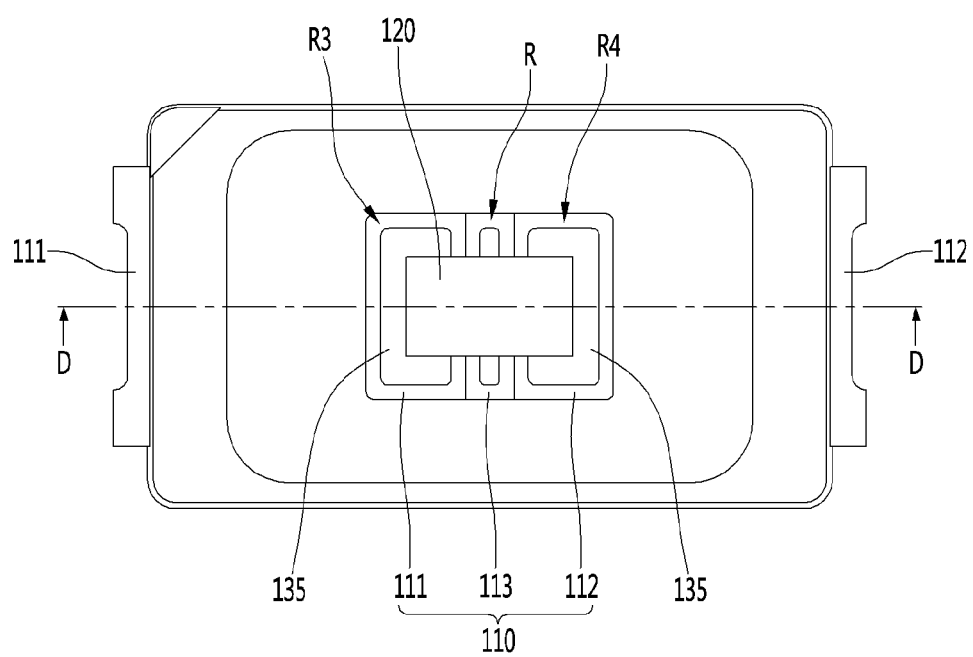
FIGS. 6a to 6b are views explaining a state in which a light emitting device is provided by a method of fabricating a light emitting device package according to an embodiment of the present invention.
Figure 6B:
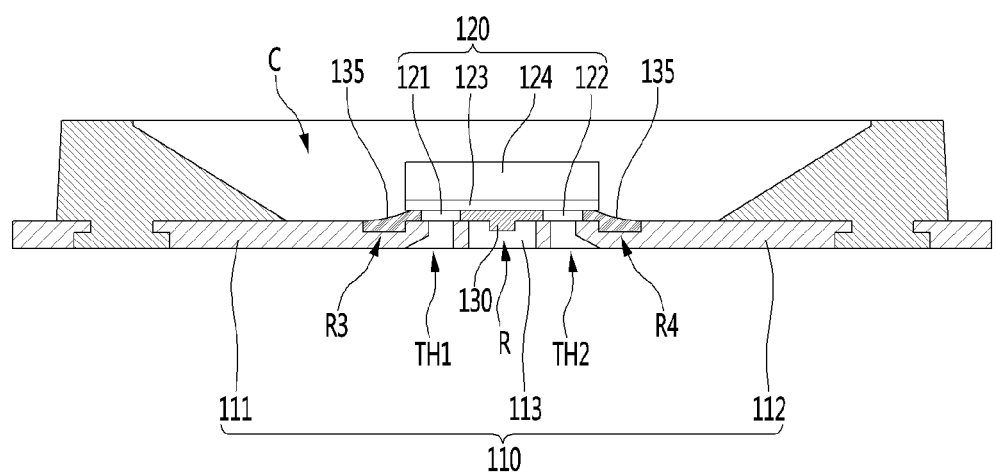

In addition, according to the method of fabricating the light emitting device package according to the embodiment, as shown in FIGS. 6a and 6b, the light emitting device 120 may be provided on the package body 110.

FIGS. 6a and 6b are a plan view and a cross-sectional view illustrating a state in which a light emitting device is provided by the method of fabricating the light emitting device package according to the embodiment of the present invention.

According to the embodiment, in the process of disposing the light emitting device 120 on the package body 110, the recess R may also be used to function as a kind of align key.

The light emitting device 120 may be fixed at the body 113 by the adhesive 130. A part of the adhesive 130 provided at the recess R may be moved in a direction of the first pad electrode 121 and the second pad electrode 122 of the light emitting device 120 and may be cured.

Accordingly, the adhesive 130 may be provided at a wide region between the lower surface of the light emitting device 120 and the upper surface of the body 113, and the fixing force between the light emitting device 120 and the body 113 may be improved.

According to the embodiment, as described with reference to FIG. 3, the first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the first frame 111 toward the lower surface thereof.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the second frame 112 toward the lower surface thereof.

In addition, according to the method of fabricating the light emitting device package according to the embodiment, as shown in FIGS. 6a and 6b, a resin portion 135 may be formed.

The resin portion 135 may be disposed between the first frame 111 and the light emitting device 120. The resin portion 135 may be disposed between the second frame 112 and the light emitting device 120. The resin portion 135 may be provided at the bottom surface of the cavity C provided in the package body 110.

The resin portion 135 may be provided at the first upper recess R3 and the second upper recess R4.

The resin portion 135 may be disposed on the side surface of the first bonding part 121. The resin portion 135 may be provided at the first upper recess R3, and may be provided to be extended to a region in which the first bonding part 121 is disposed. The resin portion 135 may be disposed under the light emitting structure 123.

In addition, the resin portion 135 may be disposed on the side surface of the second bonding part 122. The resin portion 135 may be provided at the second upper recesses R4, and may be provided to be extended to a region in which the second bonding part 122 is disposed. The resin portion 135 may be disposed under the light emitting structure 123.

The first upper recess R3 and the second upper recess R4 may provide a sufficient space in which the resin portion 135 may be provided.

Accordingly, the resin portion 135 filled at the first upper recess R3 and the second upper recess R4 may effectively seal a periphery of the first bonding part 121 and the second bonding part 122.

As an example, the resin portion 135 may comprise at least one of an epoxy-based material, a silicone-based material, and a hybrid material comprising an epoxy-based material and a silicone-based material. For example, the resin portion 135 may be a reflective part that reflects light emitted from the light emitting device 120, as an example, a resin containing a reflective material such as $TiO_2$. The resin portion 135 may comprise a white silicone.

The resin portion 135 may be disposed under the light emitting device 120 and may perform a sealing function. In addition, the resin portion 135 may improve adhesion force between the light emitting device 120 and the first frame 111. The resin portion 135 may improve adhesion force between the light emitting device 120 and the second frame 112.

In addition, when the resin portion 135 comprises a material having a reflective characteristic such as white silicone, the resin portion 135 may reflect light emitted from the light emitting device 120 toward an upper direction of the package body 110, thereby improving the light extraction efficiency of the light emitting device package 100.

According to the embodiment, the light emitting device 120 may be disposed on the package body 110, and then the adhesive 130 may be cured. In addition, the curing of the adhesive 130 is performed, then the resin 135 may be formed, and the resin 135 may be cured separately.

Further, according to another embodiment, the resin portion 135 is formed, and then the curing to the adhesive 130 and the resin portion 135 may be simultaneously performed.

Figure 7A:
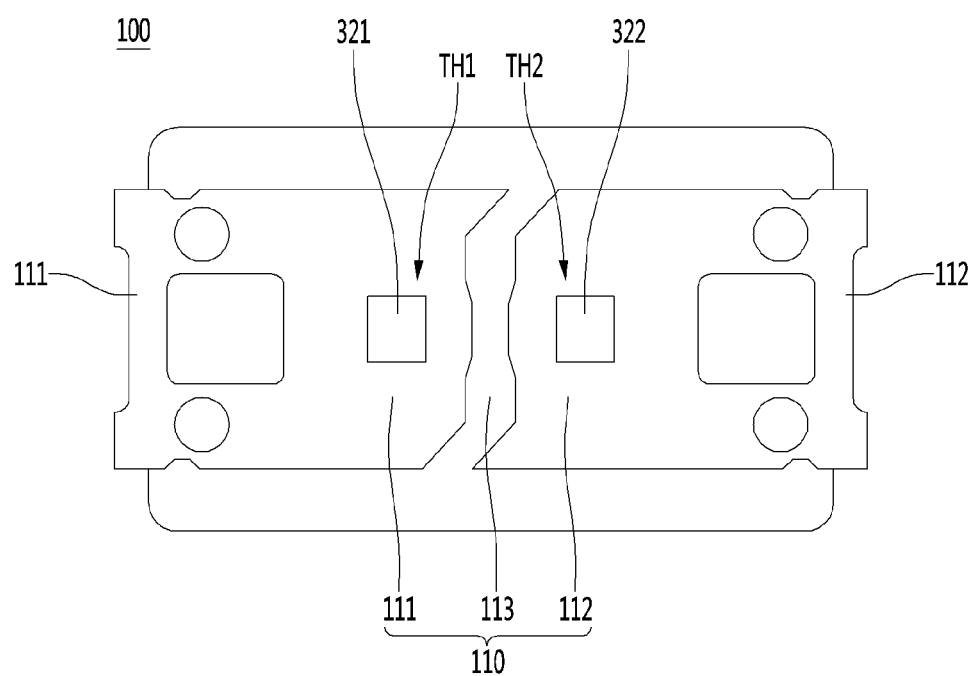
FIGS. 7a to 7b are views explaining a state in which a conductive layer is provided at an opening by a method of fabricating a light emitting device package according to an embodiment of the present invention.
Figure 7B:
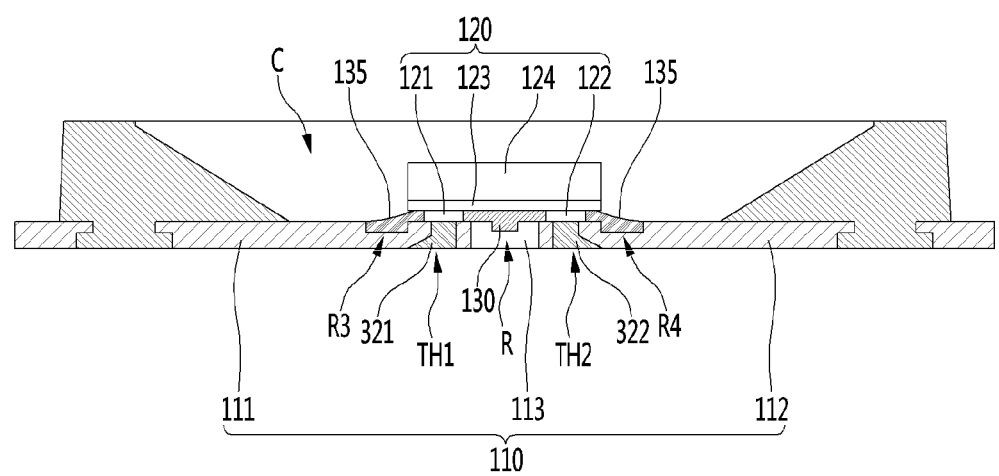

Next, according to the method of fabricating the light emitting device package according to the embodiment, as shown in FIGS. 7a and 7b, the first conductive layer 321 and the second conductive layer 322 may be formed.

FIGS. 7a and 7b are a plan view and a cross-sectional view illustrating a state in which a conductive layer is provided at an opening by the method of fabricating the light emitting device package according to the embodiment of the present invention.

In the light emitting device package 100 according to the embodiment, the lower surface of the first bonding part 121 may be exposed through the first opening TH1. In addition, the lower surface of the second bonding part 122 may be exposed through the second opening TH2.

According to the embodiment, the first conductive layer 321 may be formed at the first opening TH1. In addition, the second conductive layer 322 may be formed at the second opening TH2.

The first conductive layer 321 may be provided at the first opening TH1. The first conductive layer 321 may be disposed under the first bonding part 121. The width of the first conductive layer 321 may be provided to be smaller than that of the first bonding part 121. The first conductive layer 321 may be disposed to be in direct contact with the lower surface of the first bonding part 121. The first conductive layer 321 may be electrically connected to the first bonding part 121. The first conductive layer 321 may be disposed to be surrounded by the first frame 111.

The second conductive layer 322 may be provided at the second opening TH2. The second conductive layer 322 may be disposed under the second bonding part 122. The width of the second conductive layer 322 may be provided to be smaller than that of the second bonding part 122. The second conductive layer 322 may be disposed to be in direct contact with the lower surface of the second bonding part. The second conductive layer 322 may be electrically connected to the second bonding part 122. The second conductive layer 322 may be disposed to be surrounded by the second frame 112.

As an example, the first conductive layer 321 and the second conductive layer 322 may also be formed by using a conductive paste. The first conductive layer 321 and the second conductive layer 322 may be formed by a solder paste, a silver paste, or the like.

Meanwhile, according to the embodiment, the first and second openings TH1 and TH2 may be provided such that the width of an upper surface of the first region is smaller than that of a lower surface of the second region. Accordingly, the amount of the first and second conductive layers 321 and 322, which is provided at the first and second openings TH1 and TH2, may also be provided in the upper regions of the first and second openings TH1 and TH2 to be smaller than that in the lower regions thereof.

As described above, as the widths of the upper regions of the first and second openings TH1 and TH2 are provided to be narrow, a contact area between the first and second bonding parts 121 and 122 and the first and second conductive layers 321 and 322 may be reduced. Therefore, it is possible to prevent the first and second conductive layers 321 and 322 from diffusing in a side surface direction thereof from the lower surfaces of the first and second bonding parts 121 and 122.

When the first and second conductive layers 321 and 322 are diffused in the side surface direction of the first and second bonding parts 121 and 122 from the lower surfaces thereof, the first and second conductive layers 321 and 322 which are diffused may be in contact with the active layer of the light emitting device 120, thereby causing a failure due to a short-circuit.

However, according to the embodiment, by decreasing the area in which the first and second bonding parts 121 and 122 are in contact with the first and second conductive layers 321 and 322, it is possible to prevent the first and second conductive layers 321 and 322 from diffusing in the side surface direction thereof from the lower surfaces of the first and second bonding part and a failure due to a short-circuit of the light emitting device 120 may be prevented, thereby improving reliability.

In addition, as described above, when disposing of the first and second conductive layers 321 and 322 after the resin portion 135 is disposed on the first and second recesses, the resin portion 135 may prevent the conductive layers 321 and 322 from diffusing or overflowing in the side surface of the light emitting device 120.

In addition, according to the embodiment, as the width of the lower region of the first and second openings TH1 and TH2 is provided to be wider than that of the upper region thereof, a process of forming the first and second conductive layers 321 and 322 through the first and second openings TH1 and TH2 may be easily performed.

Further, according to the embodiment, as the widths of the upper regions of the first and second openings TH1 and TH2 are provided to be narrow, the amount of the first and second conductive layers 321 and 322 provided at the upper regions of the first and second openings TH1 and TH2 may be reduced.

Therefore, since an amount of use of the first and second conductive layers 321 and 322 may be reduced, an electrical connection may be stably performed and a manufacturing cost may be reduced.

Figure 8A:
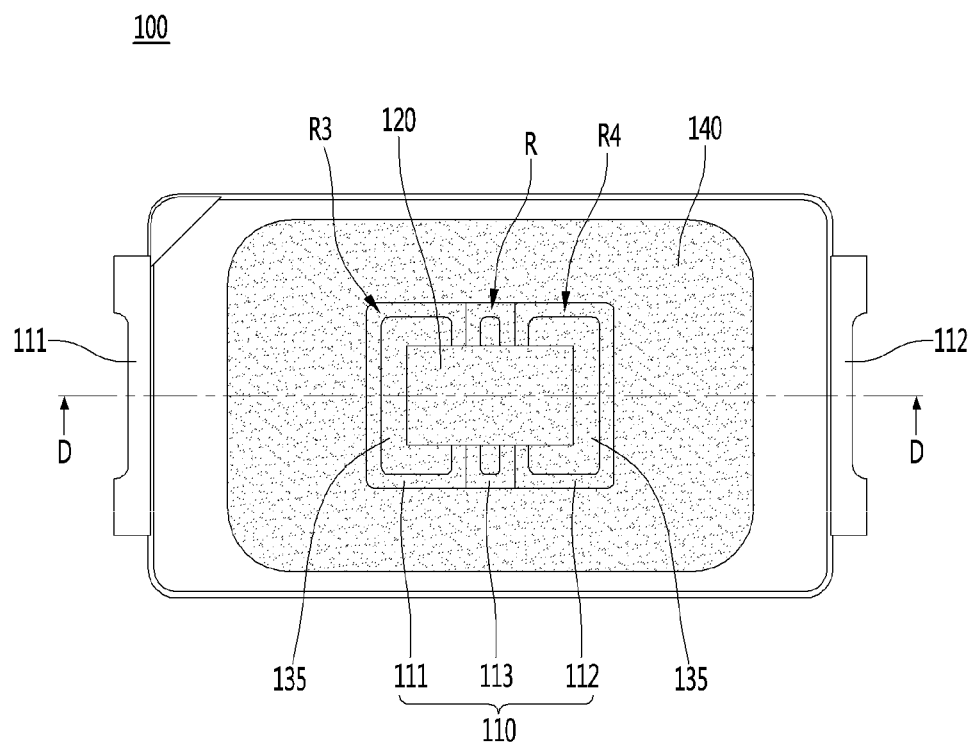
FIGS. 8a to 8b are views explaining a state in which a molding part is provided by a method of fabricating a light emitting device package according to an embodiment of the present invention.
Figure 8B:
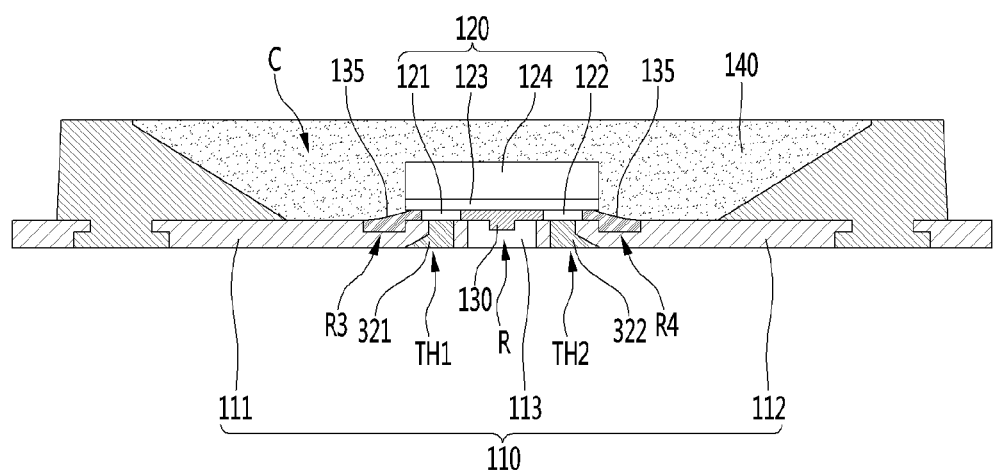

Next, according to the method of fabricating the light emitting device package according to the embodiment, as shown in FIGS. 8a and 8b, the molding part 140 may be provided on the light emitting device 120.

FIGS. 8a and 8b are a plan view and a cross-sectional view illustrating a state in which a molding part is provided by the method of fabricating the light emitting device package according to the embodiment of the present invention.

The molding part 140 may be provided on the light emitting device 120. The molding part 140 may be disposed on the first frame 111 and the second frame 112. The molding part 140 may be disposed on the cavity C provided by the package body 110. The molding part 140 may be disposed on the resin portion 135.

The molding part 140 may comprise an insulating material. In addition, the molding part 140 may comprise a wavelength converting part configured to be incident light emitted from the light emitting device 120 and providing wavelength converted light. As an example, the molding part 140 may comprise at least one selected from the group consisting of a phosphor, a quantum dot, and the like.

As described above, according to the method of fabricating the light emitting device package according to the embodiment, the periphery of the first and second bonding parts 121 and 122 may be stably sealed by the adhesive 130 and the resin portion 135.

Accordingly, in the process of forming the first and second conductive layers 321 and 322 through the first and second openings TH1 and TH2, it is possible to prevent the first and second conductive layers 321 and 322 from diffusing in direction of side surfaces of the first and second bonding parts 121 and 122 effectively.

Therefore, according to the method of fabricating the light emitting device package according to the embodiment, the first and second conductive layers 321 and 322 may be prevented from diffusing in the direction of the side surfaces of the first and second bonding part from the lower surfaces thereof and a failure due to a short-circuit of the light emitting device 120 may be prevented, thereby improving reliability.

Meanwhile, in the above description, as shown in FIGS. 7a and 7b, first, the case in which the first conductive layer 321 and the second conductive layer 322 are formed first, and it is described based on the case in which the molding part 140 is formed, as shown in FIGS. 8a and 8b.

However, according to another example of the method of fabricating the light emitting device package according to the embodiment, the resin portion 135 and the molding part 140 may be formed first, and the first conductive layer 321 and the second conductive layer 322 may be formed later.

In addition, according to another example of the method of fabricating the light emitting device package according to the embodiment, the resin portion 135 may not be formed and only the molding part 140 may be formed in the cavity of the package body 110.

In addition, according to another embodiment, the first and second conductive layers 321 and 322 may be formed first, and the resin portion 135 and the molding part 140 may be formed later.

In the light emitting device package 100 according to the embodiment, power may be connected to the first bonding part 121 through the first opening TH1, and power may be connected to the second bonding part 122 through the second opening TH2.

Accordingly, the light emitting device 120 may be driven by the driving power supplied through the first bonding part 121 and the second bonding part 122. In addition, light emitted from the light emitting device 120 may be provided in the upper direction of the package body 110.

Meanwhile, the light emitting device package 100 according to the embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between the frame and the light emitting device provided at the light emitting device package, so that stability of electrical connection and physical coupling may be weakened. Accordingly, a position of the light emitting device may be changed, and the optical and electrical characteristics and reliability of the light emitting device package may be deteriorated.

However, according to the light emitting device package and a method of fabricating the light emitting device package according to the embodiment, the first bonding part and the second bonding part of the light emitting device according to the embodiment may be provided with driving power by the conductive layers disposed at the openings. Therefore, since the adhesive material between the light emitting device and the package body 110 and the adhesive material between the light emitting device 120 and the package body 110 and between the light emitting device package and the circuit substrate are different from each other, it is possible to prevent a problem of re-melting. In addition, since the light emitting device 120 is electrically connected to the circuit board through the first and second openings TH1 and TH2 of the package body 110, it is possible to prevent the problem of re-melting. Further, the melting point of the conductive layers disposed at the openings may be selected so as to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the method of fabricating the light emitting device package according to the embodiment, the package body 110 does not need to be exposed to a high temperature in the manufacturing process of the light emitting device package. Therefore, according to the embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Next, another example of the light emitting device package according to an embodiment of the present invention will be described with reference to FIG. 9.

In describing the light emitting device package according to the embodiment of with reference to FIG. 9, the description of the contents overlapping with the contents described with reference to FIGS. 1 to 8 may be omitted.

Figure 9:
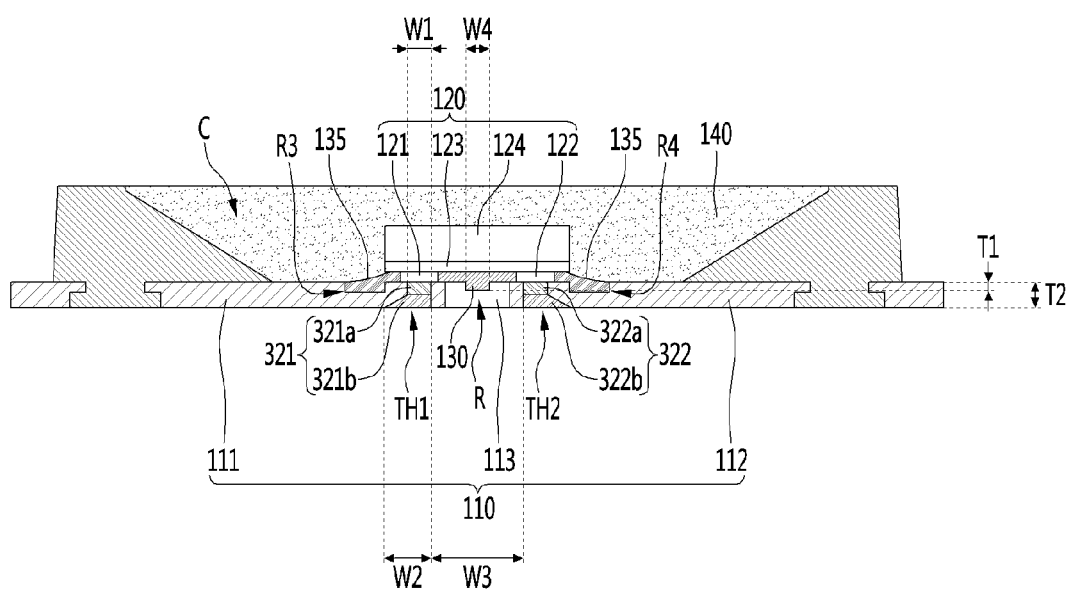
FIG. 9 is a view illustrating another example of a light emitting device package according to an embodiment of the present invention.

The light emitting device package according to the embodiment may comprise a package body 110 and a light emitting device 120, as shown in FIG. 9.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide a structural strength of the package body 110 and may be electrically connected to the light emitting device 120.

A difference between a case of forming the first frame 111 and the second frame 112 as the insulating frame and a case of forming the first frame 111 and the second frame 112 as the conductive frame will be described later.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 9. The first bonding part 121 and the second bonding part 122 may be disposed between the light emitting structure 123 and the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

Meanwhile, the light emitting device package according to the embodiment may comprise a first opening TH1 and a second opening TH2, as shown in FIG. 9. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be provided to be smaller than or equal to that of the first bonding part 121. In addition, a width of an upper region of the second opening TH2 may be provided to be smaller than or equal to that of the second bonding part 122.

Therefore, the first bonding part 121 of the light emitting device 120 and the first frame 111 may be more firmly attached. In addition, the second bonding part 122 of the light emitting device 120 and the second frame 112 may be more firmly attached.

In addition, the width W1 of the upper region of the first opening TH1 may be provided to be smaller than or equal to a width W2 of a lower region of the first opening TH1. Further, the width of the upper region of the second opening TH2 may be provided to be smaller than or equal to a width of a lower region of the second opening TH2.

For example, the width W1 of the upper region of the first opening TH1 may be provided at several tens of micrometers to several hundreds of micrometers. Further, the width W2 of the lower region of the first opening TH1 may be provided to be several tens of micrometers to several hundreds of micrometers larger than the width W1 of the upper region of the first opening TH1.

In addition, the width of the upper region of the second opening TH2 may be provided at several tens of micrometers to several hundreds of micrometers. Further, the width of the lower region of the second opening TH2 may be provided to be several tens of micrometers to several hundreds of micrometers larger than the width of the upper region of the second opening TH2.

In addition, the width W2 of the lower region of the first opening TH1 may be provided wider than the width W1 of the upper region of the first opening TH1. The first opening TH1 may be provided with a predetermined width in the upper region at a predetermined depth and may be provided in an inclined shape toward the lower region.

In addition, the width of the lower region of the second opening TH2 may be provided wider than the width of the upper region of the second opening TH2. The second opening TH2 may be provided with a predetermined width in the upper region at a predetermined depth and may be provided in an inclined shape toward the lower region.

For example, the first opening TH1 may be provided in an inclined shape in which a width gradually decreases from the lower region toward the upper region. Further, the second opening TH2 may be provided in an inclined shape in which a width gradually decreases from the lower region toward the upper region.

However, the present invention is not limited thereto, and the inclined surfaces between the upper and lower regions of the first and second openings TH1 and TH2 may have a plurality of inclined surfaces having different slopes, and the inclined surfaces may be disposed with a curvature.

A width W3 between the first opening TH1 and the second opening TH2 in lower surface regions of the first frame 111 and the second frame 112 may be provided at several hundreds of micrometers. The width W3 between the first opening TH1 and the second opening TH2 in the lower surface regions of the first frame 111 and the second frame 112 may be provided at 100 to 150 micrometers, as an example.

The width W3 between the first opening TH1 and the second opening TH2 in the lower surface regions of the first frame 111 and the second frame 112 may be selected to be provided over a predetermined distance in order to prevent a short-circuit between the pads from occurring when the light emitting device package 100 according to the embodiment is mounted on a circuit board, a submount, or the like later.

The light emitting device package according to the embodiment may comprise an adhesive 130, as shown in FIG. 9.

The adhesive 130 may be disposed between the package body 110 and the light emitting device 120. The adhesive 130 may be disposed between an upper surface of the package body 110 and a lower surface of the light emitting device 120. The adhesive 130 may be disposed between an upper surface of the body 113 and the lower surface of the light emitting device 120.

In addition, the light emitting device package according to the embodiment may comprise a recess R, as shown in FIG. 9.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

For example, the adhesive 130 may be disposed in the recess R. The adhesive 130 may be disposed between the light emitting device 120 and the body 113. The adhesive 130 may be disposed between the first bonding part 121 and the second bonding part 122. As an example, the adhesive 130 may be disposed to be in contact with a side surface of the first bonding part 121 and a side surface of the second bonding part 122.

In addition, the adhesive 130 may be disposed between the light emitting device 120 and the package body 110. The adhesive 130 may be disposed between the light emitting device 120 and the first frame 111. The adhesive 130 may be disposed between the light emitting device 120 and the second frame 112.

The adhesive 130 may provide a stable fixing force between the light emitting device 120 and the package body 110. The adhesive 130 may provide a stable fixing force between the light emitting device 120 and the body 113. The adhesive 130 may be disposed, to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. Further, as an example, the adhesive 130 may comprise a white silicone.

The adhesive 130 may provide a stable fixing force between the body 113 and the light emitting device 120, when light is emitted to the lower surface of the light emitting device 120, and may provide a light diffusion function between the light emitting device 120 and the body 113. When the light is emitted from the light emitting device 120 to the lower surface of the light emitting device 120, the adhesive 130 may improve the light extraction efficiency of the light emitting device package 100 by providing the light diffusion function.

In addition, the adhesive 130 may reflect the light emitted from the light emitting device 120. When the adhesive 130 comprises the reflection function, the adhesive 130 may be formed of a material comprising $TiO_2$, Silicone, and the like.

The recess R may provide a proper space in which a kind of under-filling process may be performed at a lower portion of the light emitting device 120. The recess R may be provided on a first depth or more so that the adhesive 130 may be sufficiently provided between the lower surface of the light emitting device 120 and the upper surface of the body 113. In addition, the recess R may be provided at a second depth or less to provide a stable strength of the body 113.

In addition, as shown in FIG. 9, the light emitting device package according to the embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first bonding part 121. The width of the first conductive layer 321 may be provided to be smaller than that of the first bonding part 121. A width of an upper region of the first conductive layer 321 may be provided to be smaller than that of the first bonding part 121.

The first bonding part 121 may have a width of a second direction perpendicular to a first direction in which the first opening TH1 is formed. The width of the first bonding part 121 may be provided to be greater than that of the second direction of an upper region of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the first frame 111.

The second conductive layer 322 may be provided at the second opening TH2. The second conductive layer 322 may be disposed under the second bonding part 122. A width of the second conductive layer 322 may be provided to be smaller than that of the second bonding part 122. A width of an upper region of the second conductive layer 322 may be provided to be smaller than that of the second bonding part 122.

The second bonding part 122 may have a width of a second direction perpendicular to the first direction in which the second opening TH2 is formed. The width of the second bonding part 122 may be provided to be greater than that of the second direction of an upper region of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the second frame 112.

The first conductive layer 321 and the second conductive layer 322 may comprise one material selected from the group consisting of Ag, Au, and Pt, or an alloy thereof. However, the present invention is not limited thereto, and a material capable of securing a conductive function may be used in the first conductive layer 321 and the second conductive layer 322.

As an example, the first conductive layer 321 and the second conductive layer 322 may be formed by using a conductive paste. The conductive paste may comprise a solder paste, a silver paste, or the like.

Figure 18:
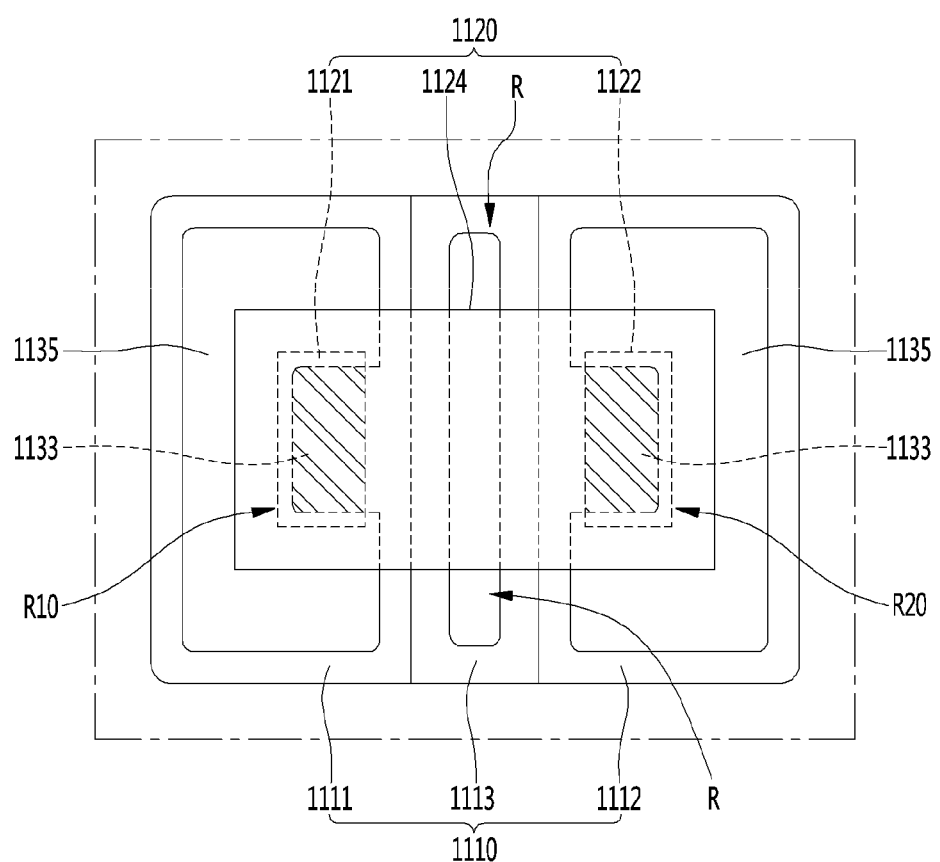
FIG. 18 is a view explaining the arrangement relationship of a first frame, a second frame, and a body applied to a light emitting device package according to an embodiment of the present invention.

Meanwhile, the first conductive layer 321 and the second conductive layer 322 according to the embodiment, as shown in FIG. 18, may be provided with multi layers.

As an example, the first conductive layer 321 may comprise a first upper conductive layer 321a and a first lower conductive layer 321b. The first upper conductive layer 321a may be provided at an upper region of the first opening TH1. The first lower conductive layer 321b may be provided at a lower region of the first opening TH1.

In addition, the second conductive layer 322 may comprise a second upper conductive layer 322a and a second lower conductive layer 322b. The second upper conductive layer 322a may be provided at an upper region of the second opening TH2. The second lower conductive layer 322b may be provided at a lower region of the second opening TH2.

According to the embodiment, the first upper conductive layer 321a and the first lower conductive layer 321b may comprise different materials. The first upper conductive layer 321a and the first lower conductive layer 321b may have different melting points. As an example, the melting point of the first upper conductive layer 321a may be selected to be higher than that of the first lower conductive layer 321b.

For example, a conductive paste forming the first upper conductive layer 321a and a conductive paste forming the first lower conductive layer 321b may be provided differently. According to the embodiment, the first upper conductive layer 321a may be formed by using a silver paste, for example, and the first lower conductive layer 321b may be formed by using a solder paste.

According to the embodiment, when the first upper conductive layer 321a is formed to have formed to have the silver paste, a degree to which the silver paste provided at the first opening TH1 is diffused and permeated between the first bonding part 121 and the first frame 111 was detected as weak or absent.

Therefore, when the first upper conductive layer 321a is formed to have silver paste, it is possible to prevent the light emitting device 120 from being short-circuited or deteriorated.

In addition, when the first upper conductive layer 321a is formed with the silver paste and the first lower conductive layer 321b is formed with the solder paste, as compared with the case in which the entire first conductive layer 321 is formed to have the silver paste, a manufacturing cost may be reduced.

Similarly, the conductive paste forming the second upper conductive layer 322a and the conductive paste forming the second lower conductive layer 322b may be provided differently. According to the embodiment, the second upper conductive layer 322a may be formed by using a silver paste, for example, and the second lower conductive layer 322b may be formed by using a solder paste.

According to the embodiment, when the second upper conductive layer 322a is formed with the silver paste, a degree to which the silver paste provided at the second opening TH2 is diffused and permeated between the second bonding part 122 and the second frame 112 was detected as weak or absent.

Therefore, when the second upper conductive layer 322a is formed with silver paste, it is possible to prevent the light emitting device 120 from being short-circuited or deteriorated.

In addition, when the second upper conductive layer 322a is formed with the silver paste and the second lower conductive layer 322b is formed with the solder paste, as compared with the case in which the entire second conductive layer 322 is formed to have the silver paste, a manufacturing cost may be reduced.

According to the embodiment, as shown in FIG. 9, the first and second conductive layers 321 and 322 may be provided at the first and second openings TH1 and TH2, respectively.

As described above, the first and second openings TH1 and TH2 may be provided such that a width W1 of the upper region is smaller than a width W2 of the lower region. Accordingly, the amount of the first and second conductive layers 321 and 322 provided in the first and second openings TH1 and TH2, may also be provided in the upper regions of the first and second openings TH1 and TH2 to be smaller than that in the lower regions thereof.

As described above, as the widths of the upper regions of the first and second openings TH1 and TH2 are provided to be narrow, a contact area between the first and second bonding parts 121 and 122 and the first and second conductive layers 321 and 322 may be reduced. Therefore, it is possible to prevent the first and second conductive layers 321 and 322 from diffusing in side surface direction thereof from the lower surfaces of the first and second bonding parts 121 and 122.

When the first and second conductive layers 321 and 322 are diffused in the side surface direction of the first and second bonding parts 121 and 122 from the lower surfaces thereof, the first and second conductive layers 321 and 322 which are diffused may be in contact with the active layer of the light emitting device 120, thereby causing a failure due to a short-circuit.

However, according to the embodiment, by decreasing the area in which the first and second bonding parts 121 and 122 are in contact with the first and second conductive layers 321 and 322, it is possible to prevent the first and second conductive layers 321 and 322 from diffusing in the side surface direction thereof from the lower surfaces of the side surfaces of the first and second bonding part and a failure due to a short-circuit of the light emitting device 120 may be prevented, thereby improving reliability.

In addition, according to the embodiment, as the width of the lower region of the first and second openings TH1 and TH2 is provided to be wider than that of the upper region thereof, a process of forming the first and second conductive layers 321 and 322 at the first and second openings TH1 and TH2 may be easily performed.

Further, according to the embodiment, as the width of the upper region of the first and second openings TH1 and TH2 is provided to be narrow, the amount of the first and second conductive layers 321 and 322 provided at the upper region of the first and second openings TH1 and TH2 may be reduced.

Therefore, since an amount of use of the first and second conductive layers 321 and 322 may be reduced, an electrical connection may be stably performed and a manufacturing cost may be reduced.

In addition, the light emitting device package according to the embodiment may comprise a first upper recess R3 and a second upper recess R4, as shown in FIG. 9.

The first upper recess R3 may be provided on an upper surface of the first frame 111. The first upper recess R3 may be provided to concave in the lower surface direction from the upper surface of the first frame 111. The first upper recess R3 may be disposed to be spaced apart from the first opening TH1.

The second upper recess R4 may be provided on an upper surface of the second frame 112. The second upper recess R4 may be provided to concave in the lower surface direction from the upper surface of the second frame 112. The second upper recess R4 may be disposed to be spaced apart from the second opening TH2.

In addition, the light emitting device package according to the embodiment may comprise a resin portion 135, as shown in FIG. 9.

The resin portion 135 may be disposed between the first frame 111 and the light emitting device 120. The resin portion 135 may be disposed between the second frame 112 and the light emitting device 120. The resin portion 135 may be provided at the bottom surface of the cavity C provided in the package body 110.

The resin portion 135 may be provided at the first upper recess R3 and the second upper recess R4.

The resin portion 135 may be disposed on the side surface of the first bonding part 121. The resin portion 135 may be provided at the first upper recess R3, and may be provided to be extended to a region in which the first bonding part 121 is disposed. The resin portion 135 may be disposed under the light emitting structure 123.

In addition, the resin portion 135 may be disposed on the side surface of the second bonding part 122. The resin portion 135 may be provided at the second upper recesses R4, and may be provided to be extended to a region in which the second bonding part 122 is disposed. The resin portion 135 may be disposed under the light emitting structure 123.

In addition, the first upper recess R3 and the second upper recess R4 may provide a sufficient space in which the resin portion 135 may be provided under the light emitting device 120. The first upper recess R3 and the second upper recess R4 may provide a proper space in which a kind of underfilling process may be performed at the lower portion of the light emitting device 120.

Accordingly, the resin portion 135 filled at the first upper recess R3 and the second upper recess R4 may effectively seal a periphery of the first bonding part 121 and the second bonding part 122.

As an example, the resin portion 135 may comprise at least one of an epoxy-based material, a silicone-based material, and a hybrid material comprising an epoxy-based material and a silicone-based material. For example, the resin portion 135 may be a reflective part that reflects light emitted from the light emitting device 120, as an example, a resin containing a reflective material such as $TiO_2$. The resin portion 135 may comprise a white silicone.

The resin portion 135 may be disposed under the light emitting device 120 and may perform a sealing function. In addition, the resin portion 135 may improve adhesion force between the light emitting device 120 and the first frame 111. The resin portion 135 may improve adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from the first opening TH1 region and the second opening TH2 region, and diffusing and moving in direction of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as white silicone, the resin portion 135 may reflect light emitted from the light emitting device 120 toward an upper direction of the package body 110, thereby improving the light extraction efficiency of the light emitting device package 100.

In addition, the light emitting device package 100 according to the embodiment may comprise a molding part 140, as shown in FIG. 9.

The molding part 140 may be provided on the light emitting device 120. The molding part 140 may be disposed on the first frame 111 and the second frame 112. The molding part 140 may be disposed on the cavity C provided by the package body 110. The molding part 140 may be disposed on the resin portion 135.

In the light emitting device package according to the embodiment, power may be connected to the first bonding part 121 through the first opening TH1, and power may be connected to the second bonding part 122 through the second opening TH2.

Accordingly, the light emitting device 120 may be driven by the driving power supplied through the first bonding part 121 and the second bonding part 122. In addition, light emitted from the light emitting device 120 may be provided in the upper direction of the package body 110.

Meanwhile, the light emitting device package 100 according to the embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided at the light emitting device package, so that stability of electrical connection and physical coupling may be weakened.

However, according to the light emitting device package and a method of fabricating the light emitting device package according to the embodiment, the first electrode and the second electrode of the light emitting device according to the embodiment may be provided with driving power by the conductive layers disposed at the openings. In addition, the melting point of the conductive layers disposed in the openings may be selected to have a higher value than that of the general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the method of fabricating the light emitting device package according to the embodiment, the package body 110 does not need to be exposed to a high temperature in the manufacturing process of the light emitting device package. Therefore, according to the embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Meanwhile, the light emitting device package 100 according to the embodiment described above referring to FIGS. 1 to 9 may be supplied and mounted on a submount, a circuit board, or the like.

Then, still another example of the light emitting device package according to the embodiment of the present invention will be described with reference to FIG. 10.

Figure 10:
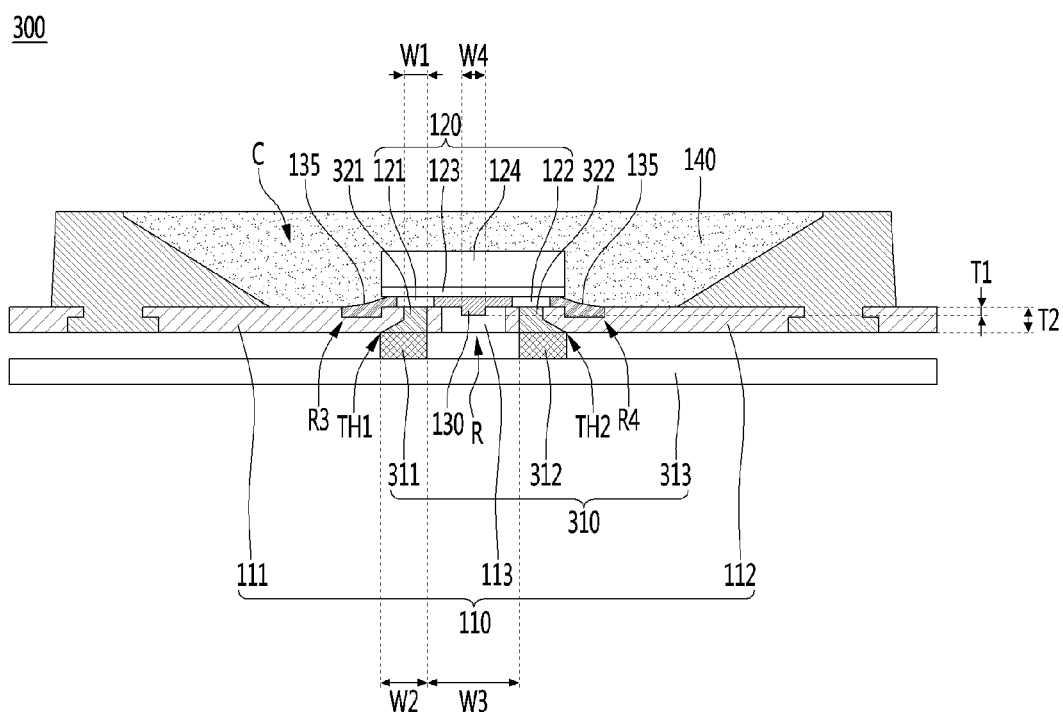
FIG. 10 is a view illustrating still another example of a light emitting device package according to an embodiment of the present invention.

The light emitting device package 300 according to the embodiment of the present invention shown in FIG. 10 is shown as an example in which the light emitting device package described with reference to FIGS. 1 to 9 is mounted on a circuit board 310 and supplied.

In describing the method of fabricating the light emitting device package 300 according to the embodiment of the present invention with reference to FIG. 10, the description overlapping with the contents described with reference to FIGS. 1 to 9 may be omitted.

The light emitting device package 300 according to the embodiment may comprise a circuit board 310, a package body 110, and a light emitting device 120, as shown in FIG. 10.

The circuit board 310 may comprise a first pad 311, a second pad 312, and a support substrate 313. The support substrate 313 may be provided with a power supply circuit configured to control driving of the light emitting device 120.

The package body 110 may be disposed on the circuit board 310. The first pad 311 and the first bonding part 121 may be electrically connected to each other. The second pad 312 and the second bonding part 122 may be electrically connected to each other.

The first pad 311 and the second pad 312 may comprise a conductive material. For example, the first pad 311 and the second pad 312 may comprise one material selected from the group consisting of Ti, Cu, Ni, Au, Cr, Ta, Pt, Sn, Ag, P, Fe, Sn, Zn, and Al or an alloy thereof. The first pad 311 and the second pad 312 may be provided as a single layer or multiple layers.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide a structural strength of the package body 110 and may be electrically connected to the light emitting device 120.

The package body 110 may comprise a first opening TH1 and a second opening TH2 which are passing through in a first direction from an upper surface to a lower surface of the package body 110. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be provided to be smaller than or equal to that of the first bonding part 121. In addition, a width of an upper region of the second opening TH2 may be provided to be smaller than or equal to that of the second bonding part 122.

Therefore, the first bonding part 121 of the light emitting device 120 and the first frame 111 may be more firmly attached. In addition, the second bonding part 122 of the light emitting device 120 and the second frame 112 may be more firmly attached.

In addition, the width W1 of the upper region of the first opening TH1 may be provided to be smaller than or equal to a width W2 of a lower region of the first opening TH1. Further, the width of the upper region of the second opening TH2 may be provided to be smaller than or equal to a width of a lower region of the second opening TH2.

For example, the width W1 of the upper region of the first opening TH1 may be provided at several tens of micrometers to several hundreds of micrometers. Further, the width W2 of the lower region of the first opening TH1 may be provided to be several tens of micrometers to several hundreds of micrometers larger than the width W1 of the upper region of the first opening TH1.

In addition, the width of the upper region of the second opening TH2 may be provided at several tens of micrometers to several hundreds of micrometers. Further, the width of the lower region of the second opening TH2 may be provided to be several tens of micrometers to several hundreds of micrometers larger than the width of the upper region of the second opening TH2.

In addition, the width W2 of the lower region of the first opening TH1 may be provided wider than the width W1 of the upper region of the first opening TH1. The first opening TH1 may be provided with a predetermined width in the upper region at a predetermined depth and may be provided in an inclined shape toward the lower region.

In addition, the width of the lower region of the second opening TH2 may be provided wider than the width of the upper region of the second opening TH2. The second opening TH2 may be provided with a predetermined width in the upper region at a predetermined depth and may be provided in an inclined shape toward the lower region.

For example, the first opening TH1 may be provided in an inclined shape in which a width gradually decreases from the lower region toward the upper region. Further, the second opening TH2 may be provided in an inclined shape in which a width gradually decreases from the lower region toward the upper region.

However, the present invention is not limited thereto, and the inclined surfaces between the upper and lower regions of the first and second openings TH1 and TH2 may have a plurality of inclined surfaces having different slopes, and the inclined surfaces may be disposed with a curvature.

The light emitting device package 300 according to the embodiment may comprise an adhesive 130, as shown in FIG. 10.

The adhesive 130 may be disposed between the package body 110 and the light emitting device 120. The adhesive 130 may be disposed between an upper surface of the package body 110 and a lower surface of the light emitting device 120. The adhesive 130 may be disposed between an upper surface of the body 113 and the lower surface of the light emitting device 120.

In addition, the light emitting device package 300 according to the embodiment may comprise a recess R, as shown in FIG. 10.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

For example, the adhesive 130 may be disposed in the recess R. The adhesive 130 may be disposed between the light emitting device 120 and the body 113. The adhesive 130 may be disposed between the first bonding part 121 and the second bonding part 122. As an example, the adhesive 130 may be disposed to be in contact with a side surface of the first bonding part 121 and a side surface of the second bonding part 122.

In addition, the adhesive 130 may be disposed between the light emitting device 120 and the package body 110. The adhesive 130 may be disposed between the light emitting device 120 and the first frame 111. The adhesive 130 may be disposed between the light emitting device 120 and the second frame 112.

The adhesive 130 may provide a stable fixing force between the light emitting device 120 and the package body 110. The adhesive 130 may provide a stable fixing force between the light emitting device 120 and the body 113. The adhesive 130 may be disposed, to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. Further, as an example, the adhesive 130 may comprise a white silicone.

The adhesive 130 may provide a stable fixing force between the body 113 and the light emitting device 120, when light is emitted to the lower surface of the light emitting device 120, and may provide a light diffusion function between the light emitting device 120 and the body 113. When the light is emitted from the light emitting device 120 to the lower surface of the light emitting device 120, the adhesive 130 may improve the light extraction efficiency of the light emitting device package 300 by providing the light diffusion function.

In addition, the adhesive 130 may reflect the light emitted from the light emitting device 120. When the adhesive 130 comprises the reflection function, the adhesive 130 may be formed of a material comprising $TiO_2$, Silicone, and the like.

In addition, as shown in FIG. 10, the light emitting device package 300 according to the embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first bonding part 121. The width of the first conductive layer 321 may be provided to be smaller than that of the first bonding part 121. A width of an upper region of the first conductive layer 321 may be provided to be smaller than that of the first bonding part 121.

The first bonding part 121 may have a width of a second direction perpendicular to a first direction in which the first opening TH1 is formed. The width of the first bonding part 121 may be provided to be greater than that of the second direction of an upper region of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the first frame 111.

The second conductive layer 322 may be provided at the second opening TH2. The second conductive layer 322 may be disposed under the second bonding part 122. A width of the second conductive layer 322 may be provided to be smaller than that of the second bonding part 122. A width of an upper region of the second conductive layer 322 may be provided to be smaller than that of the second bonding part 122.

The second bonding part 122 may have a width of a second direction perpendicular to the first direction in which the second opening TH2 is formed. The width of the second bonding part 122 may be provided to be greater than that of the second direction of an upper region of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the second frame 112.

The first conductive layer 321 and the second conductive layer 322 may comprise one material selected from the group consisting of Ag, Au, and Pt, or an alloy thereof. However, the present invention is not limited thereto, and a material capable of securing a conductive function may be used in the first conductive layer 321 and the second conductive layer 322.

According to an embodiment, the first pad 311 and the first conductive layer 321 of the circuit board 310 may be electrically connected each other. In addition, the second pad 312 and the second conductive layer 322 of the circuit board 310 may be electrically connected each other.

Meanwhile, according to the embodiment, a separate bonding layer may be additionally provided between the first pad 311 and the first conductive layer 321. In addition, a separate bonding layer may be additionally provided between the second pad 312 and the second conductive layer 322.

In addition, according to another embodiment, the first conductive layer 321 and the second conductive layer 322 may be mounted on the circuit board 310 by eutectic bonding.

The light emitting device package 300 according to the embodiment described with reference to FIG. 10 is configured such that the power supplied from the circuit board 310 is supplied through the first conductive layer 321 and the second conductive layer 322 to the first bonding part 121 and the second bonding part 122, respectively. At this point, the first pad 311 of the circuit board 310 and the first conductive layer 321 are in direct contact with each other and the second pad 312 of the circuit board 310 and the second conductive layer 322 are directly contacted.

Therefore, according to the light emitting device package 300 according to the embodiment shown in FIG. 10, the first frame 111 and the second frame 112 may be formed to have an insulating frame. In addition, according to the light emitting device package 300 according to the embodiment shown in FIG. 10, the first frame 111 and the second frame 112 may be formed to have a conductive frame.

As described above, according to the light emitting device package and the method of fabricating the light emitting device package according to the embodiment, the first bonding part and the second bonding part of the light emitting device according to the embodiment may be provided with driving power by the conductive layers disposed at the openings. In addition, the melting point of the conductive layers disposed in the openings may be selected to have a higher value than that of the general bonding material.

Therefore, since the light emitting device package according to the embodiment does not cause a re-melting phenomenon even when the light emitting device package is bonded to the main substrate by a reflow process, the electrical connection and the physical bonding force may not be deteriorated.

In addition, according to the light emitting device package and the method of fabricating the light emitting device package according to the embodiment, the package body 110 does not need to be exposed to a high temperature in the manufacturing process of the light emitting device package. Therefore, according to the embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Figure 11:
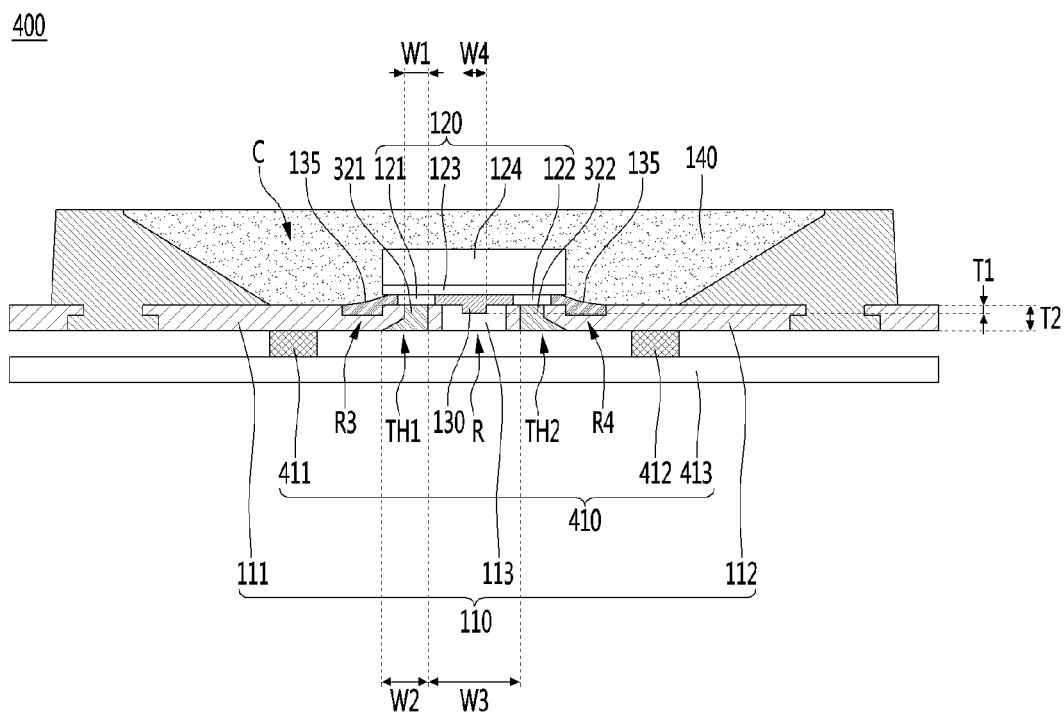
FIG. 11 is a view illustrating still another example of a light emitting device package according to an embodiment of the present invention.

Meanwhile, the light emitting device package 400 according to an embodiment of the present invention shown in FIG. 11 is shown as an example in which the light emitting device package described with reference to FIGS. 1 to 9 is mounted on a circuit board 410 and supplied.

In describing the method of fabricating the light emitting device package 400 according to the embodiment of the present invention with reference to FIG. 11, the description overlapping with the contents described with reference to FIGS. 1 to 10 may be omitted.

The light emitting device package 400 according to the embodiment may comprise a circuit board 410, a package body 110, and a light emitting device 120, as shown in FIG. 11.

The circuit board 410 may comprise a first pad 411, a second pad 412, and a support substrate 413. The support substrate 413 may be provided with a power supply circuit configured to control driving of the light emitting device 120.

The package body 110 may be disposed on the circuit board 410. The first pad 411 and the first bonding part 121 may be electrically connected to each other. The second pad 412 and the second bonding part 122 may be electrically connected to each other.

The first pad 411 and the second pad 412 may comprise a conductive material. For example, the first pad 411 and the second pad 412 may comprise one material selected from the group consisting of Ti, Cu, Ni, Au, Cr, Ta, Pt, Sn, Ag, P, Fe, Sn, Zn, and Al or an alloy thereof. The first pad 411 and the second pad 412 may be provided as a single layer or multiple layers.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

In addition, the first frame 111 and the second frame 112 may be provided as a conductive frame. The first frame 111 and the second frame 112 may stably provide a structural strength of the package body 110 and may be electrically connected to the light emitting device 120.

The package body 110 may comprise a first opening TH1 and a second opening TH2 which are passing through in a first direction from an upper surface to a lower surface of the package body 110. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be provided to be smaller than or equal to that of the first bonding part 121. In addition, a width of an upper region of the second opening TH2 may be provided to be smaller than or equal to that of the second bonding part 122.

Therefore, the first bonding part 121 of the light emitting device 120 and the first frame 111 may be more firmly attached. In addition, the second bonding part 122 of the light emitting device 120 and the second frame 112 may be more firmly attached.

In addition, the width W1 of the upper region of the first opening TH1 may be provided to be smaller than or equal to a width W2 of a lower region of the first opening TH1. Further, the width of the upper region of the second opening TH2 may be provided to be smaller than or equal to a width of a lower region of the second opening TH2.

For example, the width W1 of the upper region of the first opening TH1 may be provided at several tens of micrometers to several hundreds of micrometers. Further, the width W2 of the lower region of the first opening TH1 may be provided to be several tens of micrometers to several hundreds of micrometers larger than the width W1 of the upper region of the first opening TH1.

In addition, the width of the upper region of the second opening TH2 may be provided at several tens of micrometers to several hundreds of micrometers. Further, the width of the lower region of the second opening TH2 may be provided to be several tens of micrometers to several hundreds of micrometers larger than the width of the upper region of the second opening TH2.

In addition, the width W2 of the lower region of the first opening TH1 may be provided wider than the width W1 of the upper region of the first opening TH1. The first opening TH1 may be provided with a predetermined width in the upper region at a predetermined depth and may be provided in an inclined shape toward the lower region.

In addition, the width of the lower region of the second opening TH2 may be provided wider than the width of the upper region of the second opening TH2. The second opening TH2 may be provided with a predetermined width in the upper region at a predetermined depth and may be provided in an inclined shape toward the lower region.

For example, the first opening TH1 may be provided in an inclined shape in which a width gradually decreases from the lower region toward the upper region. Further, the second opening TH2 may be provided in an inclined shape in which a width gradually decreases from the lower region toward the upper region.

However, the present invention is not limited thereto, and the inclined surfaces between the upper and lower regions of the first and second openings TH1 and TH2 may have a plurality of inclined surfaces having different slopes, and the inclined surfaces may be disposed with a curvature.

The light emitting device package 400 according to the embodiment may comprise an adhesive 130, as shown in FIG. 11.

The adhesive 130 may be disposed between the package body 110 and the light emitting device 120. The adhesive 130 may be disposed between an upper surface of the package body 110 and a lower surface of the light emitting device 120. The adhesive 130 may be disposed between an upper surface of the body 113 and the lower surface of the light emitting device 120.

In addition, the light emitting device package 400 according to the embodiment may comprise a recess R, as shown in FIG. 11.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

For example, the adhesive 130 may be disposed in the recess R. The adhesive 130 may be disposed between the light emitting device 120 and the body 113. The adhesive 130 may be disposed between the first bonding part 121 and the second bonding part 122. As an example, the adhesive 130 may be disposed to be in contact with a side surface of the first bonding part 121 and a side surface of the second bonding part 122.

In addition, the adhesive 130 may be disposed between the light emitting device 120 and the package body 110. The adhesive 130 may be disposed between the light emitting device 120 and the first frame 111. The adhesive 130 may be disposed between the light emitting device 120 and the second frame 112.

The adhesive 130 may provide a stable fixing force between the light emitting device 120 and the package body 110. The adhesive 130 may provide a stable fixing force between the light emitting device 120 and the body 113. The adhesive 130 may be disposed, to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. Further, as an example, the adhesive 130 may comprise a white silicone.

The adhesive 130 may provide a stable fixing force between the body 113 and the light emitting device 120, when light is emitted to the lower surface of the light emitting device 120, and may provide a light diffusion function between the light emitting device 120 and the body 113. When the light is emitted from the light emitting device 120 to the lower surface of the light emitting device 120, the adhesive 130 may improve the light extraction efficiency of the light emitting device package 400 by providing the light diffusion function.

In addition, the adhesive 130 may reflect the light emitted from the light emitting device 120. When the adhesive 130 comprises the reflection function, the adhesive 130 may be formed of a material comprising $TiO_2$, Silicone, and the like.

In addition, as shown in FIG. 11, the light emitting device package 400 according to the embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first bonding part 121. The width of the first conductive layer 321 may be provided to be smaller than that of the first bonding part 121. A width of an upper region of the first conductive layer 321 may be provided to be smaller than that of the first bonding part 121.

The first bonding part 121 may have a width of a second direction perpendicular to a first direction in which the first opening TH1 is formed. The width of the first bonding part 121 may be provided to be greater than that of the second direction of an upper region of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the first frame 111.

The second conductive layer 322 may be provided at the second opening TH2. The second conductive layer 322 may be disposed under the second bonding part 122. A width of the second conductive layer 322 may be provided to be smaller than that of the second bonding part 122. A width of an upper region of the second conductive layer 322 may be provided to be smaller than that of the second bonding part 122.

The second bonding part 122 may have a width of a second direction perpendicular to the first direction in which the second opening TH2 is formed. The width of the second bonding part 122 may be provided to be greater than that of the second direction of an upper region of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the second frame 112.

The first conductive layer 321 and the second conductive layer 322 may comprise one material selected from the group consisting of Ag, Au, and Pt, or an alloy thereof. However, the present invention is not limited thereto, and a material capable of securing a conductive function may be used in the first conductive layer 321 and the second conductive layer 322.

According to an embodiment, the first pad 411 and the first conductive layer 321 of the circuit board 410 may be electrically connected each other. In addition, the second pad 412 and the second conductive layer 322 of the circuit board 410 may be electrically connected each other.

The first pad 411 may be electrically connected to the first frame 111. In addition, the second pad 412 may be electrically connected to the second frame 112.

Meanwhile, according to the embodiment, a separate bonding layer may be additionally provided between the first pad 411 and the first frame 111. In addition, a separate bonding layer may be additionally provided between the second pad 412 and the second frame 112.

The light emitting device package 400 according to the embodiment described with reference to FIG. 11 is configured such that the power supplied from the circuit board 410 is supplied through the first conductive layer 321 and the second conductive layer 322 to the first bonding part 121 and the second bonding part 122, respectively. At this point, the first pad 411 of the circuit board 410 and the first frame 111 are in direct contact with each other and the second pad 412 of the circuit board 410 and the second frame 112 are directly contacted.

As described above, according to the light emitting device package and the method of fabricating the light emitting device package according to the embodiment, the first bonding part and the second bonding part of the light emitting device according to the embodiment may be provided with driving power by the conductive layers disposed at the openings. In addition, the melting point of the conductive layers disposed in the openings may be selected to have a higher value than that of the general bonding material.

Therefore, since the light emitting device package according to the embodiment does not cause a re-melting phenomenon even when the light emitting device package is bonded to the main substrate by a reflow process, the electrical connection and the physical bonding force may not be deteriorated.

In addition, according to the light emitting device package and the method of fabricating the light emitting device package according to the embodiment, the package body 110 does not need to be exposed to a high temperature in the manufacturing process of the light emitting device package. Therefore, according to the embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Meanwhile, in the case of the light emitting device package according to the embodiment described above, the light emitting device package is explained based on the case in which one opening is provided under each bonding part.

However, according to a light emitting device package according to another embodiment, a plurality of openings may be provided under each bonding part. Further, the plurality of openings may be provided as openings having different widths or the same width.

In addition, according to the light emitting device package according to the embodiment described above, the package body 110 comprises only the support member in which an upper surface is flat, and may not be provided with a reflective part disposed to be inclined.

As another representation, according to the light emitting device package according to the embodiment, the package body 110 may be provided with a structure in which the cavity C is provided. Further, the package body 110 may be provided with a structure in which an upper surface is flat without providing the cavity C.

In addition, according to the light emitting device package according to the embodiment described above, although it is described based on the case in which the first and second openings TH1 and TH2 are provided at the first and second frames 111 and 112 of the package body 110, the first and second openings TH1 and TH2 may be provided at the body 113 of the package body 110.

When the first and second openings TH1 and TH2 are provided at the body 113 of the package body 110 as described above, a length of the upper surface of the body 113 according to the major axis direction of the light emitting device 120 may be provided to be greater than a length between the first bonding part 121 and the second bonding part 122 of the light emitting device 120.

In addition, when the first and second openings TH1 and TH2 are provided at the body 113 of the package body 110, the light emitting device package according to the embodiment may not comprise the first and second frames 111 and 112.

Next, another example of the light emitting device package according to the embodiment of the present invention will be described with reference to FIG. 12.

In describing the light emitting device package according to the embodiment of with reference to FIG. 12, the description of the contents overlapping with the contents described with reference to FIGS. 1 to 11 may be omitted.

Figure 12:
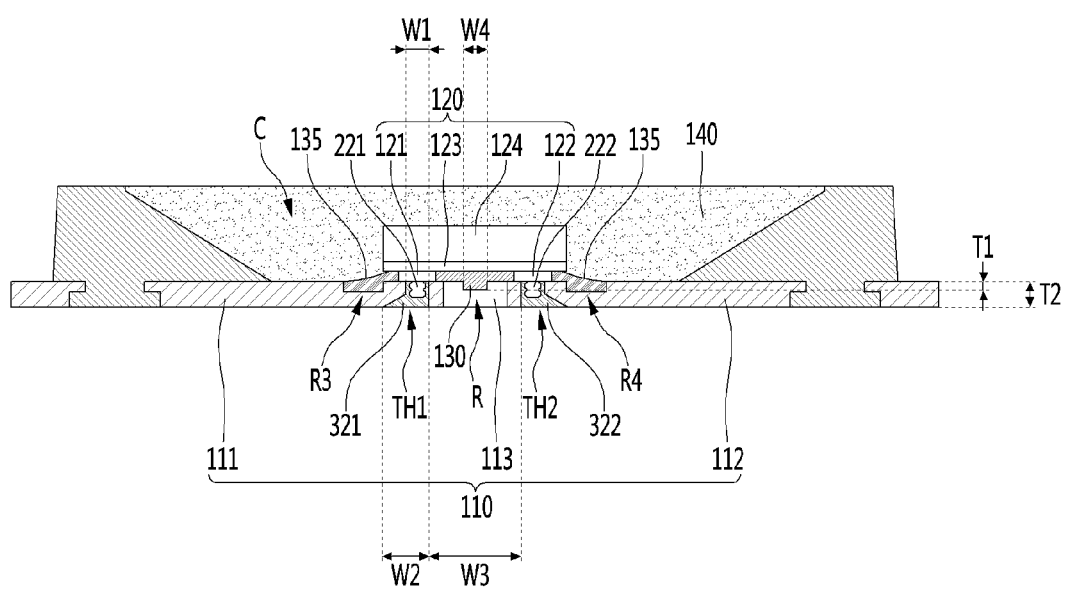
FIG. 12 is a view illustrating still another example of a light emitting device package according to an embodiment of the present invention.

The light emitting device package according to the embodiment may comprise a package body 110 and a light emitting device 120, as shown in FIG. 12.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

The body 113 may be disposed on the first frame 111. In addition, the body 113 may be disposed on the second frame 112.

The body 113 may provide an inclined surface on the first frame 111 and the second frame 112. A cavity C may be provided on the first frame 111 and the second frame 112 by the inclined surface of the body 113.

According to the embodiment, the package body 110 may be provided as a structure with the cavity C, or may be provided as a structure with a flat upper surface without the cavity C.

For example, the body 113 may be formed of at least one selected from the group consisting of polyphthalamide (PPA), polychloro tri phenyl (PCT), liquid xcrystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ or $SiO_2$.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 12. The first bonding part 121 and the second bonding part 122 may be disposed between the light emitting structure 123 and the body 113.

The light emitting structure 123 may comprise a first conductive type semiconductor layer, a second conductive type semiconductor layer, and an active layer disposed between the first conductive type semiconductor layer and the second conductive type semiconductor layer. The first bonding part 121 may be electrically connected to the first conductive type semiconductor layer. In addition, the second bonding part 122 may be electrically connected to the second conductive type semiconductor layer.

The light emitting device 120 may be disposed on the package body 110. The light emitting device 120 may be disposed on the first frame 111 and the second frame 112. The light emitting device 120 may be disposed in the cavity C provided by the package body 110.

The package body 110 may comprise a first opening TH1 and a second opening TH2 which are passing through in a first direction from an upper surface to a lower surface of the package body 110. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

Figure 21:
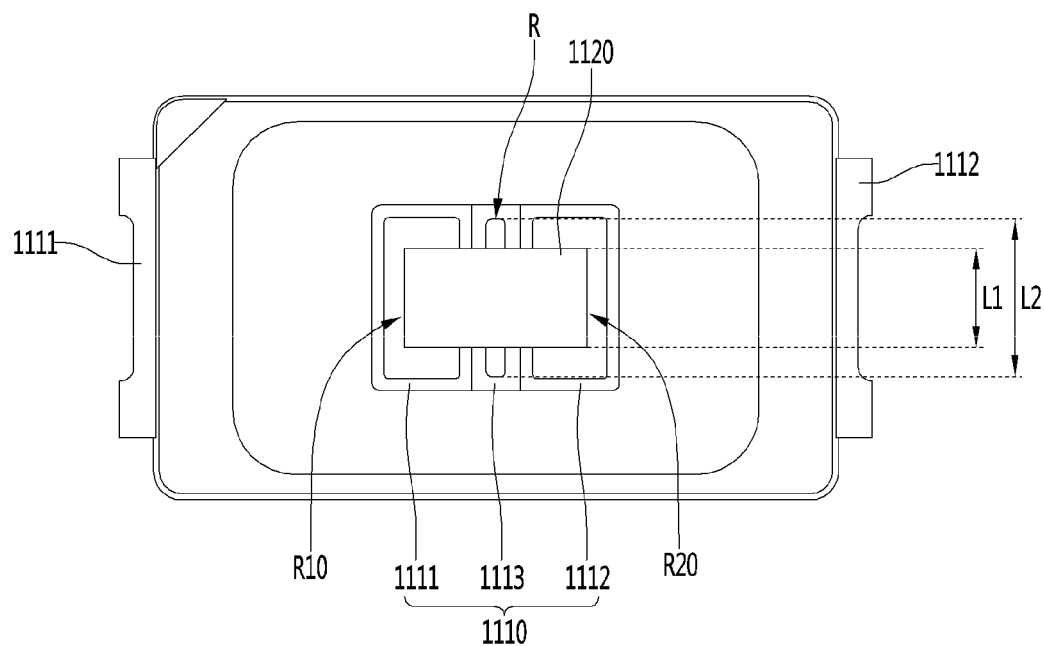

According to the embodiment, a size of the first and second bonding parts 121 and 122 of the light emitting device 120 may be disposed to be smaller than that of the light emitting device 120 shown in FIG. 21 in order to improve light extraction efficiency. The width W1 of the upper region of the first opening TH1 may be provided to be smaller than or equal to that of the first pad electrode 121. Further, the width of the upper region of the second opening TH2 may be provided to be smaller than or equal to that of the second pad electrode 122.

In addition, the width W1 of the upper region of the first opening TH1 may be provided to be smaller than or equal to a width W2 of a lower region of the first opening TH1. Further, the width of the upper region of the second opening TH2 may be provided to be smaller than or equal to a width of a lower region of the second opening TH2.

For example, the width W1 of the upper region of the first opening TH1 may be provided at several tens of micrometers to several hundreds of micrometers. Further, the width W2 of the lower region of the first opening TH1 may be provided to be several tens of micrometers to several hundreds of micrometers larger than the width W1 of the upper region of the first opening TH1.

In addition, the width of the upper region of the second opening TH2 may be provided at several tens of micrometers to several hundreds of micrometers. Further, the width of the lower region of the second opening TH2 may be provided to be several tens of micrometers to several hundreds of micrometers larger than the width of the upper region of the second opening TH2.

In addition, the width W2 of the lower region of the first opening TH1 may be provided wider than the width W1 of the upper region of the first opening TH1. The first opening TH1 may be provided with a predetermined width in the upper region at a predetermined depth and may be provided in an inclined shape toward the lower region.

In addition, the width of the lower region of the second opening TH2 may be provided wider than the width of the upper region of the second opening TH2. The second opening TH2 may be provided with a predetermined width in the upper region at a predetermined depth and may be provided in an inclined shape toward the lower region.

For example, the first opening TH1 may be provided in an inclined shape in which a width gradually decreases from the lower region toward the upper region. Further, the second opening TH2 may be provided in an inclined shape in which a width gradually decreases from the lower region toward the upper region.

However, the present invention is not limited thereto, and the inclined surfaces between the upper and lower regions of the first and second openings TH1 and TH2 may have a plurality of inclined surfaces having different slopes, and the inclined surfaces may be disposed with a curvature.

A light emitting device package according to the embodiment, as shown in FIG. 12, may comprise a first conductor 221 and a second conductor 222. In addition, the light emitting device package according to the embodiment may comprise the first conductive layer 321 and the second conductive layer 322. The first conductive layer 321 may be disposed to be spaced apart from the second conductive layer 322.

The first conductor 221 may be disposed under the first bonding part 121. The first conductor 221 may be electrically connected to the first bonding part 121. The first conductor 221 may be disposed to be overlapped with the first bonding part 121 in the first direction.

The first conductor 221 may be provided at the first opening TH1. The first conductor 221 may be disposed between the first bonding part 121 and the first conductive layer 321. The first conductor 221 may be electrically connected to the first bonding part 121 and the first conductive layer 321.

A lower surface of the first conductor 221 may be disposed to be lower than an upper surface of the first opening TH1. The lower surface of the first conductor 221 may be disposed to be lower than an upper surface of the first conductive layer 321.

The first conductor 221 may be disposed on the first opening TH1. In addition, the first conductor 221 may be disposed to extend from the first bonding part 121 to an inside of the first opening TH1.

In addition, the second conductor 222 may be disposed under the second bonding part 122. The second conductor 222 may be electrically connected to the second bonding part 122. The second conductor 222 may be disposed to be overlapped with the second bonding part 122 in the first direction.

The second conductor 222 may be provided at the second opening TH2. The second conductor 222 may be disposed between the second bonding part 122 and the second conductive layer 322. The second conductor 222 may be electrically connected to the second bonding part 122 and the second conductive layer 322.

A lower surface of the second conductor 222 may be disposed to be lower than an upper surface of the second opening TH2. The lower surface of the second conductor 222 may be disposed to be lower than an upper surface of the second conductive layer 322.

The second conductor 222 may be disposed on the second opening TH2. In addition, the second conductor 222 may be disposed to extend from the second bonding part 122 to an inside of the second opening TH2.

According to the embodiment, the first conductive layer 321 may be disposed on a lower surface and side surface of the first conductor 221. The first conductive layer 321 may be disposed to be in direct contact with the lower and side surface of the first conductor 221.

The first conductive layer 321 may be provided at the first opening TH1. The first conductive layer 321 may be disposed under the first bonding part 121. The width of the first conductive layer 321 may be provided to be greater than that of the first bonding part 121.

As described above, according to the light emitting device package according to the embodiment, an electrical connection between the first conductive layer 321 and the first bonding part 121 may be more stably provided by the first conductor 221.

In addition, according to the embodiment, the second conductive layer 322 may be disposed on a lower and side surface of the second conductor 222. The second conductive layer 322 may be disposed to be in direct contact with the lower and side surface of the second conductor 222.

The second conductive layer 322 may be provided at the second opening TH2. The second conductive layer 322 may be disposed under the second bonding part 122. The width of the second conductive layer 322 may be provided to be greater than that of the second bonding part 122.

As described above, according to the light emitting device package 200 according to the embodiment, an electrical connection between the second conductive layer 322 and the second bonding part 122 may be more stably provided by the second conductor 222.

For example, the first and second conductors 221 and 222 may be stably bonded to the first and second bonding parts 121 and 122 via separate bonding materials, respectively. In addition, side surfaces and lower surfaces of the first and second conductors 221 and 222 may be in contact with the first and second conductive layers 321 and 322, respectively.

Therefore, an area in which the first and second conductive layers 321 and 322 are respectively in contact with the first and second conductors 221 and 222 may be further increased as compared with a case in which the first and second conductive layers 321 and 322 are directly contacted to the lower surfaces of the first and second bonding parts 121 and 122, respectively.

Accordingly, a power may be stably provided from the first and second conductive layers 321 and 322 to the first and second bonding parts 121 and 122 via the first and second conductors 221 and 222.

The first conductive layer 321 and the second conductive layer 322 may comprise at least one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof.

In addition, the first and second conductors 221 and 222 may comprise at least one material selected from the group consisting of Ag, Au, Pt, Sn, Al, etc. or an alloy thereof. However, the present invention is not limited thereto, and a material capable of securing a conductive function may be used for the first and second conductors 221 and 222.

The light emitting device package according to the embodiment may comprise an adhesive 130.

The adhesive 130 may be disposed between the package body 110 and the light emitting device 120. The adhesive 130 may be disposed between an upper surface of the package body 110 and a lower surface of the light emitting device 120. The adhesive 130 may be disposed between an upper surface of the body 113 and the lower surface of the light emitting device 120.

In addition, the light emitting device package according to the embodiment may comprise a recess R, as shown in FIG. 12.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

For example, the adhesive 130 may be disposed in the recess R. The adhesive 130 may be disposed between the light emitting device 120 and the body 113. The adhesive 130 may be disposed between the first bonding part 121 and the second bonding part 122. As an example, the adhesive 130 may be disposed to be in contact with a side surface of the first bonding part 121 and a side surface of the second bonding part 122.

In addition, the adhesive 130 may be disposed between the light emitting device 120 and the package body 110. The adhesive 130 may be disposed between the light emitting device 120 and the first frame 111. The adhesive 130 may be disposed between the light emitting device 120 and the second frame 112.

The adhesive 130 may provide a stable fixing force between the light emitting device 120 and the package body 110. The adhesive 130 may provide a stable fixing force between the light emitting device 120 and the body 113. The adhesive 130 may be disposed, to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. Further, as an example, when the adhesive 130 comprises a reflective function, the adhesive 130 may comprise a white silicone.

The adhesive 130 may provide a stable fixing force between the body 113 and the light emitting device 120, when light is emitted to the lower surface of the light emitting device 120, and may provide a light diffusion function between the light emitting device 120 and the body 113. When the light is emitted from the light emitting device 120 to the lower surface of the light emitting device 120, the adhesive 130 may improve the light extraction efficiency of the light emitting device package by providing the light diffusion function.

In addition, the adhesive 130 may reflect the light emitted from the light emitting device 120. When the adhesive 130 comprises the reflection function, the adhesive 130 may be formed of a material comprising $TiO_2$, Silicone, and the like.

According to the embodiment, a depth T1 of the recess R may be provided to be smaller than a depth T2 of the first opening TH1 or a depth T2 of the second opening TH2.

The depth T1 of the recess R may be determined in consideration of adhesion force of the adhesive 130. In addition, the depth T1 of the recess R may be determined by considering stable strength of the body 113 and/or not to occur a crack in the light emitting device package due to heat emitted from the light emitting device 120.

The recess R may provide a proper space in which a kind of under-filling process may be performed at a lower portion of the light emitting device 120. Here, the under-filling process may be a process of mounting the light emitting device 120 on the package body 110 and then disposing the adhesive 130 at the lower portion of the light emitting device 120, and may be a process of disposing the adhesive 130 in the recess R and then disposing the light emitting device 120 in order to mount by the adhesive 130 in the process of mounting the light emitting device 120 on to the package body 110.

The depth T1 and a width W4 of the recess R may affect a forming position and fixing force of the adhesive 130. The depth T1 and the width W4 of the recess R may be determined so that a fixing force may be sufficiently provided by the adhesive 130 disposed between the body 113 and the light emitting device 120.

As an example, the depth T1 of the recess R may be provided at several tens of micrometers. The depth T1 of the recess R may be provided at 40 to 60 micrometers.

In addition, the width W4 of the recess R may be provided at several tens of micrometers to several hundreds of micrometers. Here, the width W4 of the recess R may be provided in the major axis direction of the light emitting device 120.

The width W4 of the recess R may be provided to be narrower than a gap between the first bonding part 121 and the second bonding part 122. The width W4 of the recess R may be provided to be several hundreds of micrometers greater than the width or diameter of the first and second bonding parts 121 and 122. As an example, the width W4 of the recess R may be provided at 300 to 400 micrometers.

The depth T2 of the first opening TH1 may be provided to correspond to a thickness of the first frame 111. The depth T2 of the first opening TH1 may be provided at a thickness capable of maintaining a stable strength of the first frame 111.

The depth T2 of the second opening TH2 may be provided to correspond to a thickness of the second frame 112. The depth T2 of the second opening TH2 may be provided at a thickness capable of maintaining a stable strength of the second frame 112.

The depth T2 of the first opening TH1 and the depth T2 of the second opening TH2 may be provided to correspond to a thickness of the body 113. The depth T2 of the first opening TH1 and the depth T2 of the second opening TH2 may be provided at a thickness capable of maintaining a stable strength of the body 113.

As an example, the depth T2 of the first opening TH1 may be provided at several hundreds of micrometers. The depth T2 of the first opening TH1 may be provided at 180 to 220 micrometers. As an example, the depth T2 of the first opening TH1 may be provided at 200 micrometers.

As an example, a thickness of T2−T1 may be selected to be at least 100 micrometers or more. This is in consideration of a thickness of an injection process capable of providing crack free of the body 113.

According to the embodiment, a ratio (T2/T1) of the thickness T2 to the thickness T1 may be provided at two to ten. As an example, when the thickness of T2 is provided at 200 micrometers, the thickness of T1 may be provided at 20 to 100 micrometers.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, a sum of areas of the first and second bonding parts 121 and 122 may be provided at 0.7% or more based on an area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

Further, according to the light emitting device package according to the embodiment, the sum of the areas of the first and second bonding parts 121 and 122 may be set at 0.7% or more based on the area of the upper surface of the substrate 124 so that the first conductor 221 and the second conductor 222 may be disposed in a stable manner.

According to the embodiment, an area in which the adhesive 130 is overlapped with the light emitting device 120 based on the first direction may be provided to be greater than that of a region in which the first and second openings TH1 and TH2 are overlapped with the first and second bonding parts 121 and 122.

As described above, as the area of the first and second bonding parts 121 and 122 is provided to be small, an amount of light transmitted to the lower surface of the light emitting device 120 may be increased. In addition, the adhesive 130 having a good reflective characteristic may be provided under the light emitting device 120. Therefore, the light emitted in a lower direction of the light emitting device 120 is reflected at the adhesive 130, and is effectively emitted toward an upper direction of the light emitting device package 100, so that the light extraction efficiency may be improved.

In addition, the light emitting device package according to the embodiment may comprise a molding part 140, as shown in FIG. 12.

The molding part 140 may be provided on the light emitting device 120. The molding part 140 may be disposed on the first frame 111 and the second frame 112. The molding part 140 may be disposed on the cavity C provided by the package body 110.

The molding part 140 may comprise an insulating material. In addition, the molding part 140 may comprise a wavelength converting part configured to be incident light emitted from the light emitting device 120 and providing wavelength converted light. As an example, the molding part 140 may comprise at least one selected from the group consisting of a phosphor, a quantum dot, and the like.

In addition, the light emitting device package according to the embodiment may comprise a first upper recess R3 and a second upper recess R4, as shown in FIG. 12.

The first upper recess R3 may be provided on an upper surface of the first frame 111. The first upper recess R3 may be provided to concave in the lower surface direction from the upper surface of the first frame 111. The first upper recess R3 may be disposed to be spaced apart from the first opening TH1.

The second upper recess R4 may be provided on the upper surface of the second frame 112. The second upper recess R4 may be provided to concave in the lower surface direction from the upper surface of the second frame 112. The second upper recess R4 may be disposed to be spaced apart from the second opening TH2.

For example, the first upper recess R3 and the second upper recess R4 may be provided with a width of several tens of micrometers to several hundreds of micrometers.

In addition, the light emitting device package according to the embodiment may comprise a resin portion 135, as shown in FIG. 12.

The resin portion 135 may be disposed between the first frame 111 and the light emitting device 120. The resin portion 135 may be disposed between the second frame 112 and the light emitting device 120. The resin portion 135 may be provided at the bottom surface of the cavity C provided in the package body 110.

The resin portion 135 may be provided at the first upper recess R3 and the second upper recess R4.

The resin portion 135 may be disposed on the side surface of the first bonding part 121. The resin portion 135 may be provided at the first upper recess R3, and may be provided to be extended to a region in which the first bonding part 121 is disposed. The resin portion 135 may be disposed under the light emitting structure 123.

In addition, the resin portion 135 may be disposed on the side surface of the second bonding part 122. The resin portion 135 may be provided at the second upper recesses R4, and may be provided to be extended to a region in which the second bonding part 122 is disposed. The resin portion 135 may be disposed under the light emitting structure 123.

In addition, in the light emitting device package according to an embodiment, when viewed from the upper direction thereof, a partial region of the first upper recess R3 may be overlapped with a partial region of the light emitting structure 123 in the vertical direction. As an example, a side surface region of the first upper recess R3 adjacent to the first bonding part 121 may be provided to be extended under the light emitting structure 123.

In addition, in the light emitting device package according to an embodiment, when viewed from the upper direction thereof, a partial region of the second upper recess R4 may be overlapped with a partial region of the light emitting structure 123 in the vertical direction. As an example, a side surface region of the second upper recess R4 adjacent to the second bonding part 122 may be provided to be extended under the light emitting structure 123.

In addition, the first upper recess R3 and the second upper recess R4 may provide a sufficient space in which the resin portion 135 may be provided under the light emitting device 120. The first upper recess R3 and the second upper recess R4 may provide a proper space in which a kind of underfilling process may be performed at the lower portion of the light emitting device 120.

Accordingly, the resin portion 135 filled at the first upper recess R3 and the second upper recess R4 may effectively seal a periphery of the first bonding part 121 and the second bonding part 122.

As an example, the resin portion 135 may comprise at least one of an epoxy-based material, a silicone-based material, and a hybrid material comprising an epoxy-based material and a silicone-based material. In addition, the resin portion 135 may be a reflective part that reflects light emitted from the light emitting device 120, as an example, a resin containing a reflective material such as $TiO_2$, or may comprise a white silicone.

The resin portion 135 may be disposed under the light emitting device 120 and may perform a sealing function. In addition, the resin portion 135 may improve adhesion force between the light emitting device 120 and the first frame 111. The resin portion 135 may improve adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from the first opening TH1 region and the second opening TH2 region, and diffusing and moving in direction of an outer side surface of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, according to the embodiment, a protective layer may be provided at the lower surface and the periphery of the light emitting device 120. In such a case, since an insulating protective layer is provided at the surface of the active layer, even when the first and second conductive layers 321 and 322 are diffused and moved in the outer side surface direction of the light emitting device 120, it is possible to prevent the first and second conductive layers 321 and 322 from being electrically connected to the active layer of the light emitting device 120.

Meanwhile, in the case in which an insulating protective layer is disposed at the lower surface and the periphery of the light emitting device 120, an insulating protective layer may not be disposed on the upper side surface of the light emitting device 120 or the periphery of the substrate 124. At this point, when the substrate 124 is provided with a conductive material, when the first and second conductive layers 321 and 322 come into contact with the upper side surface of the light emitting device 120 or the substrate 124, a failure due to a short-circuit may occur. Therefore, when the resin portion 135 is disposed, it is possible to prevent a short-circuit due to the first and second conductive layers 321 and 322 and the upper side surface of the light emitting device 120 or the substrate 124, thereby improving reliability of the light emitting device package according to the embodiment.

In addition, when the resin portion 135 comprises a material having a reflective characteristic such as white silicone, the resin portion 135 may reflect light emitted from the light emitting device 120 toward an upper direction of the package body 110, thereby improving the light extraction efficiency of the light emitting device package.

Meanwhile, according to another example of the light emitting device package according to the embodiment of the present invention, the resin portion 135 may not be provided separately, and the molding part 140 may be disposed to be in direct contact with the first frame 111 and the second frame 112.

In the light emitting device package according to the embodiment, power may be connected to the first bonding part 121 through the first opening TH1, and power may be connected to the second bonding part 122 through the second opening TH2.

Accordingly, the light emitting device 120 may be driven by the driving power supplied through the first bonding part 121 and the second bonding part 122. In addition, light emitted from the light emitting device 120 may be provided in the upper direction of the package body 110.

Meanwhile, the light emitting device package according to the embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided at the light emitting device package, so that stability of electrical connection and physical coupling may be weakened.

However, according to the light emitting device package and a method of fabricating the light emitting device package according to the embodiment, the first bonding part and the second bonding part of the light emitting device according to the embodiment may be provided with driving power by the conductive layers disposed at the openings. In addition, the melting point of the conductive layers disposed in the openings may be selected to have a higher value than that of the general bonding material.

Therefore, since the light emitting device package according to the embodiment does not cause a re-melting phenomenon even when the light emitting device package is bonded to the main substrate by a reflow process, the electrical connection and the physical bonding force may not be deteriorated.

In addition, according to the light emitting device package and the method of fabricating the light emitting device package according to the embodiment, the package body 110 does not need to be exposed to a high temperature in the manufacturing process of the light emitting device package. Therefore, according to the embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, a sum of areas of the first and second bonding parts 121 and 122 may be provided at 0.7% or more based on an area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

Further, according to the light emitting device package according to the embodiment, the sum of the areas of the first and second bonding parts 121 and 122 may be set at 0.7% or more based on the area of the upper surface of the substrate 124 so that the first conductor 221 and the second conductor 222 may be disposed in a stable manner.

According to the embodiment, an area in which the adhesive 130 is overlapped with the light emitting device 120 based on the first direction may be provided to be greater than that of a region in which the first and second openings TH1 and TH2 are overlapped with the first and second bonding parts 121 and 122.

As described above, as the area of the first and second bonding parts 121 and 122 is provided to be small, an amount of light transmitted to the lower surface of the light emitting device 120 may be increased. In addition, the adhesive 130 having a good reflective characteristic may be provided under the light emitting device 120. Therefore, the light emitted in a lower direction of the light emitting device 120 is reflected at the adhesive 130, and is effectively emitted toward an upper direction of the light emitting device package 100, so that the light extraction efficiency may be improved.

Next, another example of the light emitting device package according to an embodiment of the present invention will be described with reference to FIG. 13.

In describing the light emitting device package according to the embodiment of with reference to FIG. 13, the description of the contents overlapping with the contents described with reference to FIGS. 1 to 12 may be omitted.

The light emitting device package according to the embodiment may comprise a package body 110 and a light emitting device 120.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

The body 113 may be disposed on the first frame 111. In addition, the body 113 may be disposed on the second frame 112.

The body 113 may provide an inclined surface on the first frame 111 and the second frame 112. A cavity C may be provided on the first frame 111 and the second frame 112 by the inclined surface of the body 113.

According to the embodiment, the package body 110 may be provided as a structure with the cavity C, or may be provided as a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ or $SiO_2$.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide a structural strength of the package body 110 and may be electrically connected to the light emitting device 120.

According to the embodiment, the light emitting device 120 may comprise a first bonding part 121, a second bonding part 122, a light emitting structure 123, and a substrate 124.

Figure 13:
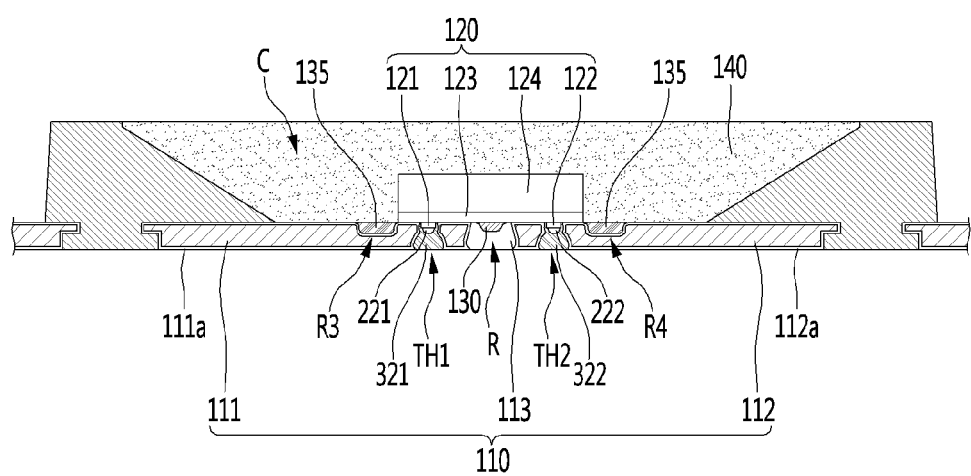
FIG. 13 is a view illustrating still another example of a light emitting device package according to an embodiment of the present invention.
Figure 14:
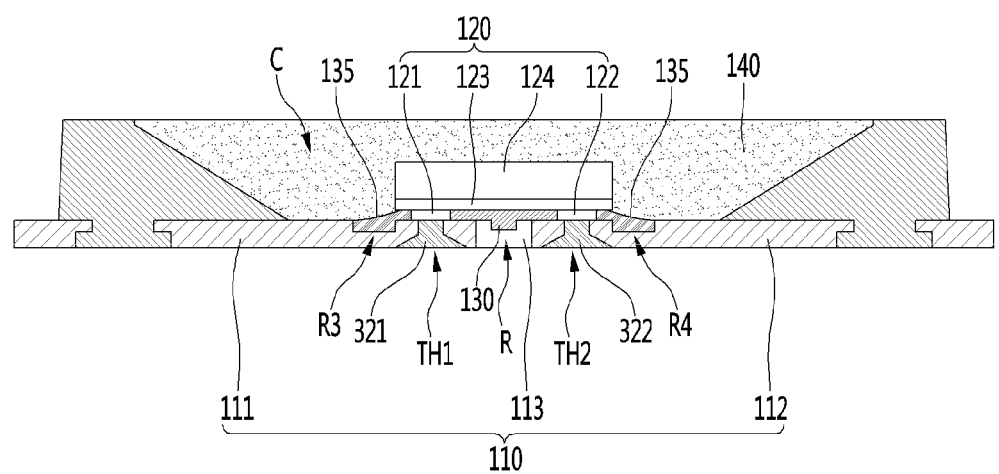
FIG. 14 is a view illustrating still another example of a light emitting device package according to an embodiment of the present invention.

The light emitting device 120 may comprise the light emitting structure 123 disposed under the substrate 124, as shown in FIG. 13. The first bonding part 121 and the second bonding part 122 may be disposed between the light emitting structure 123 and the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

Meanwhile, the light emitting device package according to the embodiment may comprise a first opening TH1 and a second opening TH2, as shown in FIG. 13. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first bonding part 121 of the light emitting device 120. The first opening TH1 may be provided to be overlapped with the first bonding part 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second bonding part 122 of the light emitting device 120. The second opening TH2 may be provided to be overlapped with the second bonding part 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

In the process of forming the first and second openings TH1 and TH2, the light emitting device package shown in FIG. 13 shows a case in which etching is performed in the direction of upper and lower surfaces of the first and second lead frames 111 and 112, respectively.

As the etching progresses in the direction of the upper and lower surfaces of the first and second lead frames 111 and 112, the shapes of the first and second openings TH1 and TH2 may be provided as a kind of a snowman shape.

The widths of the first and second openings TH1 and TH2 may gradually increase from the lower region to the middle region and then decrease again. Further, the width may gradually increase from the middle region in which the width is reduced to the upper region, and then decrease again.

The first and second openings TH1 and TH2 may comprise a first region on the upper surfaces of each of the first and second frames 111 and 112, and a second region on lower surfaces of each of the first and second frames 111 and 112. The width of the upper surface of the first region may be provided to be smaller than that of the lower surface of the second region.

In addition, the width of the lower region of the first opening TH1 may be provided wider than that of the upper region of the first opening TH1. The first opening TH1 may comprise a first region provided at the upper region at a predetermined width with a predetermined depth, and a second region provided in an inclined shape to the lower region. In addition, the first region and the second region may be formed in a circular shape in which a side surface has a curvature, and the width of the upper surface of the first region may be narrower than that of the second region. The portion in which the first region and the second region are in contact with each other may have a bent portion.

Further, according to the embodiment, the etching process for forming the first and second openings TH1 and TH2 is completed, and then the plating process for the first and second frames 111 and 112 may be performed. Accordingly, the first and second plating layers 111a and 112a may be formed at the surfaces of the first and second frames 111 and 112, respectively.

The first and second plating layers 111a and 112a may be provided at the upper and lower surfaces of the first and second frames 111 and 112, respectively. Further, the first and second plating layers 111a and 112a may be provided at a boundary region which is in contact with the first and second openings TH1 and TH2.

As an example, the first and second frames 111 and 112 may be provided with a Cu layer as a basic support member. In addition, the first and second plating layers 111a and 112a may comprise at least one of Ni layer, Ag layer, and the like.

When the first and second plating layers 111a and 112a comprise an Ni layer, since the change with respect to the thermal expansion of the Ni layer is small, even when a size or arrangement position of the package body is changed by thermal expansion, a position of the light emitting device disposed on an upper portion may be stably fixed by the Ni layer. When the first and second plating layers 111a and 112a comprise an Ag layer, the Ag layer may efficiently reflect light emitted from the light emitting device disposed on an upper portion and improve light intensity.

According to the embodiment, when the size of the first and second bonding parts 121 and 122 of the light emitting device 120 may be disposed to be small to improve light extraction efficiency, the width of the upper region of the first opening TH1 may be provided to be greater than or equal to that of the first bonding part 121. Further, the width of the upper region of the second opening TH2 may be provided to be greater than or equal to that of the second bonding part 122.

In addition, the width of the upper region of the first opening TH1 may be provided to be smaller than or equal to a width of a lower region of the first opening TH1. Further, the width of the upper region of the second opening TH2 may be provided to be smaller than or equal to a width of a lower region of the second opening TH2.

For example, the width of the upper region of the first opening TH1 may be provided at several tens of micrometers to several hundreds of micrometers. Further, the width of the lower region of the first opening TH1 may be provided to be several tens of micrometers to several hundreds of micrometers larger than the width of the upper region of the first opening TH1.

In addition, the width of the upper region of the second opening TH2 may be provided at several tens of micrometers to several hundreds of micrometers. Further, the width of the lower region of the second opening TH2 may be provided to be several tens of micrometers to several hundreds of micrometers larger than the width of the upper region of the second opening TH2.

In addition, the width of the lower region of the first opening TH1 may be provided wider than the width of the upper region of the first opening TH1. The first opening TH1 may be provided with a predetermined width in the upper region at a predetermined depth and may be provided in an inclined shape toward the lower region.

In addition, the width of the lower region of the second opening TH2 may be provided wider than the width of the upper region of the second opening TH2. The second opening TH2 may be provided with a predetermined width in the upper region at a predetermined depth and may be provided in an inclined shape toward the lower region.

For example, the first opening TH1 may be provided in an inclined shape in which a width gradually decreases from the lower region toward the upper region. Further, the second opening TH2 may be provided in an inclined shape in which a width gradually decreases from the lower region toward the upper region.

However, the present invention is not limited thereto, and the inclined surfaces between the upper and lower regions of the first and second openings TH1 and TH2 may have a plurality of inclined surfaces having different slopes, and the inclined surfaces may be disposed with a curvature.

As shown in FIG. 13, in the light emitting device package according to the embodiment, when the areas of the first and second bonding parts 121 and 122 are small, the first and second bonding parts 121 and 122 may be disposed in the first and second openings TH1 and TH2.

At this point, since the areas of the first and second bonding parts 121 and 122 are small, it is difficult to secure the adhesion between the first and second conductive layers 321 and 322 and the first and second bonding parts 121 and 122. Therefore, the light emitting device package according to the embodiment may comprise the first conductor 221 and the second conductor 222 to further secure an area in which the first and second conductive layers 321 and 322 are in contact with the first and second bonding parts 121 and 122.

In addition, the light emitting device package according to the embodiment may comprise a first conductive layer 321 and a second conductive layer 322. The first conductive layer 321 may be disposed to be spaced apart from the second conductive layer 322.

The first conductor 221 may be disposed under the first bonding part 121. The first conductor 221 may be electrically connected to the first bonding part 121. The first conductor 221 may be disposed to be overlapped with the first bonding part 121 in the first direction.

The first conductor 221 may be provided at the first opening TH1. The first conductor 221 may be disposed between the first bonding part 121 and the first conductive layer 321. The first conductor 221 may be electrically connected to the first bonding part 121 and the first conductive layer 321.

A lower surface of the first conductor 221 may be disposed to be lower than an upper surface of the first opening TH1. The lower surface of the first conductor 221 may be disposed to be lower than an upper surface of the first conductive layer 321.

The first conductor 221 may be disposed on the first opening TH1. In addition, the first conductor 221 may be disposed to extend from the first bonding part 121 to an inside of the first opening TH1.

In addition, the second conductor 222 may be disposed under the second bonding part 122. The second conductor 222 may be electrically connected to the second bonding part 122. The second conductor 222 may be disposed to be overlapped with the second bonding part 122 in the first direction.

The second conductor 222 may be provided at the second opening TH2. The second conductor 222 may be disposed between the second bonding part 122 and the second conductive layer 322. The second conductor 222 may be electrically connected to the second bonding part 122 and the second conductive layer 322.

A lower surface of the second conductor 222 may be disposed to be lower than an upper surface of the second opening TH2. The lower surface of the second conductor 222 may be disposed to be lower than an upper surface of the second conductive layer 322.

The second conductor 222 may be disposed on the second opening TH2. In addition, the second conductor 222 may be disposed to extend from the second bonding part 122 to an inside of the second opening TH2.

According to the embodiment, the first conductive layer 321 may be disposed on a lower surface and side surface of the first conductor 221. The first conductive layer 321 may be disposed to be in direct contact with the lower and side surface of the first conductor 221.

The first conductive layer 321 may be provided at the first opening TH1. The first conductive layer 321 may be disposed under the first bonding part 121. The width of the first conductive layer 321 may be provided to be greater than that of the first bonding part 121.

As described above, according to the light emitting device package according to the embodiment, an electrical connection between the first conductive layer 321 and the first bonding part 121 may be more stably provided by the first conductor 221.

In addition, according to the embodiment, the second conductive layer 322 may be disposed on a lower and side surface of the second conductor 222. The second conductive layer 322 may be disposed to be in direct contact with the lower and side surface of the second conductor 222.

The second conductive layer 322 may be provided at the second opening TH2. The second conductive layer 322 may be disposed under the second bonding part 122. The width of the second conductive layer 322 may be provided to be greater than that of the second bonding part 122.

As described above, according to the light emitting device package according to the embodiment, an electrical connection between the second conductive layer 322 and the second bonding part 122 may be more stably provided by the second conductor 222.

For example, the first and second conductors 221 and 222 may be stably bonded to the first and second bonding parts 121 and 122 via separate bonding materials, respectively. In addition, side surfaces and lower surfaces of the first and second conductors 221 and 222 may be in contact with the first and second conductive layers 321 and 322, respectively.

Therefore, an area in which the first and second conductive layers 321 and 322 are respectively in contact with the first and second conductors 221 and 222 may be further increased as compared with a case in which the first and second conductive layers 321 and 322 are directly contacted to the lower surfaces of the first and second bonding parts 121 and 122, respectively.

Accordingly, a power may be stably provided from the first and second conductive layers 321 and 322 to the first and second bonding parts 121 and 122 via the first and second conductors 221 and 222.

The first conductive layer 321 and the second conductive layer 322 may comprise at least one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof.

In addition, the first and second conductors 221, 222 may comprise at least one material selected from the group consisting of Ag, Au, Pt, Sn, Al, etc. or an alloy thereof. However, the present invention is not limited thereto, and a material capable of securing a conductive function may be used for the first and second conductors 221 and 222.

The light emitting device package according to the embodiment may comprise an adhesive 130.

The adhesive 130 may be disposed between the package body 110 and the light emitting device 120. The adhesive 130 may be disposed between an upper surface of the package body 110 and a lower surface of the light emitting device 120. The adhesive 130 may be disposed between an upper surface of the body 113 and the lower surface of the light emitting device 120.

In addition, the light emitting device package according to the embodiment may comprise a recess R, as shown in FIG. 13.

The recess R may be provided at the body 113. The recess R may be provided between the first opening TH1 and the second opening TH2. The recess R may be provided to concave from the upper surface of the body 113 toward the lower surface thereof. The recess R may be disposed under the light emitting device 120. The recess R may be provided to be overlapped with the light emitting device 120 in the first direction.

A side surface of the recess R may have an inclined surfaces and a curvature. Further, the recess R may be formed in a spherical shape, and a side surface thereof may be formed in a circular shape.

As an example, the adhesive 130 may be disposed at the recess R. The adhesive 130 may be disposed between the light emitting device 120 and the body 113. The adhesive 130 may be disposed between the first bonding part 121 and the second bonding part 122. In addition, the adhesive 130 may be disposed to be diffused in a direction in which the first bonding part 121 and the second bonding part 122 are disposed from the recess R. For example, the adhesive 130 may be disposed to be in contact with the side surface of the first bonding part 121 and the side surface of the second bonding part 122.

In addition, the adhesive 130 may be disposed between the light emitting device 120 and the package body 110. The adhesive 130 may be disposed between the light emitting device 120 and the first frame 111. The adhesive 130 may be disposed between the light emitting device 120 and the second frame 112.

The adhesive 130 may provide a stable fixing force between the light emitting device 120 and the package body 110. The adhesive 130 may provide a stable fixing force between the light emitting device 120 and the body 113. The adhesive 130 may be disposed, to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. Further, as an example, when the adhesive 130 comprises a reflective function, the adhesive 130 may comprise a white silicone.

The adhesive 130 may provide a stable fixing force between the body 113 and the light emitting device 120, when light is emitted to the lower surface of the light emitting device 120, and may provide a light diffusion function between the light emitting device 120 and the body 113. When the light is emitted from the light emitting device 120 to the lower surface of the light emitting device 120, the adhesive 130 may improve the light extraction efficiency of the light emitting device package by providing the light diffusion function.

In addition, the adhesive 130 may reflect the light emitted from the light emitting device 120. When the adhesive 130 comprises the reflection function, the adhesive 130 may be formed of a material comprising $TiO_2$, Silicone, and the like.

The recess R may provide a proper space in which a kind of under-filling process may be performed at a lower portion of the light emitting device 120. Here, the under-filling process may be a process of mounting the light emitting device 120 on the package body 110 and then disposing the adhesive 130 at the lower portion of the light emitting device 120, and may be a process of disposing the adhesive 130 in the recess R and then disposing the light emitting device 120 in order to mount by the adhesive 130 in the process of mounting the light emitting device 120 on to the package body 110.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, a sum of areas of the first and second bonding parts 121 and 122 may be provided at 0.7% or more based on an area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

Further, according to the light emitting device package according to the embodiment, the sum of the areas of the first and second bonding parts 121 and 122 may be set at 0.7% or more based on the area of the upper surface of the substrate 124 so that the first conductor 221 and the second conductor 222 may be disposed in a stable manner.

According to the embodiment, an area in which the adhesive 130 is overlapped with the light emitting device 120 based on the first direction may be provided to be greater than that of a region in which the first and second openings TH1 and TH2 are overlapped with the first and second bonding parts 121 and 122.

As described above, as the area of the first and second bonding parts 121 and 122 is provided to be small, an amount of light transmitted to the lower surface of the light emitting device 120 may be increased. In addition, the adhesive 130 having a good reflective characteristic may be provided under the light emitting device 120. Therefore, the light emitted in a lower direction of the light emitting device 120 is reflected at the adhesive 130, and is effectively emitted toward an upper direction of the light emitting device package 100, so that the light extraction efficiency may be improved.

In addition, the light emitting device package according to the embodiment may comprise a molding part 140, as shown in FIG. 13.

The molding part 140 may be provided on the light emitting device 120. The molding part 140 may be disposed on the first frame 111 and the second frame 112. The molding part 140 may be disposed on the cavity C provided by the package body 110.

The molding part 140 may comprise an insulating material. In addition, the molding part 140 may comprise a wavelength converting part configured to be incident light emitted from the light emitting device 120 and providing wavelength converted light. As an example, the molding part 140 may comprise at least one selected from the group consisting of a phosphor, a quantum dot, and the like.

In addition, the light emitting device package according to the embodiment may comprise a first upper recess R3 and a second upper recess R4, as shown in FIG. 13.

The first upper recess R3 may be provided on an upper surface of the first frame 111. The first upper recess R3 may be provided to concave in the lower surface direction from the upper surface of the first frame 111. The first upper recess R3 may be disposed to be spaced apart from the first opening TH1. For example, an end portion of the first upper recess R3 may have a rounded shape.

The second upper recess R4 may be provided on the upper surface of the second frame 112. The second upper recess R4 may be provided to concave in the lower surface direction from the upper surface of the second frame 112. The second upper recess R4 may be disposed to be spaced apart from the second opening TH2. For example, an end portion of the second upper recess R4 may have a rounded shape.

For example, the first upper recess R3 and the second upper recess R4 may be provided with a width of several tens of micrometers to several hundreds of micrometers.

In addition, the light emitting device package according to the embodiment may comprise a resin portion 135, as shown in FIG. 13.

The resin portion 135 may be disposed between the first frame 111 and the light emitting device 120. The resin portion 135 may be disposed between the second frame 112 and the light emitting device 120. The resin portion 135 may be provided at the bottom surface of the cavity C provided in the package body 110.

The resin portion 135 may be provided at the first upper recess R3 and the second upper recess R4.

The resin portion 135 may be provided at the first upper recess R3 and provided to be diffused to a region in which the first bonding part 121 is disposed. The resin portion 135 may be disposed under the light emitting structure 123. The resin portion 135 may be disposed to be extended at the side surface of the first bonding part 121.

In addition, the resin portion 135 may be provided at the second upper recess R4 and provided to be diffused to a region in which the second bonding part 122 is disposed. The resin portion 135 may be disposed under the light emitting structure 123. The resin portion 135 may be disposed to be extended at the side surface of the second bonding part 122.

In addition, in the light emitting device package according to an embodiment, when viewed from the upper direction thereof, a partial region of the first upper recess R3 may be overlapped with a partial region of the light emitting structure 123 in the vertical direction. As an example, a side surface region of the first upper recess R3 adjacent to the first bonding part 121 may be provided to be extended under the light emitting structure 123.

In addition, in the light emitting device package according to an embodiment, when viewed from the upper direction thereof, a partial region of the second upper recess R4 may be overlapped with a partial region of the light emitting structure 123 in the vertical direction. As an example, a side surface region of the second upper recess R4 adjacent to the second bonding part 122 may be provided to be extended under the light emitting structure 123.

In addition, the first upper recess R3 and the second upper recess R4 may provide a sufficient space in which the resin portion 135 may be provided under the light emitting device 120. The first upper recess R3 and the second upper recess R4 may provide a proper space in which a kind of underfilling process may be performed at the lower portion of the light emitting device 120.

Accordingly, the resin portion 135 filled at the first upper recess R3 and the second upper recess R4 may effectively seal a periphery of the first bonding part 121 and the second bonding part 122.

As an example, the resin portion 135 may comprise at least one of an epoxy-based material, a silicone-based material, and a hybrid material comprising an epoxy-based material and a silicone-based material. In addition, the resin portion 135 may be a reflective part that reflects light emitted from the light emitting device 120, as an example, a resin containing a reflective material such as $TiO_2$, or may comprise a white silicone.

The resin portion 135 may be disposed under the light emitting device 120 and may perform a sealing function. In addition, the resin portion 135 may improve adhesion force between the light emitting device 120 and the first frame 111. The resin portion 135 may improve adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from the first opening TH1 region and the second opening TH2 region, and diffusing and moving in direction of an outer side surface of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, according to the embodiment, a protective layer may be provided at the lower surface and the periphery of the light emitting device 120. In such a case, since an insulating protective layer is provided at the surface of the active layer, even when the first and second conductive layers 321 and 322 are diffused and moved in the outer side surface direction of the light emitting device 120, it is possible to prevent the first and second conductive layers 321 and 322 from being electrically connected to the active layer of the light emitting device 120.

Meanwhile, in the case in which an insulating protective layer is disposed at the lower surface and the periphery of the light emitting device 120, an insulating protective layer may not be disposed on the upper side surface of the light emitting device 120 or the periphery of the substrate 124. At this point, when the substrate 124 is provided with a conductive material, when the first and second conductive layers 321 and 322 come into contact with the upper side surface of the light emitting device 120 or the substrate 124, a failure due to a short-circuit may occur. Therefore, when the resin portion 135 is disposed, it is possible to prevent a short-circuit due to the first and second conductive layers 321 and 322 and the upper side surface of the light emitting device 120 or the substrate 124, thereby improving reliability of the light emitting device package according to the embodiment.

In addition, when the resin portion 135 comprises a material having a reflective characteristic such as white silicone, the resin portion 135 may reflect light emitted from the light emitting device 120 toward an upper direction of the package body 110, thereby improving the light extraction efficiency of the light emitting device package.

Meanwhile, according to another example of the light emitting device package according to the embodiment of the present invention, the resin portion 135 may not be provided separately, and the molding part 140 may be disposed to be in direct contact with the first frame 111 and the second frame 112.

In the light emitting device package according to the embodiment, power may be connected to the first bonding part 121 through the first opening TH1, and power may be connected to the second bonding part 122 through the second opening TH2.

Accordingly, the light emitting device 120 may be driven by the driving power supplied through the first bonding part 121 and the second bonding part 122. In addition, light emitted from the light emitting device 120 may be provided in the upper direction of the package body 110.

Meanwhile, the light emitting device package according to the embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided at the light emitting device package, so that stability of electrical connection and physical coupling may be weakened.

However, according to the light emitting device package and a method of fabricating the light emitting device package according to the embodiment, the first bonding part and the second bonding part of the light emitting device according to the embodiment may be provided with driving power by the conductive layers disposed at the openings. In addition, the melting point of the conductive layers disposed in the openings may be selected to have a higher value than that of the general bonding material.

Therefore, since the light emitting device package according to the embodiment does not cause a re-melting phenomenon even when the light emitting device package is bonded to the main substrate by a reflow process, the electrical connection and the physical bonding force may not be deteriorated.

In addition, according to the light emitting device package and the method of fabricating the light emitting device package according to the embodiment, the package body 110 does not need to be exposed to a high temperature in the manufacturing process of the light emitting device package. Therefore, according to the embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, a sum of areas of the first and second bonding parts 121 and 122 may be provided at 0.7% or more based on an area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

Further, according to the light emitting device package according to the embodiment, the sum of the areas of the first and second bonding parts 121 and 122 may be set at 0.7% or more based on the area of the upper surface of the substrate 124 so that the first conductor 221 and the second conductor 222 may be disposed in a stable manner.

According to the embodiment, an area in which the adhesive 130 is overlapped with the light emitting device 120 based on the first direction may be provided to be greater than that of a region in which the first and second openings TH1 and TH2 are overlapped with the first and second bonding parts 121 and 122.

As described above, as the area of the first and second bonding parts 121 and 122 is provided to be small, an amount of light transmitted to the lower surface of the light emitting device 120 may be increased. In addition, the adhesive 130 having a good reflective characteristic may be provided under the light emitting device 120. Therefore, the light emitted in a lower direction of the light emitting device 120 is reflected at the adhesive 130, and is effectively emitted toward an upper direction of the light emitting device package 100, so that the light extraction efficiency may be improved.

Next, another example of the light emitting device package according to an embodiment of the present invention will be described with reference to FIGS. 15 to 19.

In describing the light emitting device package according to the embodiment of with reference to FIGS. 15 to 19, the description of the contents overlapping with the contents described with reference to FIGS. 1 to 14 may be omitted.

The light emitting device package 1100 according to the embodiment may comprise a package body 1110 and a light emitting device 1120, as shown in FIGS. 15 to 19.

The package body 1110 may comprise a first frame 1111 and a second frame 1112. The first frame 1111 and the second frame 1112 may be disposed to be spaced apart from each other.

The package body 1110 may comprise a body 1113. The body 1113 may be disposed between the first frame 1111 and the second frame 1112. The body 1113 may perform a function as a kind of electrode separation line. The body 1113 may also be referred to as an insulating member.

The body 1113 may be disposed on the first frame 1111. In addition, the body 1113 may be disposed on the second frame 1112.

The body 1113 may provide an inclined surface on the first frame 1111 and the second frame 1112. A cavity C may be provided on the first frame 1111 and the second frame 1112 by the inclined surface of the body 1113.

According to the embodiment, the package body 1110 may be provided as a structure with the cavity C, or may be provided as a structure with a flat upper surface without the cavity C.

For example, the body 1113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 1113 may comprise a high refractive index filler such as $TiO_2$ or $SiO_2$.

The first frame 1111 and the second frame 1112 may be provided as a conductive frame. The first frame 1111 and the second frame 1112 may stably provide a structural strength of the package body 1110 and may be electrically connected to the light emitting device 1120.

According to the embodiment, the light emitting device 1120 may comprise a first bonding part 1121, a second bonding part 1122, a light emitting structure 1123, and a substrate 1124.

Figure 17:
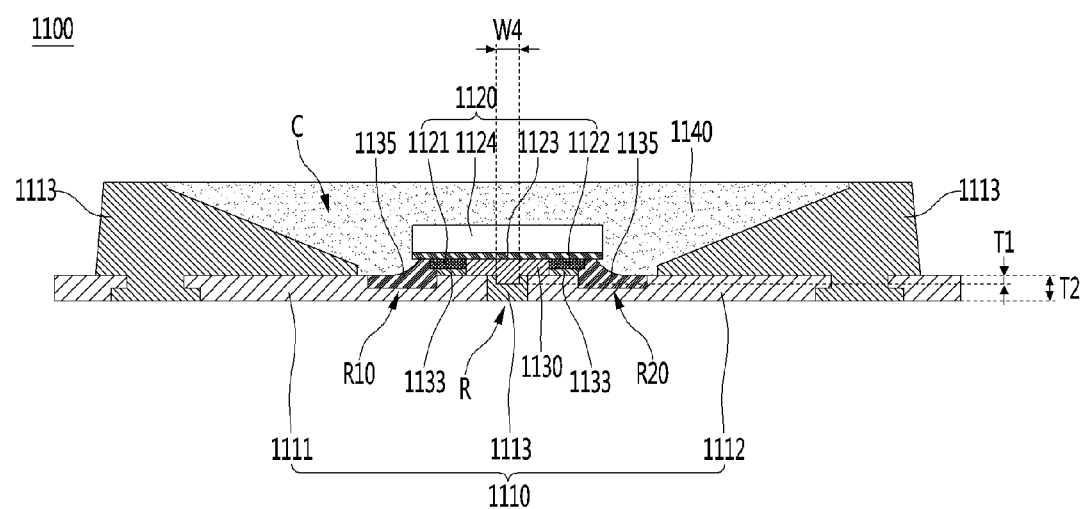
FIG. 17 is a cross-sectional view taken along line F-F of the light emitting device package shown in FIG. 15.

The light emitting device 1120 may comprise the light emitting structure 1123 disposed under the substrate 1124, as shown in FIG. 17. The first bonding part 1121 and the second bonding part 1122 may be disposed between the light emitting structure 1123 and the package body 1110.

The light emitting device 1120 may be disposed on the package body 1110. The light emitting device 1120 may be disposed on the first frame 1111 and the second frame 1112. The light emitting device 1120 may be disposed in the cavity C provided by the package body 1110. The light emitting device 120 may be disposed on the body 1113.

The first bonding part 1121 may be disposed on a lower surface of the light emitting device 1120. The second bonding part 1122 may be disposed on the lower surface of the light emitting device 1120. The first bonding part 1121 and the second bonding part 1122 may be disposed to be spaced apart from each other on the lower surface of the light emitting device 1120.

The first bonding part 1121 may be disposed on the first frame 1111. The second bonding part 1122 may be disposed on the second frame 1112.

The first bonding part 1121 may be disposed between the light emitting structure 1123 and the first frame 1111. The second bonding part 1122 may be disposed between the light emitting structure 1123 and the second frame 1112.

The first bonding part 1121 and the second bonding part 1122 may be formed in a single layer of multiple layers by using at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, and Ni/IrOx/Au, Ni/IrOx/Au/ITO, or an alloy thereof.

The light emitting device package 1100 according to the embodiment may comprise a first adhesive 1130, as shown in FIG. 17.

The first adhesive 1130 may be disposed between the body 1113 and the light emitting device 1120. The first adhesive 1130 may be disposed between an upper surface of the body 1113 and a lower surface of the light emitting device 1120.

The first adhesive 1130 may be disposed to be overlapped with the light emitting device 1120 in the first direction. The first adhesive 1130 may be disposed to be overlapped with the light emitting device 1120 based on a direction from the lower surface of the body 1113 toward the upper surface thereof.

In addition, the light emitting device package 1100 according to the embodiment may comprise a recess R, as shown in FIGS. 15 to 19.

The recess R may be provided at the body 1113. The recess R may be provided to concave in a first direction from the upper surface of the body 1113 toward the lower surface thereof. The recess R may be disposed under the light emitting device 1120. The recess R may be provided to be overlapped with the light emitting device 1120 in the first direction.

The recess R may be disposed between the first bonding part 1121 and the second bonding part 1122. The recess R may be provided not to be overlapped with the first bonding part 1121 in the first direction. The recess R may be provided not to be overlapped with the second bonding part 1122 in the first direction.

As an example, the first adhesive 1130 may be disposed at the recess R. The first adhesive 1130 may be disposed between the light emitting device 1120 and the body 1113. The first adhesive 1130 may be disposed between the first bonding part 1121 and the second bonding part 1122. As an example, the first adhesive 1130 may be disposed to be in contact with a side surface of the first bonding part 1121 and a side surface of the second pad electrode 1122.

The first adhesive 1130 may provide a stable fixing force between the light emitting device 1120 and the package body 1110. The first adhesive 1130 may provide a stable fixing force between the light emitting device 1120 and the body 1113. The first adhesive 1130 may be disposed to be in direct contact with the upper surface of the body 1113, as an example. In addition, the first adhesive 1130 may be disposed in direct contact with the lower surface of the light emitting device 1120.

The first adhesive 1130 may be provided as an insulating adhesive. As an example, the first adhesive 1130 may comprise at least one of an epoxy-based material, a silicone-based material, and a hybrid material comprising an epoxy-based material and a silicone-based material. Further, as an example, when the first adhesive 1130 comprises a reflective function, the adhesive 130 may comprise a white silicone.

The first adhesive 1130 may provide a stable fixing force between the body 1113 and the light emitting device 1120, when light is emitted to the lower surface of the light emitting device 1120, and may provide a light diffusion function between the light emitting device 1120 and the body 1113. When the light is emitted from the light emitting device 1120 to the lower surface of the light emitting device 1120, the first adhesive 1130 may improve the light extraction efficiency of the light emitting device package 1100 by providing the light diffusion function. In addition, the first adhesive 1130 may reflect the light emitted from the light emitting device 1120. When the first adhesive 1130 comprises the reflection function, the first adhesive 1130 may be formed of a material comprising $TiO_2$, Silicone, and the like.

According to the embodiment, a depth T1 of the recess R may be provided to be smaller than a thickness T2 of the first frame 1111 or a thickness T2 of the second frame 1112.

The depth T1 of the recess R may be determined in consideration of adhesion force of the first adhesive 1130. In addition, the depth T1 of the recess R may be determined by considering stable strength of the body 1113 and/or not to occur a crack in the light emitting device package 1100 due to heat emitted from the light emitting device 1120.

The recess R may provide a proper space in which a kind of under-filling process may be performed at a lower portion of the light emitting device 1120. Here, the under-filling process may be a process of mounting the light emitting device 1120 on the package body 1110 and then disposing the first adhesive 1130 at the lower portion of the light emitting device 1120, and may be a process of disposing the first adhesive 1130 in the recess R and then disposing the light emitting device 1120 in order to mount by the first adhesive 1130 in the process of mounting the light emitting device 1120 on to the package body 1110.

The recess R may be provided on a first depth or more so that the first adhesive 1130 may be sufficiently provided between the lower surface of the light emitting device 1120 and the upper surface of the body 1113. In addition, the recess R may be provided at a second depth or less to provide a stable strength of the body 1113.

The depth T1 and a width W4 of the recess R may affect a forming position and fixing force of the first adhesive 1130. The depth T1 and the width W4 of the recess R may be determined so that a fixing force may be sufficiently provided by the first adhesive 1130 disposed between the body 1113 and the light emitting device 1120.

As an example, the thickness T2 of the first frame 1111 may be provided at several hundreds of micrometers. The thickness T2 of the first frame 1111 may be provided at 180 to 500 micrometers. As an example, the thickness T2 of the first frame 1111 may be provided at 500 micrometers.

As an example, a thickness of T2-T1 may be selected to be at least 100 micrometers or more. This is in consideration of a thickness of an injection process capable of providing crack free of the body 1113.

According to the embodiment, a ratio (T2/T1) of the thickness T2 to the thickness T1 may be provided at two to ten. As an example, when the thickness of T2 is provided at 200 micrometers, the thickness of T1 may be provided at 20 to 100 micrometers. When the ratio (T2/T1) of the thickness of T1 and the thickness of T2 is two or more, a mechanical strength may be secured so that cracks not occur or not broken in the body 1113. In addition, when the ratio (T2/T1) of the thickness of Ti and the thickness of T2 is ten or less, an amount of the first adhesive 1130 disposed in the recess R may be sufficiently arranged, therefore the fixing force between the light emitting device 1120 and the package body 1110 may be improved.

Meanwhile, the light emitting device package 1100 according to the embodiment may comprise a second adhesive 1133, as shown in FIGS. 17 and 18.

The second adhesive 1133 may be disposed between the first frame 1111 and the light emitting device 1120. In addition, the second adhesive 1133 may be disposed between the second frame 1112 and the light emitting device 1120.

The second adhesive 1133 may be disposed between an upper surface of the package body 1110 and a lower surface of the light emitting device 1120. The second adhesive 1133 may be disposed to be in direct contact with the upper surface of the package body 1110. The second adhesive 1133 may be disposed to be in direct contact with the lower surface of the light emitting device 1120.

The second adhesive 1133 may be disposed to be in direct contact with the lower surface of the first bonding part 1121. Further, the second adhesive 1133 may be disposed to be in direct contact with the lower surface of second the bonding part 1122.

The second adhesive 1133 may be provided as a conductive adhesive, as an example. The first frame 1111 and the first bonding part 1121 may be electrically connected by the second adhesive 1133. The second frame 1112 and the second bonding part 1122 may be electrically connected by the second adhesive 1133.

As an example, the second conductor 1222 may comprise at least one material selected from the group consisting of Ag, Au, Pt, etc. or an alloy thereof. However, the present invention is not limited thereto, and a material capable of securing a conductive function may be used for second conductor 1222.

As an example, the second adhesive 1133 may be formed by using a conductive paste. The conductive paste may be selected from the group consisting of solder paste, silver paste and the like.

According to the embodiment, the first adhesive 1130 and the second adhesive 1133 may comprise different materials. As an example, the first adhesive 1130 may be provided as an insulating adhesive, and the second adhesive 1133 may be provided as a conductive adhesive.

In addition, the light emitting device package according to the embodiment may comprise a first upper recess R10 and a second upper recess R20, as shown in FIGS. 15 to 19.

The first upper recess R10 may be provided at an upper surface of the first frame 1111. The first upper recess R10 may be provided to concave in the lower surface direction from the upper surface of the first frame 1111. The first upper recess R10 may be disposed to be spaced apart from the recess R.

The first upper recess R10 may be overlapped with a partial region of the first bonding part 1121 in a first direction based on a direction from the lower surface of the first frame 1111 toward the upper surface thereof. The first upper recess R10 may be overlapped with a partial region of the light emitting structure 1123 based on the first direction.

The first upper recess R10, as shown in FIG. 18, when viewed from the upper direction of the light emitting device 1120, may comprise the outer side surface of the package body 1110, an inner side surface of the package body, and an extension side surface connecting an outer side surface and an inner side surface thereof and disposed in parallel with a direction in which the recess R is extended. The inner side surface may be provided to be extended in an inward direction from three side surfaces of the first bonding part 1121. Further, the outer side surface of the first upper recess R10 may be provided at two sides facing each other of a minor axis direction of the package body 1110 and an outer peripheral region of the major axis direction. For example, the first upper recess R10 may have three outer side surfaces, three inner side surfaces, and two extension side surfaces, and may be provided at the periphery of the first bonding part 1121 in a "[" shape.

In addition, the first upper recess R10, as shown in FIG. 18, when viewed from the upper direction of the light emitting device 1120, may be provided such that the inner side surface of the package body 1110 is adjacent to three sides of the second adhesive 1133. Further, the outer side surface of the first upper recess R10 may be provided at two sides facing each other of a minor axis direction of the package body 1110 and an outer peripheral region of the major axis direction. For example, the first upper recess R10 may have three outer side surfaces, three inner side surfaces, and two extension side surfaces, and may be provided at the periphery of the second adhesive 1133 in a "[" shape.

The first frame 1111 may comprise a first region disposed to be extended in the direction in which the first upper recess R10 is provided along the major axis direction of the light emitting device 1120 from a region in which the body 1113 is disposed. As an example, the second adhesive 1133 may be disposed on the first region of the first frame 1111. The second adhesive 1133 may be disposed to be overlapped with the first bonding part 1121 based on the first direction.

According to the embodiment, the first region may be provided as a flat surface. The first region may be corresponded to an area defined by the three inner sides.

In the light emitting device package according to the embodiment, as shown in FIG. 18, when viewed from the upper direction of the light emitting device 1120, a partial region of the first upper recess R10 may be overlapped with the light emitting structure 1123 in a vertical direction. As an example, three inner side surface regions of the first upper recess R10 adjacent to the first bonding part 1121 may be provided to be extended under the light emitting structure 1123. The first upper recess R10 may be disposed to be overlapped with the first bonding part 1121 in the vertical direction.

According to the embodiment, the second upper recess R20 may be provided on an upper surface of the second frame 1112. The second upper recess R20 may be provided to concave in the lower surface direction from the upper surface of the second frame 1112. The second upper recess R20 may be disposed to be spaced apart from the recess R. The second upper recess R20 may be disposed to be spaced apart from the first upper recess R10.

The second upper recess R20 may be overlapped with a partial region of the second bonding part 1122 in a first direction based on a direction from the lower surface of the first frame 1112 toward the upper surface thereof. The second upper recess R20 may be overlapped with a partial region of the light emitting structure 1123 based on the first direction.

The second upper recess R20, as shown in FIG. 18, when viewed from the upper direction of the light emitting device 1120, may comprise an outer side surface of the package body 1110, an inner side surface of the package body, and an extension side surface connecting the outer side surface and the inner side surface thereof and disposed in parallel with a direction in which the recess R is extended. The inner side surface may be provided to be extended in an inward direction from three side surfaces of the second bonding part 1122. As an example, the second upper recess R20 may have three outer side surfaces, three inner side surfaces, and two extension side surfaces, and may be provided at the periphery of the second bonding part 1122 in a "]" shape.

In addition, the second upper recess R20, as shown in FIG. 18, when viewed from the upper direction of the light emitting device 1120, may be provided such that the inner side surface of the package body 1110 is adjacent to three sides of the second adhesive 1133. Further, the outer side surface of the second upper recess R20 may be provided at two sides facing each other of a minor axis direction of the package body 1110 and an outer peripheral region of the major axis direction. For example, the second upper recess R20 may have three outer side surfaces, three inner side surfaces, and two extension side surfaces, and may be provided at the periphery of the second adhesive 1133 in a "]" shape.

The second frame 1112 may comprise a first region disposed to be extended in the direction in which the second upper recess R20 is provided along the major axis direction of the light emitting device 1120 from a region in which the body 1113 is disposed. As an example, the second adhesive 1133 may be disposed on the first region of the second frame 1112. The second adhesive 1133 may be disposed to be overlapped with the second bonding part 1122 based on the first direction.

According to the embodiment, the first region may be provided as a flat surface. The first region may be corresponded to an area defined by the three inner sides.

In addition, in the light emitting device package according to the embodiment, as shown in FIG. 18, when viewed from the upper direction of the light emitting device 1120, a partial region of the second upper recess R20 may be overlapped with the light emitting structure 1123 in a vertical direction. As an example, three inner side surface regions of the second upper recess R20 adjacent to the second bonding part 1122 may be provided to be extended under the light emitting structure 1123. The second upper recess R20 may be disposed to be overlapped with the second bonding part 1122 in the vertical direction.

For example, the first upper recess R10 and the second upper recess R20 may be provided with a width of several tens of micrometers to several hundreds of micrometers.

In addition, according to the embodiment, the side surfaces of the first and second upper recesses R10 and R20 may have an inclined surface and a curvature. Further, the first and second upper recesses R10 and R20 may be formed in a spherical shape, and the side surfaces thereof may be formed in a circular shape.

According to the light emitting device package 1100 according to the embodiment, as shown in FIGS. 15 to 19, the second adhesive 1133 may be disposed at the first frame 1111 and the second frame 1112.

The second adhesive 1133 may be provided on the first region of the first frame 1111 and disposed between the first bonding part 1121 and the first frame 1111. The second adhesive 1133 may be disposed to be in direct contact with the lower surface of the first bonding part 1121.

The second adhesive 1133 may be provided at the second frame 1112 and disposed under the second bonding part 1122. The second adhesive 1133 may be disposed to be in direct contact with the lower surface of the second bonding part 1122.

According to the embodiment, the second adhesive 1133 may be provided at the first frame 1111, and the first bonding part 1121 of the light emitting device 1120 may be mounted on the second adhesive 1133.

At this point, in the process of mounting the first bonding part 1121 of the light emitting device 1120 on the second adhesive 1133, a part of the second adhesive 1133 may be diffused into the region of the first upper recess R10, and diffused to the side of the light emitting structure 1123 to be electrically connected to the active layer, thereby causing a short-circuit.

Figure 19:
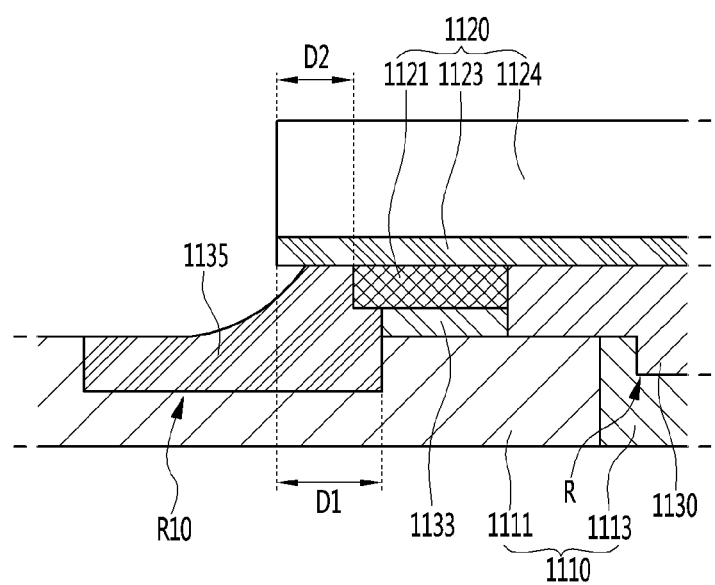
FIG. 19 is a view explaining the arrangement relationship of a light emitting device, a first frame, and a second adhesive applied to a light emitting device package according to an embodiment of the present invention.

However, according to the embodiment, as shown in FIGS. 17 to 19, a second distance D2 from the side surface of the light emitting device 1120 to the side surface of the first bonding part 1121 may be provided to be smaller than a first distance D1 from the side surface of the light emitting device 1120 to the side surface of the first upper recess R10 disposed under the lower surface of the light emitting device 1120.

In addition, the second distance D2 from the side surface of the light emitting device 1120 to the side surface of the first bonding part 1121 may be corresponded to a distance from the side surface of the light emitting structure 1123 to the side surface of the first bonding part 1121. The first distance D1 from the side surface of the light emitting device 1120 to the side surface of the first upper recess R10 disposed under the lower surface of the light emitting device 1120 may be corresponded to the distance from the side surface of the light emitting structure 1123 to the inner side surface of the first upper recess R10 disposed under the lower surface of the light emitting structure 1123.

As an example, the second distance D2 from the side surface of the light emitting device 1120 to the side surface of the first bonding part 1121 may be provided at several tens of micrometers. The second distance D2 from the side surface of the light emitting device 1120 to the side surface of the first bonding part 1121 may be provided at 40 to 50 micrometers.

In addition, the first distance D1 from the side surface of the light emitting device 1120 to the side surface of the first upper recess R10 under the lower surface of the light emitting device 1120 and overlapped with the light emitting device 1120 in the vertical direction may be provided to be several micrometers or several tens of micrometers larger than the second distance D2.

Therefore, according to the present embodiment, a partial region of the first upper recess R10 may be disposed to be overlapped with the first region of the first bonding part 1121 in the first direction. Accordingly, even when the second adhesive 1133 is excessively provided and diffused to the periphery, the second adhesive 1133 may be diffused into the region of the first upper recess R10 rather than being moved in the upward direction along the side surface of the first bonding part 1121.

Therefore, according to the present embodiment, since the second adhesive 1133 may be prevented from being diffused in the direction of the light emitting structure 1123 along the side surface of the first bonding part 1121, it is possible to prevent the light emitting device 1120 from being electrically short-circuited by the diffusion of the second adhesive 1133 which is a conductive material.

In addition, similar to that described above, the second adhesive 1133 may be provided at the first frame 1112, the first bonding part 1122 of the light emitting device 1120 may be mounted on the second adhesive 1133.

At this point, in the process of mounting the second bonding part 1122 of the light emitting device 1120 on the second adhesive 1133, a part of the second adhesive 1133 may be diffused into the region of the second upper recess R20, and may be diffused along the side surface of the second bonding part 1122.

In addition, according to the embodiment, as shown in FIGS. 17 to 19, when viewed from the direction of an upper portion of the light emitting device 1120, the distance from the side surface of the light emitting device 1120 to the side surface of the second bonding part 1122 may be provided to be smaller than the distance from the side surface of the light emitting device 1120 to the side surface of the second upper recess R20 disposed under the lower surface of the light emitting device 1120.

A partial region of the second upper recess R20 may be disposed to be overlapped with the lower surface of the second bonding part 1122 in the vertical direction. Accordingly, even when the second adhesive 1133 is excessively provided and diffused to the periphery, the second adhesive 1133 may be diffused into the region of the second upper recess R20 rather than being moved in the upward direction along the side surface of the second bonding part 1122.

According to the embodiment, since the second adhesive 1133 may be prevented from being diffused in the direction of the light emitting structure 1123 along the side surface of the first bonding part 1122, it is possible to prevent the light emitting device 1120 from being electrically short-circuited by the diffusion of the second adhesive 1133 which is a conductive material.

As described above, since the second adhesive 1133 may be prevented from rising along the side surface of the light emitting device 1120, the first conductivity type semiconductor layer and the second conductivity type semiconductor layer constituting the light emitting device 1120 may be prevented from being electrically short-circuited. In addition, since the second adhesive 1133 may be prevented from being disposed on the side surface of the active layer constituting the light emitting device 1120, it is possible to improve light extraction efficiency of the light emitting device 1120.

In addition, the light emitting device package 1100 according to the embodiment may comprise a first resin portion 1135, as shown in FIGS. 15 to 19.

The first resin portion 1135 may be disposed between the first frame 1111 and the light emitting device 1120. The first resin portion 1135 may be disposed between the second frame 1112 and the light emitting device 1120.

The first resin portion 1135 may be disposed on a side surface of the first bonding part 1121. The first resin portion 1135 may be disposed on a side surface of the second bonding part 1122. The first resin portion 1135 may be disposed under the light emitting structure 1123. The first resin portion 1135 may be disposed on a side surface of the second adhesive 1133.

In addition, the first resin portion 1135 may be in direct contact with the lower surface of the light emitting device 1120. The first resin portion 1135 may be disposed to be in direct contact with a side surface of the second adhesive 1133. The first resin portion 1135 may be disposed at the first upper recess R10. The first resin portion 1135 may be disposed at the second upper recess R20.

In addition, according to the embodiment, the second adhesive 1133 may overflow to the first upper recess R10. Accordingly, the first resin portion 1135 may be disposed on the second adhesive 1133 in the first upper recess R10.

According to the embodiment, even when the second adhesive 1133 is diffused into the region of the first upper recess R10 or diffused to the side surface of the first bonding part 1121 by the first resin portion 1135, the second adhesive 1133 may be prevented from moving in the side surface direction of the light emitting structure 1123.

The first resin portion 1135 may be disposed in the first upper recess R10 and in contact with the second adhesive 1133. The first resin portion 1135 may be disposed in the first upper recess R10 and provided at the periphery of the second adhesive 1133. The first resin portion 1135 may be disposed in the first upper recess R10 and provided at the periphery of the first bonding part 1121.

The second adhesive 1133 may be disposed to be surrounded by the first adhesive 1130 and the first resin portion 1135. Accordingly, since the first and second adhesives and resin portions, which are formed of different materials, are disposed between the light emitting device 1120 and the package body 1110, it is possible to improve reliability of the light emitting device package 1100.

In addition, according to the embodiment, the second adhesive 1133 may overflow to the second upper recess R20. Accordingly, the first resin portion 1135 may be disposed on the second adhesive 1133 in the second upper recess R20.

According to the embodiment, even when the second adhesive 1133 is diffused into the region of the second upper recess R20 or diffused to the side surface of the second bonding part 1122 by the first resin portion 1135, the second adhesive 1133 may be prevented from moving in the direction of side surface of the light emitting structure 1123.

The first resin portion 1135 may be disposed in the second upper recess R20 and in contact with the second adhesive 1133. The first resin portion 1135 may be disposed in the second upper recess R20 and provided at the periphery of the second adhesive 1133. The first resin portion 1135 may be disposed in the second upper recess R20 and provided at the periphery of the second bonding part 1122.

Accordingly, the first resin portion 1135 filled at the first upper recess R10 and the second upper recess R20 may effectively seal a periphery of the first bonding part 1121 and the second bonding part 1122.

As an example, the first resin portion 1135 may comprise at least one of an epoxy-based material, a silicone-based material, and a hybrid material comprising an epoxy-based material and a silicone-based material. In addition, the first resin portion 1135 may be a reflective part that reflects light emitted from the light emitting device 1120, as an example, a resin containing a reflective material such as $TiO_2$, or may comprise a white silicone.

The first resin portion 1135 may be disposed under the light emitting device 1120 to perform a sealing function. Further, the first resin portion 1135 may improve adhesion force between the light emitting device 1120 and the first frame 1111. The first resin portion 1135 may improve adhesion force between the light emitting device 1120 and the second frame 1112.

The first resin portion 1135 may seal around the first bonding part 1121 and the second bonding part 1122. The first resin portion 1135 may prevent the second adhesive 1133 from diffusing and moving in the direction of side surface of the light emitting device 1120.

When the second adhesive 1133 diffuses and moves in the direction of the side surface of the light emitting device 1120, the second adhesive 1133 may be in contact with the active layer of the light emitting device 1120, thereby causing a failure due to a short-circuit. Therefore, when the first resin portion 1135 is disposed, it is possible to prevent a short-circuit due to the second adhesive 1133 and the active layer, thereby improving reliability of the light emitting device package according to the embodiment.

In addition, when the first resin portion 1135 comprises a material having a reflective characteristic such as white silicone, the first resin portion 1135 may reflect light emitted from the light emitting device 1120 toward an upper direction of the package body 1110, thereby improving the light extraction efficiency of the light emitting device package 1100.

In addition, the light emitting device package 1100 according to the embodiment may comprise a second resin portion 1140, as shown in FIG. 17.

Figure 15:
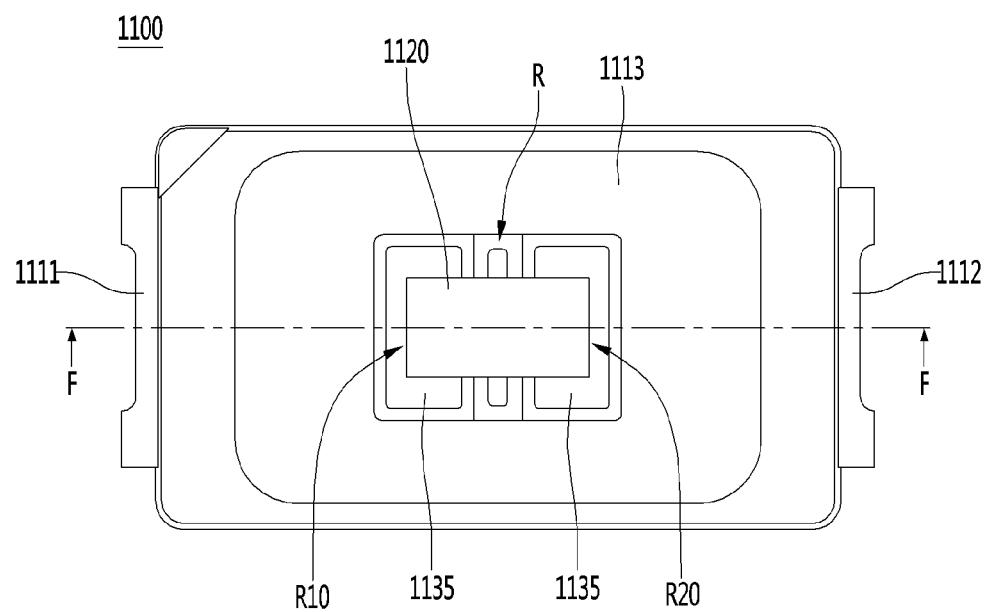
FIG. 15 is a plan view of a light emitting device package according to an embodiment of the present invention.
Figure 16:
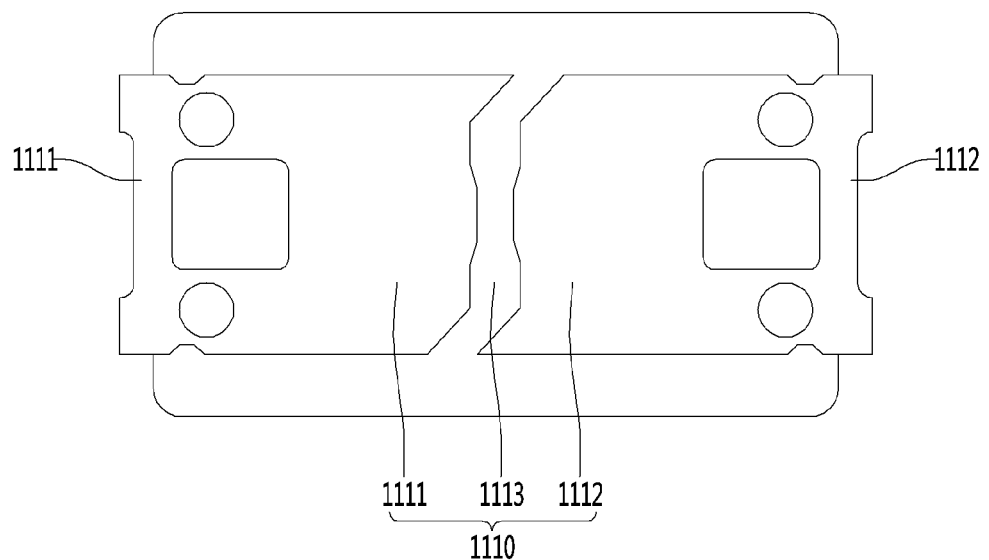
FIG. 16 is a bottom view of the light emitting device package shown in FIG. 15.

For reference, as shown in FIG. 15, the second resin portion 1140 are not shown so that an arrangement relationship of the first frame 1111, the second frame 1112, and the body 1113 may be well displayed.

The second resin portion 1140 may be provided on the light emitting device 1120. The second resin portion 1140 may be disposed on the first frame 1111 and the second frame 1112. The second resin portion 1140 may be disposed on the cavity C provided by the package body 1110. The second resin portion 1140 may be disposed on the first resin portion 1135.

The second resin portion 1140 may comprise an insulating material. In addition, the second resin portion 1140 may comprise a wavelength converting part configured to be incident light emitted from the light emitting device 1120 and providing wavelength converted light. As an example, the second resin portion 1140 may comprise at least one selected from the group consisting of a phosphor, a quantum dot, and the like.

Meanwhile, according to another example of the light emitting device package according to the embodiment of the present invention, the first resin portion 1135 may not be provided separately, and second resin portion 1140 may be disposed to be in direct contact with the first frame 1111 and the second frame 1112. As an example, the second resin portion 1140 may be disposed at the first upper recess R10 and the second upper recess R20.

In addition, according to an embodiment, the light emitting structure 1123 may be provided as a compound semiconductor. The light emitting structure 1123 may be provided as, for example, a Group II-VI or Group III-V compound semiconductor. As an example, the light emitting structure 1123 may be provided with at least two or more elements selected from aluminum (Al), gallium (Ga), indium (In), phosphorus (P), arsenic (As), and nitrogen (N).

In the light emitting device package 1100 according to the embodiment, power may be connected to the first bonding part 1121 through the second adhesive 1133 provided on the first frame 1111, and power may be connected to the second bonding part 1122 through the second adhesive 1133 provided on the second frame 1112.

Accordingly, the light emitting device 1120 may be driven by the driving power supplied through the first bonding part 1121 and the second bonding part 1122. In addition, the light emitted from the light emitting device 1120 may be provided in the upper direction of the package body 1110.

Meanwhile, the light emitting device package 1100 according to the embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided at the light emitting device package, so that stability of electrical connection and physical coupling may be weakened.

However, according to the light emitting device package and a method of fabricating the light emitting device package according to the embodiment, the first bonding part 1121 and the second bonding part 1122 of the light emitting device 1120 according to the embodiment may receive driving power by the second adhesive 1133. In addition, the melting point of the second adhesive 1133 may be selected to have a higher value than that of the common bonding material.

Therefore, since the light emitting device package 1100 according to the embodiment does not cause a re-melting phenomenon even when the light emitting device package 1100 is bonded to the main substrate by a reflow process, the electrical connection and the physical bonding force may not be deteriorated.

In addition, according to the light emitting device package 1100 and the method of fabricating the light emitting device package according to the embodiment, since the light emitting device 1120 is mounted on the package body 1110 by using a conductive paste, the package body 1110 does not need to be exposed to a high temperature in the manufacturing process of the light emitting device package. Therefore, according to an embodiment, it is possible to prevent the package body 1110 from being damaged or discolored due to exposure to high temperature.

Accordingly, a selection range for the material forming the body 1113 may be widened. According to the embodiment, the body 1113 may be provided by using not only expensive materials such as ceramics but also relatively inexpensive resin materials.

For example, the body 1113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Then, referring to FIGS. 20 to 23, a method of fabricating a light emitting device package according to the embodiment of the present invention will be described.

In describing the method of fabricating the light emitting device package according to the embodiment of the present invention with reference to FIGS. 20 to 23, the description of the contents overlapping with the contents described with reference to FIGS. 1 to 19 may be omitted.

Figure 20:
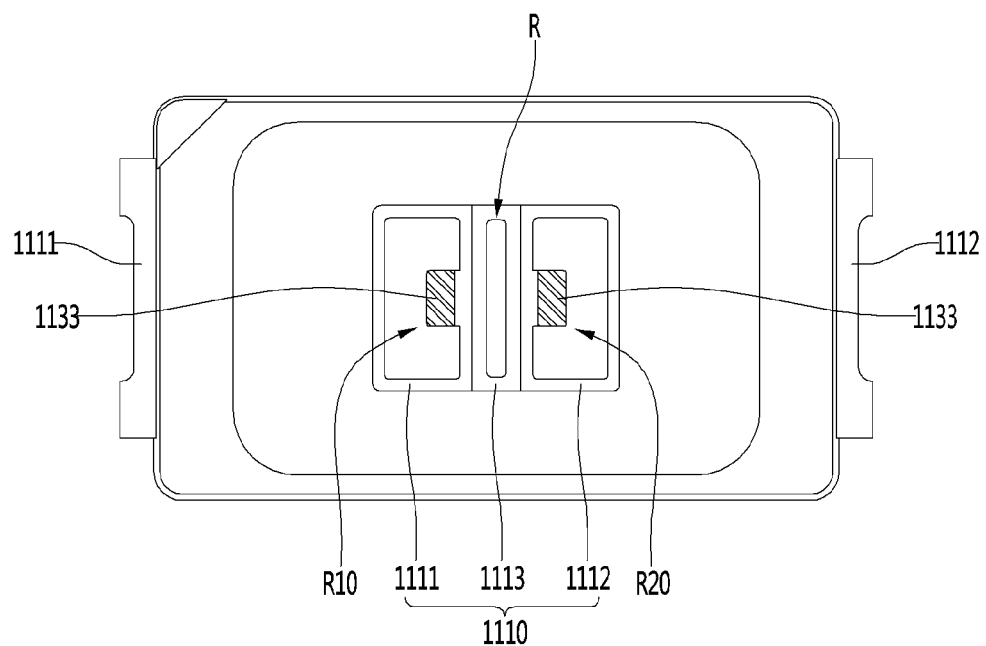
FIGS. 20 to 23 are views explaining a method of fabricating a light emitting device package according to an embodiment of the present invention.

According to the method of fabricating the light emitting device package according to the embodiment of the present invention, as shown in FIG. 20, a package body 1110 may be provided.

The package body 1110 may comprise a first frame 1111 and a second frame 1112. The first frame 1111 and the second frame 1112 may be disposed to be spaced apart from each other.

The package body 1110 may comprise a body 1113. The body 1113 may be disposed between the first frame 1111 and the second frame 1112. The body 1113 may perform a function as a kind of electrode separation line. The body 1113 may also be referred to as an insulating member.

The body 1113 may be disposed on the first frame 1111. In addition, the body 1113 may be disposed on the second frame 1112.

The body 1113 may provide an inclined surface on the first frame 1111 and the second frame 1112. A cavity C may be provided on the first frame 1111 and the second frame 1112 by the inclined surface of the body 1113.

According to the embodiment, the package body 1110 may be provided as a structure with the cavity C, or may be provided as a structure with a flat upper surface without the cavity C.

The package body 1110 may comprise a recess R, which is provided at the body 1113. The recess R may be provided at the body 1113. The recess R may be provided to concave from the upper surface of the body 1113 toward the lower surface thereof.

In addition, the first frame 1111 may comprise a first upper recess R10. The first frame 1112 may comprise a second upper recess R20.

The first upper recess R10 may be provided on an upper surface of the first frame 1111. The first upper recess R10 may be provided to concave in the lower surface direction from the upper surface of the first frame 1111. The first upper recess R10 may be disposed to be spaced apart from the recess R.

The second upper recess R20 may be provided on an upper surface of the second frame 1112. The second upper recess R20 may be provided to concave in the lower surface direction from the upper surface of the second frame 1112. The second upper recess R20 may be disposed to be spaced apart from the recess R.

Next, according to the method of fabricating the light emitting device package according to the embodiment, the second adhesive 1133 is provided at the first frame 1111 and the second frame 1112, as shown in FIG. 20.

For example, the second adhesive 1133 may be provided on a partial region adjacent to the first upper recess R10 and a partial region adjacent to the second upper recess R20 through a dotting method or the like.

The second adhesive 1133 may provide with a conductive adhesive. For example, the second adhesive 1133 may comprise at least one material selected from the group consisting of Ag, Au, Pt, etc. or an alloy thereof. However, the present invention is not limited thereto, and a material capable of securing a conductive function may be used the second adhesive 1133.

For example, the second adhesive 1133 may be formed by using a conductive paste. The conductive paste may be selected from the group consisting of a solder paste, a silver paste, or the like.

In addition, according to the method of fabricating the light emitting device package according to the embodiment, the light emitting device 1120 may be provided on the package body 1110, as shown in FIG. 20.

According to the embodiment, in the process of disposing the light emitting device 1120 on the package body 1110, the recess R may also be used to function as a kind of align key.

The light emitting device 1120 may be fixed at the body 1113 by the second adhesive 1133. The second adhesive 1133 provided at the first frame 1111 may be adhered to the first bonding part 1121 of the light emitting device 1120. The second adhesive 1133 provided at the second frame 1112 may be adhered to the second bonding part 1122 of the light emitting device 1120.

In addition, according to the embodiment, the first adhesive 1130 may be provided at the recess R.

The first adhesive 1130 may be injected into the recess R region. For example, the first adhesive 1130 may be provided at a predetermined amount to a region in which the recess R is formed, and may be provided to overflow the recess R.

In addition, according to the embodiment, as shown in FIG. 21, a length L2 of the recess R may be provided to be greater than the length of the light emitting device 120 in the short axis direction. Accordingly, according to the embodiment, the first adhesive 1130 may be injected into the lower region of the light emitting device 1120 through the recess R.

In the light emitting device package manufacturing process according to the embodiment, when an amount of the first adhesive 1130 provided under the light emitting device 1120 is large, an overflowing portion of the first adhesive 1130 provided at the recess R while being adhered to the lower portion of the light emitting device 1120 may be moved in the length L2 direction of the recess R.

The first adhesive 1130 may be disposed to move in the direction of the first bonding part 1121 and the second bonding part 1122 provided in the light emitting device 1120. Accordingly, even when an amount of the first adhesive 1130 is applied to be greater than that of the design, the light emitting device 1120 may be stably fixed without being lifted from the body 1113.

According to the embodiment, the first adhesive 1130 may be provided at a wide region between the lower surface of the light emitting device 1120 and the upper surface of the body 1113, and the fixing force between the light emitting device 1120 and the body 1113 may be improved.

The light emitting device 1120 may be fixed to the upper surface of the package body 1110 by the first adhesive 1130 and the second adhesive 1133. The first adhesive 1130 may be provided as an insulating adhesive, and the second adhesive 1133 may be provided as a conductive adhesive.

Figure 22:
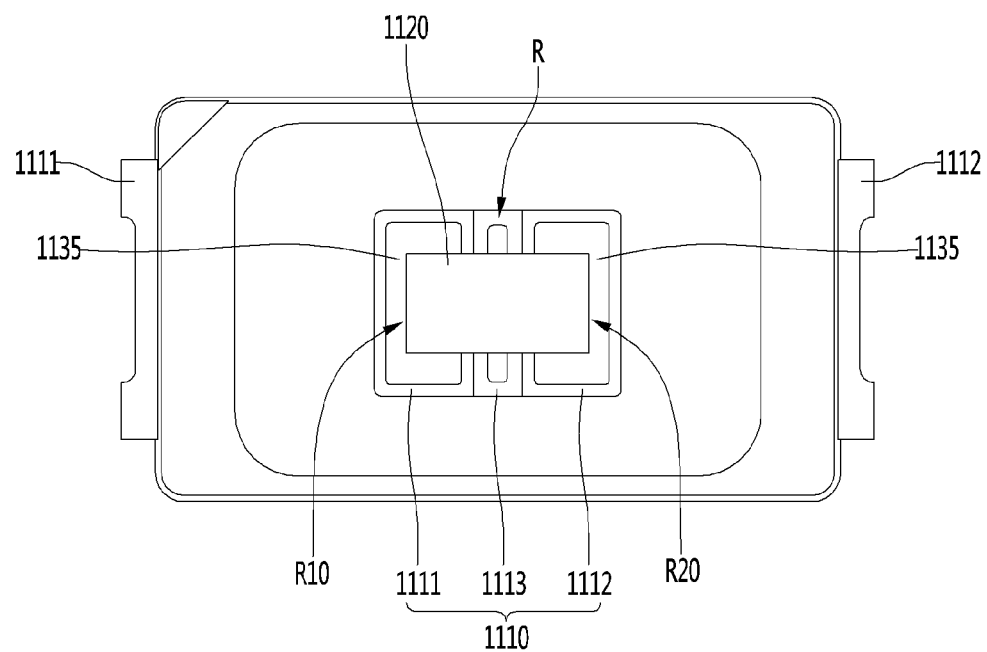

Next, according to the method of fabricating the light emitting device package according to the embodiment, as shown in FIG. 22, a resin portion 135 may be formed.

The first resin portion 1135 may be disposed between the first frame 1111 and the light emitting device 1120 as described with reference to FIGS. 17 to 19. The first resin portion 1135 may be disposed between the second frame 1112 and the light emitting device 1120.

The first resin portion 1135 may be disposed on the side surface of the first bonding part 1121. The first resin portion 1135 may be disposed on the side surface of the second bonding part 1122. The first resin portion 1135 may be disposed under the light emitting structure 1123.

In addition, the first resin portion 1135 may be in direct contact with the lower surface of the light emitting device 1120. The first resin portion 1135 may be in direct contact with the side surface of the second adhesive 1133.

The first resin portion 1135 may be disposed in the first upper recess R10. The first resin portion 1135 may be disposed in the first upper recess R10 and may be contacted with the second adhesive 1133. The first resin portion 1135 may be disposed in the first upper recess R10 and may be provided around the second adhesive 1133. The first resin portion 1135 may be disposed in the first upper recess R10 and may be provided around the first bonding part 1121.

The first resin portion 1135 may be disposed in the second upper recess R20. The first resin portion 1135 may be disposed in the second upper recess R20 and may be contacted with the second adhesive 1133. The first resin portion 1135 may be disposed in the second upper recess R20 and may be provided around the second adhesive 1133. The first resin portion 1135 may be disposed in the second upper recess R20 and may be provided around the second bonding part 1122.

As an example, the first resin portion 1135 may comprise at least one of an epoxy-based material, a silicone-based material, and a hybrid material comprising an epoxy-based material and a silicone-based material. In addition, the first resin portion 1135 may be a reflective part that reflects light emitted from the light emitting device 1120, as an example, a resin containing a reflective material such as $TiO_2$, or may comprise a white silicone.

The first resin portion 1135 may be disposed under the light emitting device 1120 to perform a sealing function. In addition, the first resin portion 1135 may improve adhesion force between the light emitting device 1120 and the first frame 1111. In addition, the first resin portion 1135 may improve adhesion force between the light emitting device 1120 and the second frame 1112.

The first resin portion 1135 may seal a periphery of the first bonding part 1121 and the second bonding part 1122. The first resin portion 1135 may prevent the second adhesive 1133 from being diffused and moved in the side surface direction of the light emitting device 1120.

When the second adhesive 1133 is diffused and moved in the side surface direction of the light emitting device 1120, the second adhesive 1133 may be in contact with the active layer of the light emitting device 1120, thereby causing a failure due to a short-circuit. Therefore, when the first resin portion 1135 is disposed, it is possible to prevent a short-circuit by the second adhesive 1133 and the active layer, thereby improving reliability of the light emitting device package according to the embodiment.

In addition, when the first resin portion 1135 comprises a material having a reflective characteristic such as a white silicone, the first resin portion 1135 may reflect light emitted from the light emitting device 1120 toward an upper direction of the package body 1110, thereby improving the light extraction efficiency of the light emitting device package 1100.

Figure 23:
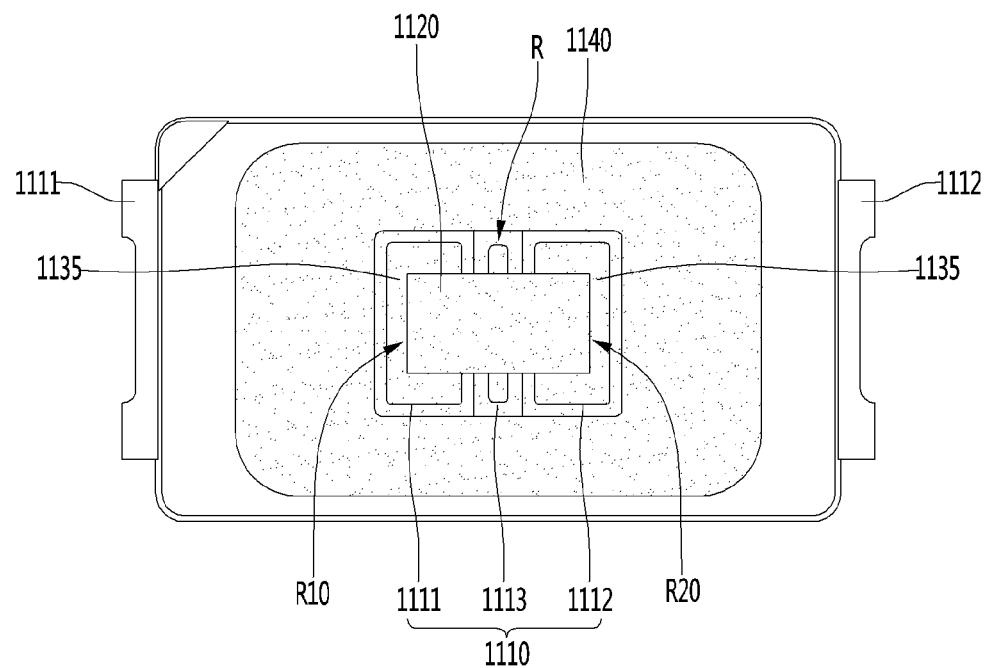

Next, according to the method of fabricating the light emitting device package according to an embodiment, as shown in FIG. 23, a second resin portion 1140 may be formed on the light emitting device 1120.

The second resin portion 1140 may be formed on the light emitting device 1120. The second resin portion 1140 may be disposed on the first frame 1111 and the second frame 1112. The second resin portion 1140 may be disposed on the cavity C provided by the package body 1110. The second resin portion 1140 may be disposed on the first resin portion 1135.

The second resin portion 1140 may comprise an insulating material.

In addition, the second resin portion 1140 may comprise wavelength converting means configured to be incident light emitted from the light emitting device 1120 and provide wavelength converted light. As an example, second resin portion 1140 may comprise at least one selected from the group consisting of a phosphor, a quantum dot, and the like.

Meanwhile, in the above description, as described with reference to FIGS. 20 and 21, it is described with reference of the case in which the first adhesive 1130 is formed under the light emitting device 1120 after the light emitting device 1120 is mounted on the package body 1110.

However, according to another example of the method of fabricating the light emitting device package according to the embodiment, as shown in FIG. 20, the second adhesive 1133 is provided on the first and second frames 1111 and 1112, and after the first adhesive 1130 is formed on the recess R, the light emitting device 1120 may be provided and fixed on the first adhesive 1130 and the second adhesive 1133.

In addition, according to still another example of the method of fabricating the light emitting device package according to the embodiment, the first resin portion 1135 may not be formed and only the second resin portion 1140 may be formed at the cavity of the package body 1110.

In the light emitting device package 1100 according to the embodiment, power may be connected to the first bonding part 1121 through the second adhesive 1133 provided at the first frame 1111, and power may be connected to the second bonding part 1122 through the second adhesive 1133 provided at the second frame 1112.

Accordingly, the light emitting device 1120 may be driven by the driving power supplied through the first bonding part 1121 and the second bonding part 1122. In addition, the light emitted from the light emitting device 1120 may be provided in the upper direction of the package body 1110.

Meanwhile, the light emitting device package 1100 according to the embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between the frame and the light emitting device provided at the light emitting device package, so that stability of electrical connection and physical coupling may be weakened. Accordingly, a position of the light emitting device may be changed, and the optical and electrical characteristics and reliability of the light emitting device package may be deteriorated.

However, according to the light emitting device package and a method of fabricating the light emitting device package according to the embodiment, the first bonding part 1121 and the second bonding part 1122 of the light emitting device 1120 according to the embodiment may receive driving power by the second adhesive 1133. In addition, the melting point of the second adhesive 1133 may be selected to have a higher value than that of the common bonding material.

Therefore, since the light emitting device package 1100 according to the embodiment does not cause a re-melting phenomenon even when the light emitting device package 1100 is bonded to the main substrate by a reflow process, the electrical connection and the physical bonding force may not be deteriorated.

In addition, according to the light emitting device package 1100 and the method of fabricating the light emitting device package according to the embodiment, since the light emitting device 1120 is mounted on the package body 1110 by using a conductive paste, the package body 1110 does not need to be exposed to a high temperature in the manufacturing process of the light emitting device package. Therefore, according to an embodiment, it is possible to prevent the package body 1110 from being damaged or discolored due to exposure to high temperature.

Accordingly, a selection range for the material forming the body 1113 may be widened. According to the embodiment, the body 1113 may be provided by using not only expensive materials such as ceramics but also relatively inexpensive resin materials.

For example, the body 1113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Next, another example of the light emitting device package according to an embodiment of the present invention will be described with reference to FIG. 24.

In describing the light emitting device package according to the embodiment of with reference to FIG. 24, the description of the contents overlapping with the contents described with reference to FIGS. 1 to 23 may be omitted.

Figure 24:
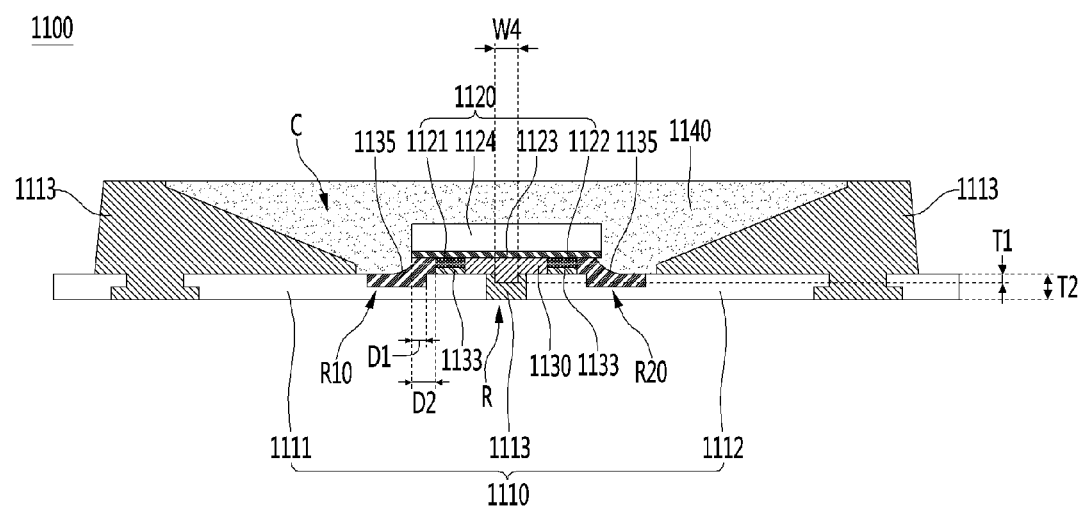
FIG. 24 is a view illustrating another example of a light emitting device package according to an embodiment of the present invention.

The light emitting device package 1100 according to the embodiment may comprise a package body 1110 and a light emitting device 1120, as shown in FIG. 24.

The package body 1110 may comprise a first frame 1111 and a second frame 1112. The first frame 1111 and the second frame 1112 may be disposed to be spaced apart from each other.

The package body 1110 may comprise a body 1113. The body 1113 may be disposed between the first frame 1111 and the second frame 1112. The body 1113 may perform a function as a kind of electrode separation line. The body 1113 may also be referred to as an insulating member.

The first frame 1111 and the second frame 1112 may be provided as a conductive frame. The first frame 1111 and the second frame 1112 may stably provide a structural strength of the package body 1110 and may be electrically connected to the light emitting device 1120.

For example, the body 1113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 1113 may comprise a high refractive index filler such as $TiO_2$ or $SiO_2$.

According to the embodiment, the light emitting device 1120 may comprise a first bonding part 1121, a second bonding part 1122, a light emitting structure 1123, and a substrate 1124.

The light emitting device 1120 may be disposed on the package body 1110. The light emitting device 1120 may be disposed on the first frame 1111 and the second frame 1112. The light emitting device 1120 may be disposed in the cavity C provided by the package body 1110. The light emitting device 120 may be disposed on the body 1113.

The first bonding part 1121 may be disposed on a lower surface of the light emitting device 1120. The second bonding part 1122 may be disposed on the lower surface of the light emitting device 1120. The first bonding part 1121 and the second bonding part 1122 may be disposed to be spaced apart from each other on the lower surface of the light emitting device 1120.

The first bonding part 1121 may be disposed on the first frame 1111. The second bonding part 1122 may be disposed on the second frame 1112.

The first bonding part 1121 may be disposed between the light emitting structure 1123 and the first frame 1111. The second bonding part 1122 may be disposed between the light emitting structure 1123 and the second frame 1112.

The light emitting device package according to the embodiment may comprise a first adhesive 1130.

The first adhesive 1130 may be disposed between the body 1113 and the light emitting device 1120. The first adhesive 1130 may be disposed between an upper surface of the body 1113 and a lower surface of the light emitting device 1120.

The first adhesive 1130 may be disposed to be overlapped with the light emitting device 1120 in the first direction. The first adhesive 1130 may be disposed to be overlapped with the light emitting device 1120 based on a direction from the lower surface of the body 1113 toward the upper surface thereof.

In addition, the light emitting device package according to the embodiment may comprise a recess R.

The recess R may be provided at the body 1113. The recess R may be provided to concave in a first direction from the upper surface of the body 1113 toward the lower surface thereof. The recess R may be disposed under the light emitting device 1120. The recess R may be provided to be overlapped with the light emitting device 1120 in the first direction.

The recess R may be disposed between the first bonding part 1121 and the second bonding part 1122. The recess R may be provided not to be overlapped with the first bonding part 1121 in the first direction. The recess R may be provided not to be overlapped with the second bonding part 1122 in the first direction.

As an example, the first adhesive 1130 may be disposed at the recess R. The first adhesive 1130 may be disposed between the light emitting device 1120 and the body 1113. The first adhesive 1130 may be disposed between the first bonding part 1121 and the second bonding part 1122. As an example, the first adhesive 1130 may be disposed to be in contact with a side surface of the first bonding part 1121 and a side surface of the second pad electrode 1122.

The first adhesive 1130 may provide a stable fixing force between the light emitting device 1120 and the package body 1110. The first adhesive 1130 may provide a stable fixing force between the light emitting device 1120 and the body 1113. The first adhesive 1130 may be disposed to be in direct contact with the upper surface of the body 1113, as an example. In addition, the first adhesive 1130 may be disposed in direct contact with the lower surface of the light emitting device 1120.

The first adhesive 1130 may be provided as an insulating adhesive. As an example, the first adhesive 1130 may comprise at least one of an epoxy-based material, a silicone-based material, and a hybrid material comprising an epoxy-based material and a silicone-based material. Further, as an example, when the first adhesive 1130 comprises a reflective function, the adhesive 130 may comprise a white silicone.

The first adhesive 1130 may provide a stable fixing force between the body 1113 and the light emitting device 1120, when light is emitted to the lower surface of the light emitting device 1120, and may provide a light diffusion function between the light emitting device 1120 and the body 1113. When the light is emitted from the light emitting device 1120 to the lower surface of the light emitting device 1120, the first adhesive 1130 may improve the light extraction efficiency of the light emitting device package 1100 by providing the light diffusion function. In addition, the first adhesive 1130 may reflect the light emitted from the light emitting device 1120. When the first adhesive 1130 comprises the reflection function, the first adhesive 1130 may be formed of a material comprising $TiO_2$, Silicone, and the like.

Meanwhile, the light emitting device package 1100 according to the embodiment may comprise a second adhesive 1133, as shown in FIG. 24.

The second adhesive 1133 may be disposed between the first frame 1111 and the light emitting device 1120. In addition, the second adhesive 1133 may be disposed between the second frame 1112 and the light emitting device 1120.

The second adhesive 1133 may be disposed between an upper surface of the body 1113 and a lower surface of the light emitting device 1120. The second adhesive 1133 may be disposed to be in direct contact with the upper surface of the body 1113. The second adhesive 1133 may be disposed to be in direct contact with the lower surface of the light emitting device 1120.

The second adhesive 1133 may be disposed to be in direct contact with the lower surface of the first bonding part 1121. Further, the second adhesive 1133 may be disposed to be in direct contact with the lower surface of second the bonding part 1122.

The second adhesive 1133 may be provided as a conductive adhesive, as an example. The first frame 1111 and the first bonding part 1121 may be electrically connected by the second adhesive 1133. The second frame 1112 and the second bonding part 1122 may be electrically connected by the second adhesive 1133.

As an example, the second conductor 1222 may comprise at least one material selected from the group consisting of Ag, Au, Pt, etc. or an alloy thereof. However, the present invention is not limited thereto, and a material capable of securing a conductive function may be used for second conductor 1222.

As an example, the second adhesive 1133 may be formed by using a conductive paste. The conductive paste may be selected from the group consisting of solder paste, silver paste and the like.

According to the embodiment, the first adhesive 1130 and the second adhesive 1133 may comprise different materials. As an example, the first adhesive 1130 may be provided as an insulating adhesive, and the second adhesive 1133 may be provided as a conductive adhesive.

In addition, the light emitting device package according to the embodiment may comprise a first upper recess R10 and a second upper recess R20, as shown in FIG. 24.

The first upper recess R10 may be provided at an upper surface of the first frame 1111. The first upper recess R10 may be provided to concave in the lower surface direction from the upper surface of the first frame 1111. The first upper recess R10 may be disposed to be spaced apart from the recess R.

The first upper recess R10 may be overlapped with the first bonding part 1121 in a first direction based on a direction from the lower surface of the first frame 1111 toward the upper surface thereof. The first upper recess R10 may be overlapped with the light emitting structure 1123 based on the first direction.

As described with reference to FIG. 18, when viewed from the upper direction of the light emitting device 1120, the first upper recess R10 may be provided to extend inward from three sides of the first bonding part 1121. For example, the first upper recess R10 may be provided in the periphery of the first bonding part 1121 in a "[" shape.

As described with reference to FIG. 18, when viewed from the upper direction of the light emitting device 1120, the first upper recess R10 may be provided adjacent to three sides of the second adhesive 1133. For example, the first upper recess R10 may be provided in the periphery of the second adhesive 1133 in a "[" shape.

The first frame 1111 may comprise a first region extending in a direction in which the first upper recess R10 is provided. As an example, the second adhesive 1133 may be disposed in the first region of the first frame 1111. The second adhesive 1133 may be disposed to be overlapped with the first bonding part 1121 based on the first direction.

In the light emitting device package according to the embodiment, as described above referring to FIG. 18, when viewed from the upper direction of the light emitting device 1120, a partial region of the first upper recess R10 may be overlapped with the light emitting structure 1123 in a vertical direction. As an example, a side surface region of the first upper recess R10 adjacent to the first bonding part 1121 may be provided to be extended under the light emitting structure 1123. The first upper recess R10 may be disposed to be overlapped with the first bonding part 1121 in the vertical direction.

According to the embodiment, the second upper recess R20 may be provided on an upper surface of the second frame 1112. The second upper recess R20 may be provided to concave in the lower surface direction from the upper surface of the second frame 1112. The second upper recess R20 may be disposed to be spaced apart from the recess R. The second upper recess R20 may be disposed to be spaced apart from the first upper recess R10.

The second upper recess R20 may be overlapped with the second bonding part 1122 in a first direction based on a direction from the lower surface of the first frame 1112 toward the upper surface thereof. The second upper recess R20 may be overlapped with the light emitting structure 1123 based on the first direction.

As described with reference to FIG. 18, when viewed from the upper direction of the light emitting device 1120, the second upper recess R20 may be provided to extend inward from three sides of the first bonding part 1121. For example, the second upper recess R20 may be provided in the periphery of the second bonding part 1122 in a "]" shape.

In addition, as described with reference to FIG. 18, when viewed from the upper direction of the light emitting device 1120, the second upper recess R20 may be provided adjacent to three sides of the second adhesive 1133. For example, the second upper recess R20 may be provided in the periphery of the second adhesive 1133 in a "]" shape.

The second frame 1112 may comprise a first region extending in a direction in which the second upper recess R20 is provided. As an example, the second adhesive 1133 may be disposed in the first region of the second frame 1112. The second adhesive 1133 may be disposed to be overlapped with the second bonding part 1122 based on the first direction.

In addition, in the light emitting device package according to the embodiment, as described above referring to FIG. 18, when viewed from the upper direction of the light emitting device 1120, a partial region of the second upper recess R20 may be overlapped with the light emitting structure 1123 in a vertical direction. As an example, a side surface region of the second upper recess R20 adjacent to the second bonding part 1122 may be provided to be extended under the light emitting structure 1123. The second upper recess R20 may be disposed to be overlapped with the second bonding part 1122 in the vertical direction.

For example, the first upper recess R10 and the second upper recess R20 may be provided with a width of several tens of micrometers to several hundreds of micrometers.

According to the light emitting device package 1100 according to the embodiment, as shown in FIG. 24, the second adhesive 1133 may be disposed at the first frame 1111 and the second frame 1112.

The second adhesive 1133 may be provided on the first frame 1111 and disposed under the first bonding part 1121. The second adhesive 1133 may be disposed to be in direct contact with the lower surface of the first bonding part 1121.

The second adhesive 1133 may be provided on the second frame 1112 and disposed under the second bonding part 1122. The second adhesive 1133 may be disposed to be in direct contact with the lower surface of the second bonding part 1122.

According to the embodiment, the second adhesive 1133 may be provided at the first frame 1111, and the first bonding part 1121 of the light emitting device 1120 may be mounted on the second adhesive 1133.

At this point, in the process of mounting the first bonding part 1121 of the light emitting device 1120 on the second adhesive 1133, a part of the second adhesive 1133 may be diffused into the region of the first upper recess R10, and diffused to the side of the first bonding part 1121.

However, according to the embodiment, as shown in FIG. 24, when viewed from the upper direction of the light emitting device 1120, when the second distance D2 from the side surface of the light emitting device 1120 to the side surface of the first bonding part 1121 is provided sufficiently, it is possible to prevent a part of the second adhesive 1133 from being diffused on the side surface of the first bonding part 1121 and being moved to the side surface direction of the light emitting device 1120.

For example, the second distance D2 from the side surface of the light emitting device 1120 to the side surface of the first bonding part 1121 may be provided at several tens of micrometers. The second distance D2 from the side surface of the light emitting device 1120 to the side surface of the first bonding part 1121 may be provided at 40 micrometers or more. As an example, the second distance D2 from the side surface of the light emitting device 1120 to the side surface of the first bonding part 1121 may be provided at 50 to 90 micrometers.

Accordingly, when the second distance D2 from the side surface of the light emitting device 1120 to the side surface of the first bonding part 1121 is provided sufficiently, the first distance D1 from the side surface of the light emitting device 1120 to the side surface of the first upper recess R10 disposed under a lower surface of the light emitting device 1120 may be provided smaller than the second distance D2.

In addition, the first distance D1 from the side surface of the light emitting device 1120 to the inner side surface of the first upper recess R10 disposed to be overlapped with the light emitting device 1120 in the vertical direction may be provided to be several micrometers or tens of micrometers smaller than the second distance D2.

According to an embodiment, a partial region of the first upper recess R10 may be disposed to be overlapped with the lower surface of the first bonding part 1121 in a vertical direction. Accordingly, even when the second adhesive 1133 is excessively provided and diffused to the periphery, the second adhesive 1133 may be diffused into the first upper recess R 10 region rather than being moved in the upper direction along the side surface of the first bonding part 1121.

According to the embodiment, since the second adhesive 1133 may be prevented from being diffused in the direction of the light emitting structure 1123 along the side surface of the first bonding part 1121, it is possible to prevent the light emitting device 1120 from being electrically short-circuited by diffusion of the second adhesive 1133, which is a conductive material.

In addition, when the second distance D2 from the side surface of the light emitting device 1120 to the side surface of the first bonding part 1121 is provided sufficiently, the first distance D1 from the side surface of the light emitting device 1120 to the side surface of the first upper recess R10 disposed under a lower surface of the light emitting device 1120 may be provided with a minus value. That is, the light emitting device 1120 may be disposed not to be overlapped with the first upper recess R10 in the vertical direction.

In addition, similar to that described above, the second adhesive 1133 may be provided at the first frame 1112, the first bonding part 1122 of the light emitting device 1120 may be mounted on the second adhesive 1133.

At this point, in the process of mounting the second bonding part 1122 of the light emitting device 1120 on the second adhesive 1133, a part of the second adhesive 1133 may be diffused into the region of the second upper recess R20, and may be diffused along the side surface of the second bonding part 1122.

However, according to the embodiment, as shown in FIG. 24, when viewed from the upper direction of the light emitting device 1120, when the second distance from the side surface of the light emitting device 1120 to the side surface of the second bonding part 1122 is provided sufficiently, it is possible to prevent a part of the second adhesive 1133 from being diffused on the side surface of the second bonding part 1122 and being moved to the side surface direction of the light emitting device 1120.

For example, the second distance from the side surface of the light emitting device 1120 to the side surface of the second bonding part 1122 may be provided at several tens of micrometers. The second distance from the side surface of the light emitting device 1120 to the side surface of the second bonding part 1122 may be provided at 40 micrometers or more. As an example, the second distance from the side surface of the light emitting device 1120 to the side surface of the second bonding part 1121 may be provided at 50 to 90 micrometers.

Accordingly, when the second distance from the side surface of the light emitting device 1120 to the side surface of the second bonding part 1122 is provided sufficiently, the first distance from the side surface of the light emitting device 1120 to an inner side surface of the second upper recess R20 disposed under a lower surface of the light emitting device 1120 may be provided smaller than the second distance.

In addition, the first distance D1 from the side surface of the light emitting device 1120 to the inner side surface of the second upper recess R20 disposed to be overlapped with the light emitting device 1120 in the vertical direction may be provided to be several micrometers or tens of micrometers smaller than the second distance.

According to an embodiment, a partial region of the second upper recess R20 may be disposed to be overlapped with the lower surface of the second bonding part 1121 in a vertical direction. Accordingly, even when the second adhesive 1133 is excessively provided and diffused to the periphery, the second adhesive 1133 may be diffused into the second upper recess R 20 region rather than being moved in the upper direction along the side surface of the second bonding part 1122.

According to the embodiment, since the second adhesive 1133 may be prevented from being diffused in the direction of the light emitting structure 1123 along the side surface of the second bonding part 1122, it is possible to prevent the light emitting device 1120 from being electrically short-circuited by diffusion of the second adhesive 1133, which is a conductive material.

In addition, when the second distance from the side surface of the light emitting device 1120 to the side surface of the second bonding part 1122 is provided sufficiently, the first distance from the side surface of the light emitting device 1120 to the inner side surface of the second upper recess R20 disposed under the lower surface of the light emitting device 1120 may be provided with a minus value. That is, the light emitting device 1120 may be disposed not to be overlapped with the second upper recess R20 in the vertical direction.

As described above, since the second adhesive 1133 may be prevented from rising along the side surface of the light emitting device 1120, the first conductivity type semiconductor layer and the second conductivity type semiconductor layer constituting the light emitting device 1120 may be prevented from being electrically short-circuited. In addition, since the second adhesive 1133 may be prevented from being disposed on the side surface of the active layer constituting the light emitting device 1120, it is possible to improve light extraction efficiency of the light emitting device 1120.

In addition, the light emitting device package 1100 according to the embodiment may comprise a first resin portion 1135, as shown in FIG. 24.

The first resin portion 1135 may be disposed between the first frame 1111 and the light emitting device 1120. The first resin portion 1135 may be disposed between the second frame 1112 and the light emitting device 1120.

The first resin portion 1135 may be disposed on a side surface of the first bonding part 1121. The first resin portion 1135 may be disposed on a side surface of the second bonding part 1122. The first resin portion 1135 may be disposed under the light emitting structure 1123. The first resin portion 1135 may be disposed on a side surface of the second adhesive 1133.

In addition, the first resin portion 1135 may be in direct contact with the lower surface of the light emitting device 1120. The first resin portion 1135 may be disposed to be in direct contact with a side surface of the second adhesive 1133. The first resin portion 1135 may be disposed at the first upper recess R10. The first resin portion 1135 may be disposed at the second upper recess R20.

In addition, according to the embodiment, the second adhesive 1133 may overflow to the first upper recess R10. Accordingly, the first resin portion 1135 may be disposed on the second adhesive 1133 in the first upper recess R10.

According to the embodiment, even when the second adhesive 1133 is diffused into the region of the first upper recess R10 or diffused to the side surface of the first bonding part 1121 by the first resin portion 1135, the second adhesive 1133 may be prevented from moving in the side surface direction of the light emitting structure 1123.

The first resin portion 1135 may be disposed in the first upper recess R10 and in contact with the second adhesive 1133. The first resin portion 1135 may be disposed in the first upper recess R10 and provided at the periphery of the second adhesive 1133. The first resin portion 1135 may be disposed in the first upper recess R10 and provided at the periphery of the first bonding part 1121.

In addition, according to the embodiment, the second adhesive 1133 may overflow to the second upper recess R20. Accordingly, the first resin portion 1135 may be disposed on the second adhesive 1133 in the second upper recess R20.

According to the embodiment, even when the second adhesive 1133 is diffused into the region of the second upper recess R20 or diffused to the side surface of the second bonding part 1122 by the first resin portion 1135, the second adhesive 1133 may be prevented from moving in the direction of side surface of the light emitting structure 1123.

The first resin portion 1135 may be disposed in the second upper recess R20 and in contact with the second adhesive 1133. The first resin portion 1135 may be disposed in the second upper recess R20 and provided at the periphery of the second adhesive 1133. The first resin portion 1135 may be disposed in the second upper recess R20 and provided at the periphery of the second bonding part 1122.

Accordingly, the first resin portion 1135 filled at the first upper recess R10 and the second upper recess R20 may effectively seal a periphery of the first bonding part 1121 and the second bonding part 1122.

As an example, the first resin portion 1135 may comprise at least one of an epoxy-based material, a silicone-based material, and a hybrid material comprising an epoxy-based material and a silicone-based material. For example, the first resin portion 1135 may be a reflective part that reflects light emitted from the light emitting device 1120, as an example, a resin containing a reflective material such as $TiO_2$. The resin portion 1135 may comprise a white silicone.

The first resin portion 1135 may be disposed under the light emitting device 1120 to perform a sealing function. Further, the first resin portion 1135 may improve adhesion force between the light emitting device 1120 and the first frame 1111. The first resin portion 1135 may improve adhesion force between the light emitting device 1120 and the second frame 1112.

The first resin portion 1135 may seal around the first bonding part 1121 and the second bonding part 1122. The first resin portion 1135 may prevent the second adhesive 1133 from diffusing and moving in the direction of side surface of the light emitting device 1120.

When the second adhesive 1133 diffuses and moves in the direction of the side surface of the light emitting device 1120, the second adhesive 1133 may be in contact with the active layer of the light emitting device 1120, thereby causing a failure due to a short-circuit. Therefore, when the first resin portion 1135 is disposed, it is possible to prevent a short-circuit due to the second adhesive 1133 and the active layer, thereby improving reliability of the light emitting device package according to the embodiment.

In addition, when the first resin portion 1135 comprises a material having a reflective characteristic such as white silicone, the first resin portion 1135 may reflect light emitted from the light emitting device 1120 toward an upper direction of the package body 1110, thereby improving the light extraction efficiency of the light emitting device package 1100.

In addition, the light emitting device package according to the embodiment may comprise a second resin portion 1140.

The second resin portion 1140 may be provided on the light emitting device 1120. The second resin portion 1140 may be disposed on the first frame 1111 and the second frame 1112. The second resin portion 1140 may be disposed on the cavity C provided by the package body 1110. The second resin portion 1140 may be disposed on the first resin portion 1135.

In the light emitting device package 1100 according to the embodiment, power may be connected to the first bonding part 1121 through the second adhesive 1133 provided on the first frame 1111, and power may be connected to the second bonding part 1122 through the second adhesive 1133 provided on the second frame 1112.

Accordingly, the light emitting device 1120 may be driven by the driving power supplied through the first bonding part 1121 and the second bonding part 1122. In addition, the light emitted from the light emitting device 1120 may be provided in the upper direction of the package body 1110.

Meanwhile, the light emitting device package 1100 according to the embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided at the light emitting device package, so that stability of electrical connection and physical coupling may be weakened.

However, according to the light emitting device package and a method of fabricating the light emitting device package according to the embodiment, the first bonding part 1121 and the second bonding part 1122 of the light emitting device 1120 according to the embodiment may receive driving power by the second adhesive 1133. In addition, the melting point of the second adhesive 1133 may be selected to have a higher value than that of the common bonding material.

Therefore, since the light emitting device package 1100 according to the embodiment does not cause a re-melting phenomenon even when the light emitting device package 1100 is bonded to the main substrate by a reflow process, the electrical connection and the physical bonding force may not be deteriorated.

In addition, according to the light emitting device package 1100 and the method of fabricating the light emitting device package according to the embodiment, since the light emitting device 1120 is mounted on the package body 1110 by using a conductive paste, the package body 1110 does not need to be exposed to a high temperature in the manufacturing process of the light emitting device package. Therefore, according to an embodiment, it is possible to prevent the package body 1110 from being damaged or discolored due to exposure to high temperature.

Accordingly, a selection range for the material forming the body 1113 may be widened. According to the embodiment, the body 1113 may be provided by using not only expensive materials such as ceramics but also relatively inexpensive resin materials.

For example, the body 1113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Next, another example of the light emitting device package according to an embodiment of the present invention will be described with reference to FIG. 25.

Figure 25:
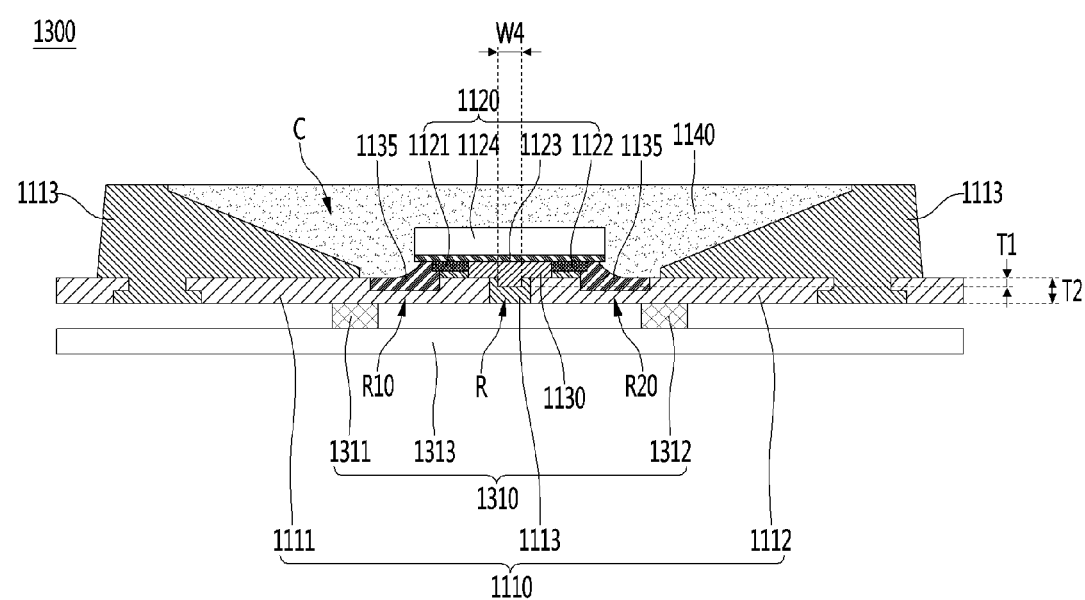
FIG. 25 is a view illustrating another example of a light emitting device package according to an embodiment of the present invention.

The light emitting device package 1300 according to the embodiment of the present invention shown in FIG. 25 is shown as an example in which the light emitting device package 1100 described with reference to FIGS. 15 to 24 is mounted on a circuit board 1310 and supplied.

In describing the light emitting device package 1300 according to the embodiment of with reference to FIG. 25, the description of the contents overlapping with the contents described with reference to FIGS. 1 to 24 may be omitted.

The light emitting device package 1300 according to the embodiment may comprise a circuit board 1310, a package body 1110, and a light emitting device 1120, as shown in FIG. 25.

The circuit board 1310 may comprise a first pad 1311, a second pad 1312, and a support substrate 1313. The support substrate 1313 may be provided with a power supply circuit configured to control driving of the light emitting device 1120.

The package body 1110 may be disposed on the circuit board 1310.

The first pad 1311 and the first bonding part 1121 may be electrically connected to each other. The second pad 1312 and the second bonding part 1122 may be electrically connected to each other.

The first pad 1311 and the second pad 1312 may comprise a conductive material. For example, the first pad 1311 and the second pad 1312 may comprise one material selected from the group consisting of Ti, Cu, Ni, Au, Cr, Ta, Pt, Sn, Ag, P, Fe, Sn, Zn, and Al or an alloy thereof. The first pad 1311 and the second pad 1312 may be provided as a single layer or multiple layers.

The package body 1110 may comprise a first frame 1111 and a second frame 1112. The first frame 1111 and the second frame 1112 may be disposed to be spaced apart from each other.

The package body 1110 may comprise a body 1113. The body 1113 may be disposed between the first frame 1111 and the second frame 1112. The body 1113 may perform a function as a kind of electrode separation line.

The first frame 1111 and the second frame 1112 may be provided as a conductive frame. The first frame 1111 and the second frame 1112 may stably provide a structural strength of the package body 1110 and may be electrically connected to the light emitting device 1120.

According to the embodiment, the light emitting device 1120 may comprise a first bonding part 1121, a second bonding part 1122, a light emitting structure 1123, and a substrate 1124.

The light emitting device 1120 may be disposed on the package body 1110. The light emitting device 1120 may be disposed on the first frame 1111 and the second frame 1112. The light emitting device 1120 may be disposed in the cavity C provided by the package body 1110. The light emitting device 120 may be disposed on the body 1113.

The first bonding part 1121 may be disposed on a lower surface of the light emitting device 1120. The second bonding part 1122 may be disposed on the lower surface of the light emitting device 1120. The first bonding part 1121 and the second bonding part 1122 may be disposed to be spaced apart from each other on the lower surface of the light emitting device 1120.

The first bonding part 1121 may be disposed on the first frame 1111. The second bonding part 1122 may be disposed on the second frame 1112.

The first bonding part 1121 may be disposed between the light emitting structure 1123 and the first frame 1111. The second bonding part 1122 may be disposed between the light emitting structure 1123 and the second frame 1112.

The light emitting device package 1300 according to the embodiment may comprise a first adhesive 1130, as shown in FIG. 25.

The first adhesive 1130 may be disposed between the package body 1110 and the light emitting device 1120. The first adhesive 1130 may be disposed between an upper surface of the package body 1110 and a lower surface of the light emitting device 1120.

The first adhesive 1130 may be disposed to be overlapped with the light emitting device 1120 in the first direction. The first adhesive 1130 may be disposed to be overlapped with the light emitting device 1120 based on a direction from the lower surface of the body 1113 toward the upper surface thereof.

In addition, the light emitting device package 1300 according to the embodiment may comprise a recess R, as shown in FIG. 25.

The recess R may be provided at the body 1113. The recess R may be provided to concave in a first direction from the upper surface of the body 1113 toward the lower surface thereof. The recess R may be disposed under the light emitting device 1120. The recess R may be provided to be overlapped with the light emitting device 1120 in the first direction.

The recess R may be disposed between the first bonding part 1121 and the second bonding part 1122. The recess R may be provided not to be overlapped with the first bonding part 1121 in the first direction. The recess R may be provided not to be overlapped with the second bonding part 1122 in the first direction.

As an example, the first adhesive 1130 may be disposed at the recess R. The first adhesive 1130 may be disposed between the light emitting device 1120 and the body 1113. The first adhesive 1130 may be disposed between the first bonding part 1121 and the second bonding part 1122. As an example, the first adhesive 1130 may be disposed to be in contact with a side surface of the first bonding part 1121 and a side surface of the second pad electrode 1122.

The first adhesive 1130 may provide a stable fixing force between the light emitting device 1120 and the package body 1110. The first adhesive 1130 may provide a stable fixing force between the light emitting device 1120 and the body 1113. The first adhesive 1130 may be disposed to be in direct contact with the upper surface of the body 1113, as an example. In addition, the first adhesive 1130 may be disposed in direct contact with the lower surface of the light emitting device 1120.

The first adhesive 1130 may be provided as an insulating adhesive. As an example, the first adhesive 1130 may comprise at least one of an epoxy-based material, a silicone-based material, and a hybrid material comprising an epoxy-based material and a silicone-based material. Further, as an example, when the first adhesive 1130 comprises a reflective function, the adhesive 130 may comprise a white silicone.

The first adhesive 1130 may provide a stable fixing force between the body 1113 and the light emitting device 1120, when light is emitted to the lower surface of the light emitting device 1120, and may provide a light diffusion function between the light emitting device 1120 and the body 1113. When the light is emitted from the light emitting device 1120 to the lower surface of the light emitting device 1120, the first adhesive 1130 may improve the light extraction efficiency of the light emitting device package 1100 by providing the light diffusion function. In addition, the first adhesive 1130 may reflect the light emitted from the light emitting device 1120. When the first adhesive 1130 comprises the reflection function, the first adhesive 1130 may be formed of a material comprising $TiO_2$, Silicone, and the like.

Meanwhile, the light emitting device package 1300 according to the embodiment may comprise a second adhesive 1133, as shown in FIG. 25.

The second adhesive 1133 may be disposed between the first frame 1111 and the light emitting device 1120. In addition, the second adhesive 1133 may be disposed between the second frame 1112 and the light emitting device 1120.

The second adhesive 1133 may be disposed between an upper surface of the package body 1110 and a lower surface of the light emitting device 1120. The second adhesive 1133 may be disposed to be in direct contact with the upper surface of the package body 1110. The second adhesive 1133 may be disposed to be in direct contact with the lower surface of the light emitting device 1120.

The second adhesive 1133 may be disposed to be in direct contact with the lower surface of the first bonding part 1121. Further, the second adhesive 1133 may be disposed to be in direct contact with the lower surface of second the bonding part 1122.

The second adhesive 1133 may be provided as a conductive adhesive, as an example. The first frame 1111 and the first bonding part 1121 may be electrically connected by the second adhesive 1133. The second frame 1112 and the second bonding part 1122 may be electrically connected by the second adhesive 1133.

As an example, the second conductor 1222 may comprise at least one material selected from the group consisting of Ag, Au, Pt, etc. or an alloy thereof. However, the present invention is not limited thereto, and a material capable of securing a conductive function may be used for second conductor 1222.

As an example, the second adhesive 1133 may be formed by using a conductive paste. The conductive paste may be selected from the group consisting of solder paste, silver paste and the like.

According to the embodiment, the first adhesive 1130 and the second adhesive 1133 may comprise different materials. As an example, the first adhesive 1130 may be provided as an insulating adhesive, and the second adhesive 1133 may be provided as a conductive adhesive.

In addition, the light emitting device package 1300 according to the embodiment may comprise a first upper recess R10 and a second upper recess R20, as shown in FIG. 25.

The first upper recess R10 may be provided at an upper surface of the first frame 1111. The first upper recess R10 may be provided to concave in the lower surface direction from the upper surface of the first frame 1111. The first upper recess R10 may be disposed to be spaced apart from the recess R.

The first upper recess R10 may be overlapped with the first bonding part 1121 in a first direction based on a direction from the lower surface of the first frame 1111 toward the upper surface thereof. The first upper recess R10 may be overlapped with the light emitting structure 1123 based on the first direction.

As described with reference to FIG. 18, when viewed from the upper direction of the light emitting device 1120, the first upper recess R10 may be provided to extend inward from three sides of the first bonding part 1121. For example, the first upper recess R10 may be provided in the periphery of the first bonding part 1121 in a "[" shape.

As described with reference to FIG. 18, when viewed from the upper direction of the light emitting device 1120, the first upper recess R10 may be provided adjacent to three sides of the second adhesive 1133. For example, the first upper recess R10 may be provided in the periphery of the second adhesive 1133 in a "[" shape.

The first frame 1111 may comprise a first region extending in a direction in which the first upper recess R10 is provided. As an example, the second adhesive 1133 may be disposed in the first region of the first frame 1111. The second adhesive 1133 may be disposed to be overlapped with the first bonding part 1121 based on the first direction.

In the light emitting device package according to the embodiment, as described above referring to FIG. 18, when viewed from the upper direction of the light emitting device 1120, a partial region of the first upper recess R10 may be overlapped with the light emitting structure 1123 in a vertical direction. As an example, a side surface region of the first upper recess R10 adjacent to the first bonding part 1121 may be provided to be extended under the light emitting structure 1123. The first upper recess R10 may be disposed to be overlapped with the first bonding part 1121 in the vertical direction.

According to the embodiment, the second upper recess R20 may be provided on an upper surface of the second frame 1112. The second upper recess R20 may be provided to concave in the lower surface direction from the upper surface of the second frame 1112. The second upper recess R20 may be disposed to be spaced apart from the recess R. The second upper recess R20 may be disposed to be spaced apart from the first upper recess R10.

The second upper recess R20 may be overlapped with the second bonding part 1122 in a first direction based on a direction from the lower surface of the first frame 1112 toward the upper surface thereof. The second upper recess R20 may be overlapped with the light emitting structure 1123 based on the first direction.

As described with reference to FIG. 18, when viewed from the upper direction of the light emitting device 1120, the second upper recess R20 may be provided to extend inward from three sides of the first bonding part 1121. For example, the second upper recess R20 may be provided in the periphery of the second bonding part 1122 in a "]" shape.

In addition, as described with reference to FIG. 18, when viewed from the upper direction of the light emitting device 1120, the second upper recess R20 may be provided adjacent to three sides of the second adhesive 1133. For example, the second upper recess R20 may be provided in the periphery of the second adhesive 1133 in a "]" shape.

The second frame 1112 may comprise a first region extending in a direction in which the second upper recess R20 is provided. As an example, the second adhesive 1133 may be disposed in the first region of the second frame 1112. The second adhesive 1133 may be disposed to be overlapped with the second bonding part 1122 based on the first direction.

In addition, in the light emitting device package according to the embodiment, as described above referring to FIG. 18, when viewed from the upper direction of the light emitting device 1120, a partial region of the second upper recess R20 may be overlapped with the light emitting structure 1123 in a vertical direction. As an example, a side surface region of the second upper recess R20 adjacent to the second bonding part 1122 may be provided to be extended under the light emitting structure 1123. The second upper recess R20 may be disposed to be overlapped with the second bonding part 1122 in the vertical direction.

For example, the first upper recess R10 and the second upper recess R20 may be provided with a width of several tens of micrometers to several hundreds of micrometers.

According to the light emitting device package according to the embodiment, as shown in FIG. 25, the second adhesive 1133 may be disposed at the first frame 1111 and the second frame 1112.

The second adhesive 1133 may be provided on the first frame 1111 and disposed under the first bonding part 1121. The second adhesive 1133 may be disposed to be in direct contact with the lower surface of the first bonding part 1121.

The second adhesive 1133 may be provided on the second frame 1112 and disposed under the second bonding part 1122. The second adhesive 1133 may be disposed to be in direct contact with the lower surface of the second bonding part 1122.

According to the embodiment, the second adhesive 1133 may be provided at the first frame 1111, and the first bonding part 1121 of the light emitting device 1120 may be mounted on the second adhesive 1133.

At this point, in the process of mounting the first bonding part 1121 of the light emitting device 1120 on the second adhesive 1133, a part of the second adhesive 1133 may be diffused into the region of the first upper recess R10, and diffused to the side of the first bonding part 1121.

However, according to the embodiment, as described above with reference to FIGS. 17 to 19, when viewed from the upper direction of the light emitting device 1120, a second distance D2 from the side surface of the light emitting device 1120 to the side surface of the first bonding part 1121 may be provided to be smaller than a first distance D1 from the side surface of the light emitting device 1120 to the side surface of the first upper recess R10 disposed under the lower surface of the light emitting device 1120.

As an example, the second distance D2 from the side surface of the light emitting device 1120 to the side surface of the first bonding part 1121 may be provided at several tens of micrometers. The second distance D2 from the side surface of the light emitting device 1120 to the side surface of the first bonding part 1121 may be provided at 40 to 50 micrometers.

In addition, the first distance D1 from the side surface of the light emitting device 1120 to the side surface of the first upper recess R10 under the lower surface of the light emitting device 1120 and overlapped with the light emitting device 1120 in the vertical direction may be provided to be several micrometers or several tens of micrometers larger than the second distance D2.

A partial region of the first upper recess R10 may be disposed to be overlapped with the lower surface of the first bonding part 1121 in the vertical direction. Accordingly, even when the second adhesive 1133 is excessively provided and diffused to the periphery, the second adhesive 1133 may be diffused into the region of the first upper recess R10 rather than being moved in the upward direction along the side surface of the first bonding part 1121.

According to the present embodiment, since the second adhesive 1133 may be prevented from being diffused in the direction of the light emitting structure 1123 along the side surface of the first bonding part 1121, it is possible to prevent the light emitting device 1120 from being electrically short-circuited by the diffusion of the second adhesive 1133 which is a conductive material.

In addition, similar to that described above, the second adhesive 1133 may be provided at the first frame 1112, the first bonding part 1122 of the light emitting device 1120 may be mounted on the second adhesive 1133.

At this point, in the process of mounting the second bonding part 1122 of the light emitting device 1120 on the second adhesive 1133, a part of the second adhesive 1133 may be diffused into the region of the second upper recess R20, and may be diffused along the side surface of the second bonding part 1122.

According to the embodiment, as described above with reference to FIGS. 17 to 19, when viewed from the direction of an upper portion of the light emitting device 1120, the distance from the side surface of the light emitting device 1120 to the side surface of the second bonding part 1122 may be provided to be smaller than the distance from the side surface of the light emitting device 1120 to the side surface of the second upper recess R20 disposed under the lower surface of the light emitting device 1120.

A partial region of the second upper recess R20 may be disposed to be overlapped with the lower surface of the second bonding part 1122 in the vertical direction. Accordingly, even when the second adhesive 1133 is excessively provided and diffused to the periphery, the second adhesive 1133 may be diffused into the region of the second upper recess R20 rather than being moved in the upward direction along the side surface of the second bonding part 1122.

According to the embodiment, since the second adhesive 1133 may be prevented from being diffused in the direction of the light emitting structure 1123 along the side surface of the first bonding part 1122, it is possible to prevent the light emitting device 1120 from being electrically short-circuited by the diffusion of the second adhesive 1133 which is a conductive material.

As described above, since the second adhesive 1133 may be prevented from rising along the side surface of the light emitting device 1120, the first conductivity type semiconductor layer and the second conductivity type semiconductor layer constituting the light emitting device 1120 may be prevented from being electrically short-circuited. In addition, since the second adhesive 1133 may be prevented from being disposed on the side surface of the active layer constituting the light emitting device 1120, it is possible to improve light extraction efficiency of the light emitting device 1120.

In addition, the light emitting device package 1300 according to the embodiment may comprise a first resin portion 1135, as shown in FIG. 25.

The first resin portion 1135 may be disposed between the first frame 1111 and the light emitting device 1120. The first resin portion 1135 may be disposed between the second frame 1112 and the light emitting device 1120.

The first resin portion 1135 may be disposed on a side surface of the first bonding part 1121. The first resin portion 1135 may be disposed on a side surface of the second bonding part 1122. The first resin portion 1135 may be disposed under the light emitting structure 1123. The first resin portion 1135 may be disposed on a side surface of the second adhesive 1133.

In addition, the first resin portion 1135 may be in direct contact with the lower surface of the light emitting device 1120. The first resin portion 1135 may be disposed to be in direct contact with a side surface of the second adhesive 1133. The first resin portion 1135 may be disposed at the first upper recess R10. The first resin portion 1135 may be disposed at the second upper recess R20.

In addition, according to the embodiment, the second adhesive 1133 may overflow to the first upper recess R10. Accordingly, the first resin portion 1135 may be disposed on the second adhesive 1133 in the first upper recess R10.

According to the embodiment, even when the second adhesive 1133 is diffused into the region of the first upper recess R10 or diffused to the side surface of the first bonding part 1121 by the first resin portion 1135, the second adhesive 1133 may be prevented from moving in the side surface direction of the light emitting structure 1123.

The first resin portion 1135 may be disposed in the first upper recess R10 and in contact with the second adhesive 1133. The first resin portion 1135 may be disposed in the first upper recess R10 and provided at the periphery of the second adhesive 1133. The first resin portion 1135 may be disposed in the first upper recess R10 and provided at the periphery of the first bonding part 1121.

In addition, according to the embodiment, the second adhesive 1133 may overflow to the second upper recess R20. Accordingly, the first resin portion 1135 may be disposed on the second adhesive 1133 in the second upper recess R20.

According to the embodiment, even when the second adhesive 1133 is diffused into the region of the second upper recess R20 or diffused to the side surface of the second bonding part 1122 by the first resin portion 1135, the second adhesive 1133 may be prevented from moving in the direction of side surface of the light emitting structure 1123.

The first resin portion 1135 may be disposed in the second upper recess R20 and in contact with the second adhesive 1133. The first resin portion 1135 may be disposed in the second upper recess R20 and provided at the periphery of the second adhesive 1133. The first resin portion 1135 may be disposed in the second upper recess R20 and provided at the periphery of the second bonding part 1122.

Accordingly, the first resin portion 1135 filled at the first upper recess R10 and the second upper recess R20 may effectively seal a periphery of the first bonding part 1121 and the second bonding part 1122.

As an example, the first resin portion 1135 may comprise at least one of an epoxy-based material, a silicone-based material, and a hybrid material comprising an epoxy-based material and a silicone-based material. In addition, the first resin portion 1135 may be a reflective part that reflects light emitted from the light emitting device 1120, as an example, a resin containing a reflective material such as $TiO_2$, or may comprise a white silicone.

The first resin portion 1135 may be disposed under the light emitting device 1120 to perform a sealing function. Further, the first resin portion 1135 may improve adhesion force between the light emitting device 1120 and the first frame 1111. The first resin portion 1135 may improve adhesion force between the light emitting device 1120 and the second frame 1112.

The first resin portion 1135 may seal around the first bonding part 1121 and the second bonding part 1122. The first resin portion 1135 may prevent the second adhesive 1133 from diffusing and moving in the direction of side surface of the light emitting device 1120.

When the second adhesive 1133 diffuses and moves in the direction of the side surface of the light emitting device 1120, the second adhesive 1133 may be in contact with the active layer of the light emitting device 1120, thereby causing a failure due to a short-circuit. Therefore, when the first resin portion 1135 is disposed, it is possible to prevent a short-circuit due to the second adhesive 1133 and the active layer, thereby improving reliability of the light emitting device package according to the embodiment.

In addition, when the first resin portion 1135 comprises a material having a reflective characteristic such as white silicone, the first resin portion 1135 may reflect light emitted from the light emitting device 1120 toward an upper direction of the package body 1110, thereby improving the light extraction efficiency of the light emitting device package.

In addition, the light emitting device package 1300 according to the embodiment may comprise a second resin portion 1140, as shown in FIG. 25.

The second resin portion 1140 may be provided on the light emitting device 1120. The second resin portion 1140 may be disposed on the first frame 1111 and the second frame 1112. The second resin portion 1140 may be disposed on the cavity C provided by the package body 1110. The second resin portion 1140 may be disposed on the first resin portion 1135.

The second resin portion 1140 may comprise an insulating material. In addition, the second resin portion 1140 may comprise a wavelength converting part configured to be incident light emitted from the light emitting device 1120 and providing wavelength converted light. As an example, the second resin portion 1140 may comprise at least one selected from the group consisting of a phosphor, a quantum dot, and the like.

According to the embodiment, the first pad 1311 of the circuit board 1310 may be electrically connected to the first frame 1111. In addition, the second pad 1312 of the circuit board 1310 may be electrically connected to the second frame 112.

The first pad 1311 and the second pad 1312 may be referred to as a third adhesive. As an example, the first pad 1311 and the second pad 1312 may be formed a conductive adhesive.

According to an embodiment, the first adhesive 1130 may be provided as an insulating adhesive, and the second adhesive 1133 and the third adhesive may be provided as a conductive adhesive. In addition, the second adhesive 1133 and the third adhesive may comprise different materials.

As an example, the melting point of the second adhesive 1133 may be selected to be higher than that of the third adhesive. Accordingly, it is possible to prevent the re-melting phenomenon of the second adhesive 1133 from occurring in the process of mounting the package body 1110 on the circuit board 1310 by the third adhesive.

Therefore, since a re-melting phenomenon does not occur even when the light emitting device package 1300 according to the embodiment is bonded to the main substrate by a reflow process, the electrical connection and the physical bonding force may not be deteriorated.

Meanwhile, according to the embodiment, a separate bonding layer may be additionally provided between the first pad 1311 and the first frame 1111. In addition, a separate bonding layer may be additionally provided between the second pad 1312 and the second frame 1112.

As describe above, according to the light emitting device package and the method of fabricating the light emitting device package according to the embodiment, the first bonding part 1121 and the second bonding part 1122 of the light emitting device 1120 according to the embodiment may receive driving power by the second adhesive 1133. In addition, the melting point of the second adhesive 1133 may be selected to have a higher value than that of the common bonding material.

Therefore, since the light emitting device package according to the embodiment does not cause a re-melting phenomenon even when the light emitting device package 1100 is bonded to the main substrate by a reflow process, the electrical connection and the physical bonding force may not be deteriorated.

In addition, according to the light emitting device package 1100 and the method of fabricating the light emitting device package according to the embodiment, since the light emitting device 1120 is mounted on the package body 1110 by using a conductive paste, the package body 1110 does not need to be exposed to a high temperature in the manufacturing process of the light emitting device package. Therefore, according to an embodiment, it is possible to prevent the package body 1110 from being damaged or discolored due to exposure to high temperature.

Accordingly, a selection range for the material forming the body 1113 may be widened. According to the embodiment, the body 1113 may be provided by using not only expensive materials such as ceramics but also relatively inexpensive resin materials.

For example, the body 1113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Meanwhile, according to the light emitting device package according to the embodiment described above, the package body 1110 comprises only the support member in which an upper surface is flat, and may not be provided with a reflective part disposed to be inclined.

As another representation, according to the light emitting device package according to the embodiment, the package body 1110 may be provided with a structure in which the cavity C is provided. Further, the package body 1110 may be provided with a structure in which an upper surface is flat without providing the cavity C.

Meanwhile, a flip chip light emitting device may be provided in the light emitting device package described above, as an example.

As an example, the flip chip light emitting device may be provided as a transmissive type flip chip light emitting device that emits light in six surface directions, or may be provided as a reflective type flip chip light emitting device that emits light in five surface directions.

The reflective type flip chip light emitting device in which light is emitted in the five surface directions may have a structure in which a reflective layer is disposed in a direction close to the package body. For example, the reflective type flip chip light emitting device may comprise an insulating reflective layer (for example, a distributed bragg reflector, an omni directional reflector, etc.) and/or a conductive type reflective layer (for example, Ag, Al, Ni, Au, etc.) between first and second bonding parts and the light emitting structure.

In addition, the flip chip light emitting device may comprise a first bonding part electrically connected to a first conductive type semiconductor layer, and a second bonding part electrically connected to a second conductive type semiconductor layer, and may be provided as a general horizontal light emitting device in which light is emitted between the first bonding part and the second bonding part.

Further, the flip chip light emitting device in which light is emitted in the six surface directions may be provided as a transmissive type flip chip light emitting device comprising a reflective region in which a reflective layer is disposed between the first and second bonding parts and a transmissive region in which light is emitted.

Here, the transmissive type flip chip light emitting device means a device that emits light to six surfaces of an upper surface, four side surfaces, and a lower surface. In addition, the reflective type flip chip light emitting device means a device that emits light to the upper surface and the four side surfaces.

Meanwhile, the light emitting device package according to the embodiment described above is described based on a case in which the first and second bonding parts 1121 and 1122 are in direct contact with the second adhesive 1133.

However, according to still another example of the light emitting device package according to the embodiment, another conductive component may be further disposed between the first and second bonding parts 1121 and 1122 and the second adhesive 1133.

Next, another example of the light emitting device package according to the embodiment will be described with reference to FIG. 26.

In describing the light emitting device package according to the embodiment of with reference to FIG. 26, the description of the contents overlapping with the contents described with reference to FIGS. 1 to 25 may be omitted.

The light emitting device package according to the embodiment may comprise a package body 1110, a light emitting device 1120, a first conductor 1221, and a second conductor 1222, as shown in FIG. 12.

The package body 1110 may comprise a first frame 1111 and a second frame 1112. The first frame 1111 and the second frame 1112 may be disposed to be spaced apart from each other.

The package body 1110 may comprise a body 1113. The body 1113 may be disposed between the first frame 1111 and the second frame 1112. The body 1113 may perform a function as a kind of electrode separation line.

The first frame 1111 and the second frame 1112 may be provided as a conductive frame. The first frame 1111 and the second frame 1112 may stably provide a structural strength of the package body 1110 and may be electrically connected to the light emitting device 1120.

According to the embodiment, the light emitting device 1120 may comprise a first bonding part 1121, a second bonding part 1122, a light emitting structure 1123, and a substrate 1124.

The light emitting device 1120 may be disposed on the package body 1110. The light emitting device 1120 may be disposed on the first frame 1111 and the second frame 1112. The light emitting device 1120 may be disposed in the cavity C provided by the package body 1110. The light emitting device 120 may be disposed on the body 1113.

The first bonding part 1121 may be disposed on a lower surface of the light emitting device 1120. The second bonding part 1122 may be disposed on the lower surface of the light emitting device 1120. The first bonding part 1121 and the second bonding part 1122 may be disposed to be spaced apart from each other on the lower surface of the light emitting device 1120.

According to the embodiment, the first conductor 1221 may be disposed under the first bonding part 1121. The first conductor 1221 may be electrically connected to the first bonding part 1121. The first conductor 1221 may be disposed to be overlapped with the first bonding part 1121 in the first direction.

In addition, the second conductor 1222 may be disposed under the second bonding part 1122. The second conductor 1222 may be electrically connected to the second bonding part 1122. The second conductor 1222 may be disposed to be overlapped with the second bonding part 1122 in the first direction.

Figure 26:
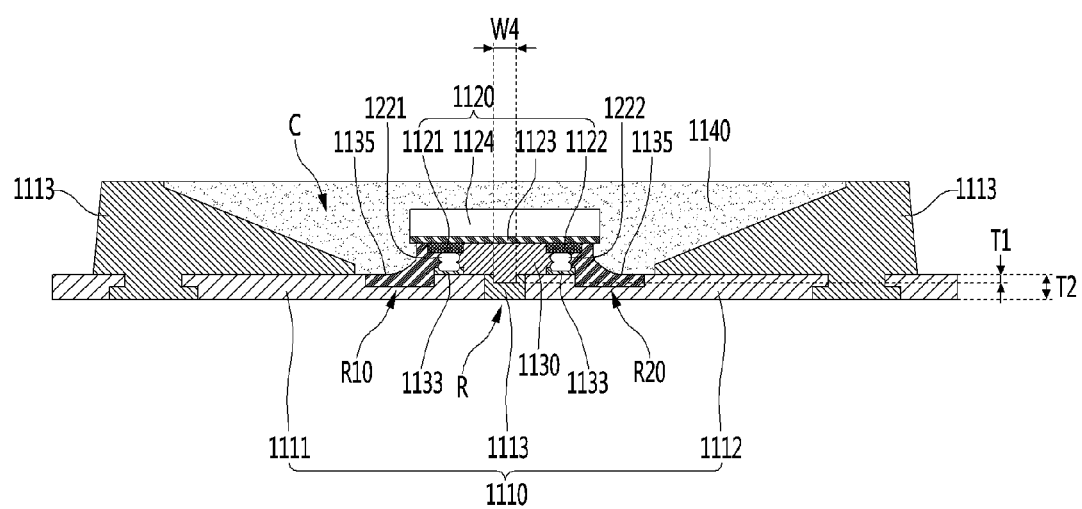
FIG. 26 is a view illustrating another example of a light emitting device package according to an embodiment of the present invention.

The light emitting device package according to the embodiment may comprise a first adhesive 1130, as shown in FIG. 26.

The first adhesive 1130 may be disposed between the package body 1110 and the light emitting device 1120. The first adhesive 1130 may be disposed between an upper surface of the package body 1110 and the lower surface of the light emitting device 1120.

The first adhesive 1130 may be disposed to be overlapped with the light emitting device 1120 in the first direction. The first adhesive 1130 may be disposed to be overlapped with the light emitting device 1120 based on a direction from the lower surface of the body 1113 toward the upper surface thereof.

In addition, the light emitting device package according to the embodiment may comprise a recess R, as shown in FIG. 26.

The recess R may be provided at the body 1113. The recess R may be provided to concave in a first direction from the upper surface of the body 1113 toward the lower surface thereof. The recess R may be disposed under the light emitting device 1120. The recess R may be provided to be overlapped with the light emitting device 1120 in the first direction.

The recess R may be disposed between the first bonding part 1121 and the second bonding part 1122. The recess R may be provided not to be overlapped with the first bonding part 1121 in the first direction. The recess R may be provided not to be overlapped with the second bonding part 1122 in the first direction.

As an example, the first adhesive 1130 may be disposed at the recess R. The first adhesive 1130 may be disposed between the light emitting device 1120 and the body 1113. The first adhesive 1130 may be disposed between the first bonding part 1121 and the second bonding part 1122. As an example, the first adhesive 1130 may be disposed to be in contact with a side surface of the first bonding part 1121 and a side surface of the second pad electrode 1122.

The first adhesive 1130 may provide a stable fixing force between the light emitting device 1120 and the package body 1110. The first adhesive 1130 may provide a stable fixing force between the light emitting device 1120 and the body 1113. The first adhesive 1130 may be disposed to be in direct contact with the upper surface of the body 1113, as an example. In addition, the first adhesive 1130 may be disposed in direct contact with the lower surface of the light emitting device 1120.

The first adhesive 1130 may be provided as an insulating adhesive. As an example, the first adhesive 1130 may comprise at least one of an epoxy-based material, a silicone-based material, and a hybrid material comprising an epoxy-based material and a silicone-based material. Further, as an example, when the first adhesive 1130 comprises a reflective function, the adhesive 130 may comprise a white silicone.

The first adhesive 1130 may provide a stable fixing force between the body 1113 and the light emitting device 1120, when light is emitted to the lower surface of the light emitting device 1120, and may provide a light diffusion function between the light emitting device 1120 and the body 1113. When the light is emitted from the light emitting device 1120 to the lower surface of the light emitting device 1120, the first adhesive 1130 may improve the light extraction efficiency of the light emitting device package 1100 by providing the light diffusion function. In addition, the first adhesive 1130 may reflect the light emitted from the light emitting device 1120. When the first adhesive 1130 comprises the reflection function, the first adhesive 1130 may be formed of a material comprising $TiO_2$, Silicone, and the like.

Meanwhile, the light emitting device package according to the embodiment may comprise a second adhesive 1133, as shown in FIG. 26.

The second adhesive 1133 may be disposed between the first frame 1111 and the light emitting device 1120. In addition, the second adhesive 1133 may be disposed between the second frame 1112 and the light emitting device 1120.

According to the embodiment, the first conductor 1221 may be electrically connected to the first bonding part 1121. The second conductor 1222 may be electrically connected to the second bonding part 1220. The first and second conductors 221 and 222 may be disposed between the first and second bonding parts 1121 and 1122 and the second adhesive 1133, respectively.

According to the embodiment, the second adhesive 1133 may be disposed on a lower surface and a side surface of the first conductor 1221, the second adhesive 1133 may be disposed in direct contact with a lower surface and a side surface of the first conductor 1221.

As described above, according to the light emitting device package according to the embodiment, an electrical connection between the second adhesive 1133 and the bonding part 1121 may be more stably provided by the first conductor 1221.

In addition, according to the embodiment, the second adhesive 1133 may be disposed on a lower surface and a side surface of the second conductor 1222, the second adhesive 1133 may be disposed in direct contact with a lower surface and a side surface of the second conductor 1222.

As described above, according to the light emitting device package according to the embodiment, an electrical connection between the second adhesive 1133 and the second bonding part 1122 may be more stably provided by the second conductor 1222.

For example, the first and second conductors 1221 and 1222 may be stably bonded to the first and second bonding parts 1121 and 1122 via separate bonding materials, respectively. In addition, side surfaces and lower surfaces of the first and second conductors 1221 and 1222 may be in contact with the second adhesive 1133, respectively.

Therefore, an area where the second adhesive 1133 is respectively in contact with the first and second conductors 1221 and 1222 may be further increased as compared with a case where the second adhesive 1133 is directly contacted to the lower surface of the first and second conductors 1221 and 1222, respectively. Accordingly, a power may be stably provided from the second adhesive 1133 to the first and second bonding parts 1121 and 1122 via the first and second conductors 1221 and 1222.

The second adhesive 1133 may be provided, for example, as a conductive adhesive. As an example, the second conductor 1222 may comprise at least one material selected from the group consisting of Ag, Au, Pt, etc. or an alloy thereof. However, the present invention is not limited thereto, and a material capable of securing a conductive function may be used for second conductor 1222.

As an example, the second adhesive 1133 may be formed by using a conductive paste. The conductive paste may be selected from the group consisting of solder paste, silver paste and the like.

According to the embodiment, the first adhesive 1130 and the second adhesive 1133 may comprise different materials. As an example, the first adhesive 1130 may be provided as an insulating adhesive, and the second adhesive 1133 may be provided as a conductive adhesive.

In addition, the first and second conductors 1221 and 1222 may comprise at least one material selected from the group consisting of Ag, Au, Pt, Sn, Al, etc. or an alloy thereof. However, the present invention is not limited thereto, and a material capable of securing a conductive function may be used for the first and second conductors 1221 and 1222.

In addition, the light emitting device package according to the embodiment may comprise a first upper recess R3 and a second upper recess R4, as shown in FIG. 26.

The first upper recess R3 may be provided on an upper surface of the first frame 1111. The first upper recess R3 may be provided to concave in the lower surface direction from the upper surface of the first frame 1111. The first upper recess R3 may be disposed to be spaced apart from the recess R.

The first upper recess R10 may be overlapped with the first bonding part 1121 in a first direction based on a direction from the lower surface of the first frame 1111 toward the upper surface thereof. The first upper recess R10 may be overlapped with the light emitting structure 1123 based on the first direction.

As described with reference to FIG. 18, when viewed from the upper direction of the light emitting device 1120, the first upper recess R10 may be provided to extend inward from three sides of the first bonding part 1121. For example, the first upper recess R10 may be provided in the periphery of the first bonding part 1121 in a "[" shape.

As described with reference to FIG. 18, when viewed from the upper direction of the light emitting device 1120, the first upper recess R10 may be provided adjacent to three sides of the second adhesive 1133. For example, the first upper recess R10 may be provided in the periphery of the second adhesive 1133 in a "[" shape.

The first frame 1111 may comprise a first region extending in a direction in which the first upper recess R10 is provided. As an example, the second adhesive 1133 may be disposed in the first region of the first frame 1111. The second adhesive 1133 may be disposed to be overlapped with the first bonding part 1121 based on the first direction.

In the light emitting device package according to the embodiment, as described above referring to FIG. 18, when viewed from the upper direction of the light emitting device 1120, a partial region of the first upper recess R10 may be overlapped with the light emitting structure 1123 in a vertical direction. As an example, a side surface region of the first upper recess R10 adjacent to the first bonding part 1121 may be provided to be extended under the light emitting structure 1123. The first upper recess R10 may be disposed to be overlapped with the first bonding part 1121 in the vertical direction.

According to the embodiment, the second upper recess R20 may be provided on an upper surface of the second frame 1112. The second upper recess R20 may be provided to concave in the lower surface direction from the upper surface of the second frame 1112. The second upper recess R20 may be disposed to be spaced apart from the recess R. The second upper recess R20 may be disposed to be spaced apart from the first upper recess R10.

The second upper recess R20 may be overlapped with the second bonding part 1122 in a first direction based on a direction from the lower surface of the first frame 1112 toward the upper surface thereof. The second upper recess R20 may be overlapped with the light emitting structure 1123 based on the first direction.

As described with reference to FIG. 18, when viewed from the upper direction of the light emitting device 1120, the second upper recess R20 may be provided to extend inward from three sides of the first bonding part 1121. For example, the second upper recess R20 may be provided in the periphery of the second bonding part 1122 in a "]" shape.

In addition, as described with reference to FIG. 18, when viewed from the upper direction of the light emitting device 1120, the second upper recess R20 may be provided adjacent to three sides of the second adhesive 1133. For example, the second upper recess R20 may be provided in the periphery of the second adhesive 1133 in a "]" shape.

The second frame 1112 may comprise a first region extending in a direction in which the second upper recess R20 is provided. As an example, the second adhesive 1133 may be disposed in the first region of the second frame 1112. The second adhesive 1133 may be disposed to be overlapped with the second bonding part 1122 based on the first direction.

In addition, in the light emitting device package according to the embodiment, as described above referring to FIG. 18, when viewed from the upper direction of the light emitting device 1120, a partial region of the second upper recess R20 may be overlapped with the light emitting structure 1123 in a vertical direction. As an example, a side surface region of the second upper recess R20 adjacent to the second bonding part 1122 may be provided to be extended under the light emitting structure 1123. The second upper recess R20 may be disposed to be overlapped with the second bonding part 1122 in the vertical direction.

For example, the first upper recess R10 and the second upper recess R20 may be provided with a width of several tens of micrometers to several hundreds of micrometers.

According to the light emitting device package according to the embodiment, as shown in FIG. 26, the second adhesive 1133 may be disposed at the first frame 1111 and the second frame 1112.

The second adhesive 1133 may be provided on the first frame 1111 and disposed under the first bonding part 1121. The second adhesive 1133 may be disposed to be in direct contact with the lower surface of the first conductor 1221.

The second adhesive 1133 may be provided on the second frame 1112 and disposed under the second bonding part 1122. The second adhesive 1133 may be disposed to be in direct contact with the lower surface of the second conductor 1222.

According to the embodiment, the second adhesive 1133 may be provided at the first frame 1111, and the first bonding part 1121 of the light emitting device 1120 and the first conductor 1221 may be mounted on the second adhesive 1133.

At this point, in the process of mounting the first bonding part 1121 of the light emitting device 1120 and the first conductor 1221 on the second adhesive 1133, a part of the second adhesive 1133 may be diffused into the region of the first upper recess R10, and diffused to the side of the first conductor 1221.

However, according to the embodiment, as described above with reference to FIGS. 17 to 19, when viewed from the upper direction of the light emitting device 1120, a second distance D2 from the side surface of the light emitting device 1120 to the side surface of the first bonding part 1121 may be provided to be smaller than a first distance D1 from the side surface of the light emitting device 1120 to the side surface of the first upper recess R10 disposed under the lower surface of the light emitting device 1120.

As an example, the second distance D2 from the side surface of the light emitting device 1120 to the side surface of the first bonding part 1121 may be provided at several tens of micrometers. The second distance D2 from the side surface of the light emitting device 1120 to the side surface of the first bonding part 1121 may be provided at 40 to 50 micrometers.

In addition, the first distance D1 from the side surface of the light emitting device 1120 to the side surface of the first upper recess R10 under the lower surface of the light emitting device 1120 and overlapped with the light emitting device 1120 in the vertical direction may be provided to be several micrometers or several tens of micrometers larger than the second distance D2.

A partial region of the first upper recess R10 may be disposed to be overlapped with the lower surface of the first bonding part 1121 in the vertical direction. Accordingly, even when the second adhesive 1133 is excessively provided and diffused to the periphery, the second adhesive 1133 may be diffused into the region of the first upper recess R10 rather than being moved in the upward direction along the side surface of the first conductor 1221.

In addition, according to the embodiment, as the first conductor 1221 is provided between the first bonding part 1121 and the second adhesive 1133, it is possible to prevent the second adhesive 1133 from being moved in the upper direction along the side surface of the first bonding part 1121.

According to the embodiment, since the second adhesive 1133 may be prevented from being diffused in the direction of the light emitting structure 1123 along the side surface of the first bonding part 1121, it is possible to prevent the light emitting device 1120 from being electrically short-circuited by diffusion of the second adhesive 1133, which is a conductive material.

In addition, as described above, the second adhesive 1133 is provided at the second frame 1112, and the second bonding part 1122 of the light emitting device 1120 may be mounted on the second adhesive 1133.

At this point, in a process in which the second bonding part 1122 and the second conductor 1222 of the light emitting device 1120 are mounted on the second adhesive 1133, a part of the second adhesive 1133 may be diffused to the second upper recess R20, and may be diffused along the side surface of the second conductor 1222.

However, according to the embodiment, as shown in FIGS. 17 to 19, when viewed from the upper direction of the light emitting device 1120, a second distance D2 from the side surface of the light emitting device 1120 to the side surface of the second bonding part 1122 may be provided smaller than a first distance D1 from the side surface of the light emitting device 1120 to the side surface of the second upper recess R20 disposed under a lower surface of the light emitting device 1120.

A partial region of the second upper recess R20 may be disposed to be overlapped with the lower surface of the second bonding part 1122 in a vertical direction. Accordingly, even when the second adhesive 1133 is excessively provided and diffused to the periphery, the second adhesive 1133 may be diffused into the second upper recess R20 region rather than being moved in the upper direction along the side surface of the second bonding part 1122.

In addition, according to an embodiment, as the second conductor 1222 is provided between the second bonding part 1122 and the second adhesive 1133, it is possible to prevent the second adhesive 1133 from being moved in the upper direction along the side surface of the second bonding part 1122.

According to the present embodiment, since the second adhesive 1133 may be prevented from being diffused in the direction of the light emitting structure 1123 along the side surface of the first bonding part 1121, it is possible to prevent the light emitting device 1120 from being electrically short-circuited by the diffusion of the second adhesive 1133 which is a conductive material.

As described above, since the second adhesive 1133 may be prevented from rising along the side surface of the light emitting device 1120, the first conductivity type semiconductor layer and the second conductivity type semiconductor layer constituting the light emitting device 1120 may be prevented from being electrically short-circuited. In addition, since the second adhesive 1133 may be prevented from being disposed on the side surface of the active layer constituting the light emitting device 1120, it is possible to improve light extraction efficiency of the light emitting device 1120.

In addition, the light emitting device package according to the embodiment may comprise a first resin portion 1135, as shown in FIG. 26.

The first resin portion 1135 may be disposed between the first frame 1111 and the light emitting device 1120. The first resin portion 1135 may be disposed between the second frame 1112 and the light emitting device 1120.

The first resin portion 1135 may be disposed on a side surface of the first bonding part 1121. The first resin portion 1135 may be disposed on a side surface of the second bonding part 1122. The first resin portion 1135 may be disposed under the light emitting structure 1123. The first resin portion 1135 may be disposed on a side surface of the second adhesive 1133.

The resin portion 1135 may be disposed on a side surface of the first conductor 1221. The resin portion 1135 may be disposed on a side surface of the second conductor 1222.

In addition, the first resin portion 1135 may be in direct contact with the lower surface of the light emitting device 1120. The first resin portion 1135 may be disposed to be in direct contact with a side surface of the second adhesive 1133. The first resin portion 1135 may be disposed at the first upper recess R10. The first resin portion 1135 may be disposed at the second upper recess R20.

In addition, according to the embodiment, the second adhesive 1133 may overflow to the first upper recess R10. Accordingly, the first resin portion 1135 may be disposed on the second adhesive 1133 in the first upper recess R10.

According to the embodiment, even when the second adhesive 1133 is diffused into the region of the first upper recess R10 or diffused to the side surface of the first bonding part 1121 by the first resin portion 1135, the second adhesive 1133 may be prevented from moving in the side surface direction of the light emitting structure 1123.

The first resin portion 1135 may be disposed in the first upper recess R10 and in contact with the second adhesive 1133. The first resin portion 1135 may be disposed in the first upper recess R10 and provided at the periphery of the second adhesive 1133. The first resin portion 1135 may be disposed in the first upper recess R10 and provided at the periphery of the first bonding part 1121. The first resin portion 1135 may be disposed in the first upper recess R10 and provided at the periphery of the first conductor 1221.

In addition, according to the embodiment, the second adhesive 1133 may overflow to the second upper recess R20. Accordingly, the first resin portion 1135 may be disposed on the second adhesive 1133 in the second upper recess R20.

According to the embodiment, even when the second adhesive 1133 is diffused into the region of the second upper recess R20 or diffused to the side surface of the second bonding part 1122 by the first resin portion 1135, the second adhesive 1133 may be prevented from moving in the direction of side surface of the light emitting structure 1123.

The first resin portion 1135 may be disposed in the second upper recess R20 and in contact with the second adhesive 1133. The first resin portion 1135 may be disposed in the second upper recess R20 and provided at the periphery of the second adhesive 1133. The first resin portion 1135 may be disposed in the second upper recess R20 and provided at the periphery of the second bonding part 1122. The first resin portion 1135 may be disposed in the second upper recess R20 and provided at the periphery of the second conductor 1222.

Accordingly, the first resin portion 1135 filled at the first upper recess R10 and the second upper recess R20 may effectively seal a periphery of the first bonding part 1121 and the second bonding part 1122.

As an example, the first resin portion 1135 may comprise at least one of an epoxy-based material, a silicone-based material, and a hybrid material comprising an epoxy-based material and a silicone-based material. In addition, the first resin portion 1135 may be a reflective part that reflects light emitted from the light emitting device 1120, as an example, a resin containing a reflective material such as $TiO_2$, or may comprise a white silicone.

The first resin portion 1135 may be disposed under the light emitting device 1120 to perform a sealing function. Further, the first resin portion 1135 may improve adhesion force between the light emitting device 1120 and the first frame 1111. The first resin portion 1135 may improve adhesion force between the light emitting device 1120 and the second frame 1112.

The first resin portion 1135 may seal around the first bonding part 1121 and the second bonding part 1122. The first resin portion 1135 may prevent the second adhesive 1133 from diffusing and moving in the direction of side surface of the light emitting device 1120.

When the second adhesive 1133 diffuses and moves in the direction of the side surface of the light emitting device 1120, the second adhesive 1133 may be in contact with the active layer of the light emitting device 1120, thereby causing a failure due to a short-circuit. Therefore, when the first resin portion 1135 is disposed, it is possible to prevent a short-circuit due to the second adhesive 1133 and the active layer, thereby improving reliability of the light emitting device package according to the embodiment.

In addition, when the first resin portion 1135 comprises a material having a reflective characteristic such as white silicone, the first resin portion 1135 may reflect light emitted from the light emitting device 1120 toward an upper direction of the package body 1110, thereby improving the light extraction efficiency of the light emitting device package.

In addition, the light emitting device package according to the embodiment may comprise a second resin portion 1140, as shown in FIG. 26.

The second resin portion 1140 may be provided on the light emitting device 1120. The second resin portion 1140 may be disposed on the first frame 1111 and the second frame 1112. The second resin portion 1140 may be disposed on the cavity C provided by the package body 1110. The second resin portion 1140 may be disposed on the first resin portion 1135.

The second resin portion 1140 may comprise an insulating material. In addition, the second resin portion 1140 may comprise a wavelength converting part configured to be incident light emitted from the light emitting device 1120 and providing wavelength converted light. As an example, the second resin portion 1140 may comprise at least one selected from the group consisting of a phosphor, a quantum dot, and the like.

In the light emitting device package according to the embodiment, power may be connected to the first bonding part 1121 through the second adhesive 1133 provided on the first frame 1111, and power may be connected to the second bonding part 1122 through the second adhesive 1133 provided on the second frame 1112.

Accordingly, the light emitting device 1120 may be driven by the driving power supplied through the first bonding part 1121 and the second bonding part 1122. In addition, the light emitted from the light emitting device 1120 may be provided in the upper direction of the package body 1110.

Meanwhile, the light emitting device package according to the embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided at the light emitting device package, so that stability of electrical connection and physical coupling may be weakened.

However, according to the light emitting device package and a method of fabricating the light emitting device package according to the embodiment, the first bonding part 1121 and the second bonding part 1122 of the light emitting device 1120 according to the embodiment may receive driving power by the second adhesive 1133. In addition, the melting point of the second adhesive 1133 may be selected to have a higher value than that of the common bonding material.

Therefore, since the light emitting device package 1100 according to the embodiment does not cause a re-melting phenomenon even when the light emitting device package 1100 is bonded to the main substrate by a reflow process, the electrical connection and the physical bonding force may not be deteriorated.

In addition, according to the light emitting device package 1100 and the method of fabricating the light emitting device package according to the embodiment, since the light emitting device 1120 is mounted on the package body 1110 by using a conductive paste, the package body 1110 does not need to be exposed to a high temperature in the manufacturing process of the light emitting device package. Therefore, according to an embodiment, it is possible to prevent the package body 1110 from being damaged or discolored due to exposure to high temperature.

Accordingly, a selection range for the material forming the body 1113 may be widened. According to the embodiment, the body 1113 may be provided by using not only expensive materials such as ceramics but also relatively inexpensive resin materials.

For example, the body 1113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Meanwhile, according to the light emitting device package according to the embodiment described above, the package body 1110 comprises only the support member in which an upper surface is flat, and may not be provided with a reflective part disposed to be inclined.

As another representation, according to the light emitting device package according to the embodiment, the package body 1110 may be provided with a structure in which the cavity C is provided. Further, the package body 1110 may be provided with a structure in which an upper surface is flat without providing the cavity C.

Meanwhile, the light emitting device package according to the embodiment, as described above with reference to FIGS. 1 to 26 may be applied to the light source apparatus.

Further, the light source apparatus may include a display apparatus, a lighting apparatus, a head lamp, and the like based on the industrial field.

As an example of the light source apparatus, the display apparatus includes a bottom cover, a reflective plate disposed on the bottom cover, a light emitting module emitting light and including a light emitting device, a light guide plate disposed on a front of the reflective plate and guiding light emitted from the light emitting module, an optical sheet including prism sheets disposed in front of the light guide plate, a display panel disposed in front of the optical sheet, an image signal output circuit connected to the display panel and supplying an image signal to the display panel, and a color filter disposed in front of the display panel. Herein, the bottom cover, the reflective plate, the light emitting module, the light guide plate, and the optical sheet may form a backlight unit. In addition, the display apparatus may have a structure in which light emitting devices each emitting red, green, and blue light are disposed without including the color filter.

As another example of the light source apparatus, the head lamp may include a light emitting module including a light emitting device package disposed on a substrate, a reflector for reflecting light emitted from the light emitting module in a predetermined direction, for example, in a forward direction, a lens for forwardly refracting the light, and a shade for blocking or reflecting a portion of the light reflected by the reflector and directed to the lens to form a light distribution pattern desired by a designer.

The lighting apparatus as another light source apparatus may include a cover, a light source module, a heat sink, a power supply, an inner case, and a socket. In addition, the light source apparatus according to an embodiment may further include at least one of a member and a holder. The light source module may include a light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

What is claimed is:

1. A light emitting device package comprising:
a first frame and a second frame disposed to be spaced apart from each other;
a body disposed between the first and second frames and comprising a recess;
a first adhesive on the recess;
a light emitting device on the first adhesive;
a second adhesive disposed between the first and second frames and the light emitting device; and
a resin portion disposed to surround the second adhesive and a partial region of the light emitting device.

2. The light emitting device package of claim 1, wherein the light emitting device comprises a light emitting structure comprising a first conductive type semiconductor layer, a second conductive type semiconductor layer, and an active layer disposed between the first conductive type semiconductor layer and the second conductive type semiconductor layer; a first bonding part on the light emitting structure and electrically connected to the first conductive type semiconductor layer; and a second bonding part disposed to be spaced apart from the first bonding part on the light emitting structure and electrically connected to the second conductive type semiconductor layer,
wherein the first frame comprises a first region in which the second adhesive and the first bonding part are disposed, and a first upper recess disposed to surround a part of the first region, and
wherein the second frame comprises a second region in which the second adhesive and the second bonding part are disposed, and a second upper recess disposed to surround a part of the second region.

3. The light emitting device package of claim 2, wherein the resin portion is disposed on the first and second upper recesses.

4. The light emitting device package of claim 2, wherein the first upper recess comprises a first inner side surface overlapping with the light emitting structure in a first direction perpendicular to a lower surface of the light emitting structure and parallel to a side surface of the light emitting structure,
wherein, when a first distance in a second direction between the side surface of the light emitting structure and a side surface of the first bonding part is equal to or greater than 40 micrometers, a distance between the side surface of the light emitting structure and the first inner side surface in the second direction is smaller than the first distance,
wherein, when the first distance in the second direction between the side surface of the light emitting structure and the side surface of the first bonding part is smaller than 40 micrometers, the distance between the side surface of the light emitting structure and the first inner side surface in the second direction is greater than the first distance, and
wherein the second direction is provided perpendicular to the first direction.

5. The light emitting device package of claim 4, wherein a partial region of the first upper recess is disposed to be overlapped with a lower surface of the first bonding part in the first direction.

6. The light emitting device package of claim 1, wherein the first adhesive is an insulating adhesive, and the second adhesive is provided as a conductive adhesive.

7. The light emitting device package of claim 2, wherein the first adhesive is in direct contact with an upper surface of the body and in direct contact with a lower surface of the light emitting device, and
wherein the second adhesive is in direct contact with an upper surface of the first frame and in direct contact with a lower surface of the first bonding part.

8. The light emitting device package of claim 2, wherein the resin portion is disposed in the first and second upper recesses, and contacted with the second adhesive.

9. The light emitting device package of claim 1, wherein the resin portion is in direct contact with a lower surface of the light emitting device and in direct contact with a side surface of the second adhesive.

10. The light emitting device package of claim 4, wherein the first adhesive is disposed to be overlapped with the light emitting device based on the first direction, and
wherein the second adhesive is disposed to be overlapped with the first bonding part based on the first direction.

11. The light emitting device package of claim 2, wherein the first adhesive is disposed between the first bonding part and the second bonding part.

12. The light emitting device package of claim 1, wherein the first adhesive comprises at least one of an epoxy-based material, a silicone-based material, and a hybrid material comprising an epoxy-based material and a silicone-based material.

13. The light emitting device package of claim 1, wherein the second adhesive comprises at least one of a solder paste or silver paste.

14. The light emitting device package of claim 2, wherein the first upper recess is provided on an upper surface of the first frame, and
wherein the first upper recess is disposed to be spaced apart from the recess.

15. A light emitting device package comprising:
a first frame and a second frame;
a body having a recess and disposed between the first frame and the second frame;
a light emitting device disposed on the body, and the first and second frames;
a first adhesive on the recess and provided between the body and the light emitting device;
a second adhesive provided between the first and second frames and the light emitting device; and
a resin portion disposed to surround the second adhesive and a partial region of the light emitting device,
wherein the light emitting device comprises a light emitting structure, a first bonding part on the light emitting structure, and a second bonding part disposed to be spaced apart from the first bonding part on the light emitting structure,
wherein the first frame comprises a first region in which the second adhesive and the first bonding part are disposed, and a first upper recess disposed to surround a part of the first region, and
wherein the second frame comprises a second region in which the second adhesive and the second bonding part are disposed, and a second upper recess disposed to surround a part of the second region.

16. The light emitting device package of claim 15, wherein the first upper recess comprises a first inner side surface overlapping with the light emitting structure in a first direction perpendicular to a lower surface of the light emitting structure and parallel to a side surface of the light emitting structure, wherein, when a first distance in a second direction between the side surface of the light emitting structure and a side surface of the first bonding part is equal to or greater than 40 micrometers, a distance between the side surface of the light emitting structure and the first inner side surface in the second direction is smaller than the first distance, wherein, when the first distance in the second direction between the side surface of the light emitting structure and the side surface of the first bonding part is smaller than 40 micrometers, the distance between the side surface of the light emitting structure and the first inner side surface in the second direction is greater than the first distance.

17. The light emitting device package of claim 16, wherein a partial region of the first upper recess is disposed to be overlapped with a lower surface of the first bonding part in the first direction.

18. The light emitting device package of claim 15, wherein the first adhesive is an insulating adhesive, and the second adhesive is provided as a conductive adhesive.

19. The light emitting device package of claim 15, wherein the first adhesive is in direct contact with an upper surface of the body and in direct contact with a lower surface of the light emitting device, and wherein the second adhesive is in direct contact with an upper surface of the first frame and in direct contact with a lower surface of the first bonding part.

20. The light emitting device package of claim 15, wherein the resin portion is disposed in the first and second upper recesses, and contacted with the second adhesive.

* * * * *